(12) United States Patent
Kim et al.

(10) Patent No.: US 10,431,583 B2
(45) Date of Patent: Oct. 1, 2019

(54) SEMICONDUCTOR DEVICE INCLUDING TRANSISTORS WITH ADJUSTED THRESHOLD VOLTAGES

(71) Applicant: SAMSUNG ELECTRONICS CO., LTD., Suwon-si, Gyeonggi-do (KR)

(72) Inventors: Ju Youn Kim, Suwon-si (KR); Gi Gwan Park, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 70 days.

(21) Appl. No.: 15/430,265

(22) Filed: Feb. 10, 2017

(65) Prior Publication Data

US 2017/0236821 A1 Aug. 17, 2017

(30) Foreign Application Priority Data

Feb. 11, 2016 (KR) .................. 10-2016-0015813
Mar. 11, 2016 (KR) .................. 10-2016-0029549
Mar. 11, 2016 (KR) .................. 10-2016-0029637
Apr. 5, 2016 (KR) .................. 10-2016-0041536

(51) Int. Cl.
*H01L 29/423* (2006.01)
*H01L 27/088* (2006.01)
*H01L 29/49* (2006.01)
*H01L 21/8234* (2006.01)
*H01L 29/78* (2006.01)
(Continued)

(52) U.S. Cl.
CPC .... *H01L 27/0886* (2013.01); *H01L 21/82345* (2013.01); *H01L 27/088* (2013.01); *H01L 29/0847* (2013.01); *H01L 29/4966* (2013.01); *H01L 29/66545* (2013.01); *H01L 29/66795* (2013.01); *H01L 29/7851* (2013.01); *H01L 29/7854* (2013.01); *H01L 29/7856* (2013.01); *H01L 21/823456* (2013.01); *H01L 2029/7858* (2013.01)

(58) Field of Classification Search
None
See application file for complete search history.

(56) References Cited

U.S. PATENT DOCUMENTS 7,358,122 B2  4/2008 Chu
7,858,471 B2  12/2010 Haller et al.
(Continued)

FOREIGN PATENT DOCUMENTS

CN   1105845677   8/2016
CN   106257688    12/2016

*Primary Examiner* — Joseph C. Nicely
*Assistant Examiner* — Lamont B Koo
(74) *Attorney, Agent, or Firm* — F. Chau & Associates, LLC

(57) ABSTRACT

A semiconductor device is provided. The semiconductor device includes a substrate including a first region and a second region. First and second dielectric films are positioned above the substrate in the first region and the second region, respectively. First and second gate stacks are disposed on the first and second dielectric films, respectively. The first gate stack includes a first TiAlC film in direct contact with the first dielectric film, and a first barrier film and a first metal film sequentially stacked on the first TiAlC film. The second gate stack includes a first LaO film in direct contact with the second dielectric film. A second TiAlC film, a second barrier film, and a second metal film are sequentially stacked on the first LaO film.

15 Claims, 79 Drawing Sheets

(51) Int. Cl.
*H01L 29/66* (2006.01)
*H01L 29/08* (2006.01)

(56) References Cited

U.S. PATENT DOCUMENTS

| | | |
|---|---|---|
| 7,998,813 B2 | 8/2011 | Haller et al. |
| 8,021,938 B2 | 9/2011 | Ogawa |
| 8,084,831 B2 | 12/2011 | Goto et al. |
| 8,138,543 B2 | 3/2012 | Cheng et al. |
| 8,586,436 B2 | 11/2013 | Ng et al. |
| 8,624,327 B2 | 1/2014 | Hung et al. |
| 8,637,359 B2 | 1/2014 | Chang et al. |
| 8,669,167 B1 | 3/2014 | Chang et al. |
| 8,669,615 B1 | 3/2014 | Chang et al. |
| 8,698,249 B2 | 4/2014 | Mise et al. |
| 8,753,968 B2 | 6/2014 | Huang et al. |
| 8,835,233 B2 | 9/2014 | Wei et al. |
| 8,896,030 B2 | 11/2014 | Mukherjee et al. |
| 8,941,183 B2 | 1/2015 | Yu et al. |
| 8,969,965 B2 | 3/2015 | Chang et al. |
| 8,975,141 B2 | 3/2015 | Wei et al. |
| 8,987,126 B2 | 3/2015 | Choi et al. |
| 9,006,860 B2 | 4/2015 | Chuang et al. |
| 9,012,319 B1 | 4/2015 | Choi et al. |
| 9,024,392 B2 | 5/2015 | Liaw |
| 9,034,747 B2 | 5/2015 | Ji et al. |
| 9,064,732 B2 | 6/2015 | Yu et al. |
| 9,093,550 B1 | 7/2015 | Zhao et al. |
| 9,093,559 B2 | 7/2015 | Ng et al. |
| 9,099,393 B2 | 8/2015 | Ando et al. |
| 9,105,662 B1 | 8/2015 | Basker et al. |
| 9,202,698 B2 | 12/2015 | Jagannathan et al. |
| 9,209,089 B2 | 12/2015 | Chung et al. |
| 9,209,186 B1 | 12/2015 | Togo et al. |
| 9,209,273 B1 | 12/2015 | Lin et al. |
| 9,219,078 B2 | 12/2015 | Cheng et al. |
| 2007/0052037 A1 | 3/2007 | Luan |
| 2012/0080757 A1 | 4/2012 | Kato et al. |
| 2014/0061811 A1 | 3/2014 | Chien et al. |
| 2014/0070325 A1 | 3/2014 | Kim et al. |
| 2015/0004779 A1 | 1/2015 | Zhu et al. |
| 2015/0187763 A1 | 7/2015 | Kim et al. |
| 2015/0214115 A1 | 7/2015 | Wu et al. |
| 2015/0228646 A1 | 8/2015 | Ho et al. |
| 2015/0243563 A1 | 8/2015 | Lee et al. |
| 2015/0262825 A1 | 9/2015 | Chen et al. |
| 2015/0263004 A1 | 9/2015 | Cheon et al. |
| 2015/0287645 A1 | 10/2015 | Zhao et al. |
| 2015/0294914 A1 | 10/2015 | Hong et al. |
| 2015/0333142 A1 | 11/2015 | Tsao et al. |
| 2015/0349075 A1 | 12/2015 | Fan et al. |
| 2015/0357426 A1 | 12/2015 | Kim et al. |
| 2015/0380409 A1 | 12/2015 | Togo et al. |
| 2016/0225867 A1 | 8/2016 | Kim |
| 2016/0268259 A1* | 9/2016 | Chang ................ H01L 27/0922 |
| 2016/0334362 A1* | 11/2016 | Liu .................... G01N 27/4145 |
| 2016/0372472 A1 | 12/2016 | Kim |

* cited by examiner

SEMICONDUCTOR DEVICE INCLUDING TRANSISTORS WITH ADJUSTED THRESHOLD VOLTAGES

CROSS-REFERENCE TO RELATED APPLICATIONS

This application claims priority under 35 USC § 119 to Korean Patent Application No. 10-2016-0015813 filed on Feb. 11, 2016, No. 10-2016-0029549 filed on Mar. 11, 2016, No. 10-2016-0029637 filed on Mar. 11, 2016 and No. 10-2016-0041536 filed on Apr. 5, 2016 in the Korean Intellectual Property Office, the disclosures of which are incorporated by reference herein in their entireties.

TECHNICAL FIELD

Exemplary embodiments of the present inventive concept relate to a semiconductor device, and more particularly to a semiconductor device including transistors with adjusted threshold voltages.

DISCUSSION OF RELATED ART

A semiconductor device may include transistors having different threshold voltages from each other. An example of such transistors with different threshold voltages may include a combination of logic transistor and static random access memory (SRAM) or dynamic random access memory transistor.

SUMMARY

An exemplary embodiment of the present inventive concept provides a semiconductor device having a plurality of transistors with adjusted threshold voltages.

According to an exemplary embodiment of the present inventive concept, there is provided a semiconductor device, including a substrate including a first region and a second region. First and second dielectric films are positioned above the substrate in the first region and the second region, respectively. First and second gate stacks are disposed on the first and second dielectric films, respectively. The first gate stack includes a first TiAlC film in direct contact with the first dielectric film, and a first barrier film and a first metal film sequentially stacked on the first TiAlC film. The second gate stack includes a first LaO film in direct contact with the second dielectric film. A second TiAlC film, a second barrier film, and a second metal film are sequentially stacked on the first LaO film.

According to an exemplary embodiment of the present inventive concept, there is provided a semiconductor device, including a substrate including first to fourth regions. First to fourth dielectric films are positioned above the substrate in the first to fourth regions, respectively. First to fourth gate stacks are disposed on the first to fourth dielectric films, respectively. The first gate stack includes a first TiAlC film, a first barrier film, and a first metal layer sequentially stacked on the first dielectric film. The second gate stack includes a first LaO film, a second TiAlC film, a second barrier film, and a second metal layer sequentially stacked on the second dielectric film. The third gate stack includes a first TiN film, a third TiAlC film, a third barrier film, and a third metal layer sequentially stacked on the third dielectric film. The fourth gate stack includes a second LaO film, a second TiN film, a fourth TiAlC film, a fourth barrier film, and a fourth metal layer sequentially stacked on the fourth dielectric film. The second TiAlC film is in direct contact with the first LaO film.

According to an exemplary embodiment of the present inventive concept, there is provided a semiconductor device, including a substrate including first and second regions and first and second transistors formed in the first region and the second region, respectively. The first transistor includes a first trench, a first gate insulating film in the first trench, a first lower TiN film in direct contact with the first gate insulating film on the first gate insulating film. A first insertion film is on the first lower TiN film. A first filling film is on the first insertion film. A first capping film is formed on the first filling film. The second transistor includes a second trench, a second gate insulating film in the second trench, a second lower TiN film in direct contact with the second gate insulating film on the second gate insulating film. A second insertion film is on the second lower TiN film. A second filling film is on the second insertion film. A second capping film is formed on the second filling film. The widths of the first trench and the second trench are different from each other. A thickness of the first capping film and a thickness of the second capping film are different from each other.

BRIEF DESCRIPTION OF THE DRAWINGS

The above and other features of the present inventive concept will become more apparent by describing in detail exemplary embodiments thereof with reference to the attached drawings, in which.

DETAILED DESCRIPTION

Figure 1:
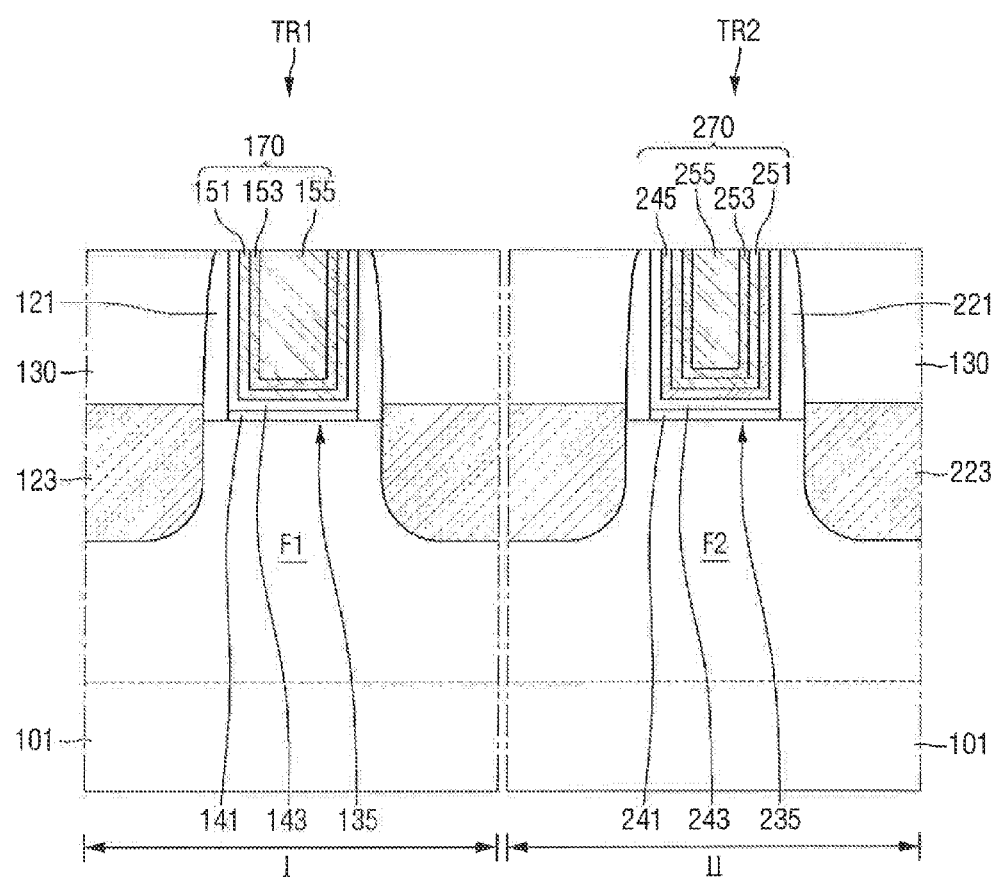
FIG. 1 is a cross-sectional view illustrating a semiconductor device according to an exemplary embodiment of the present inventive concept.

Although drawings for a semiconductor device according to some exemplary embodiments exemplify a fin-type transistor (FinFET) including a channel region in a fin-type pattern shape, exemplary embodiments of the present inventive concept are not limited thereto. As an example, the semiconductor device according to some exemplary embodiments of the present inventive concept may include a tunneling transistor (tunneling FET), a transistor including nanowire, a transistor including nano-sheet, or a three-dimensional 3D transistor. The semiconductor device according to some exemplary embodiments of the present inventive concept may include a bipolar junction transistor, or a laterally diffused metal oxide semiconductor LDMOS transistor.

Like reference numerals may refer to like elements throughout the specification and drawings.

A semiconductor device according to some exemplary embodiments of the present inventive concept will be described below in more detail with reference to FIG. 1.

FIG. 1 is a cross-sectional view illustrating a semiconductor device according to an exemplary embodiment of the present inventive concept.

Referring to FIG. 1, in a semiconductor device according to an exemplary embodiment of the present inventive concept, a substrate 101 may include first and second regions I and II. The first region I and the second region II may be connected to each other, or separated from each other.

A first fin F1, a first dielectric film 143, and a first gate stack 170 may be formed in the first region I, and a second fin F2, a second dielectric film 243, and a second gate stack 270 may be formed in the second region II.

As an example, the substrate 101 may be a bulk silicon or a silicon-on-insulator (SOI). Alternatively, the substrate 101 may be a silicon substrate, or may include one or more other material such as silicon germanium, indium antimonide, lead telluride compound, indium arsenide, indium phosphide, gallium arsenide, or gallium antimonide.

As an example, the substrate 101 may be a base substrate having an epitaxial layer formed thereon. When an active fin is formed using an epitaxial layer formed on a base substrate, the epitaxial layer may include silicon or germanium, which is an element semiconductor material. Further, the epitaxial layer may include a compound semiconductor, such as, for example, Group IV-IV compound semiconductor or Group III-V compound semiconductor. For example, for the Group IV-IV compound semiconductor for instance, the epitaxial layer may be a binary compound or a ternary compound including at least two or more of carbon (C), silicon (Si), germanium (Ge), or tin (Sn), or such binary or ternary compound doped with a Group IV element. As an example, for a Group III-V compound semiconductor for instance, the epitaxial layer may be one of a binary compound, ternary compound, or quaternary compound which includes a combination of at least one of aluminum (Al), gallium (Ga), or indium (In) as a III group element, with one of phosphorus (P), arsenic (As) or antimony (Sb) as a Group V element.

In an exemplary embodiment of the present inventive concept, the first and second transistors TR1 and TR2 may be formed in the first and second regions I and II of the substrate 101, respectively. The first and second transistors TR1 and TR2 may be separated from each other by a device isolation film formed in the substrate 101. Such a device isolation film may be, for example, shallow trench isolation (STI) or deep trench isolation (DTI).

The first and second transistors TR1 and TR2 may each include first and second source/drain regions 123 and 223, first and second spacers 121 and 221, first and second interface films 141 and 241, first and second dielectric films 143 and 243, and first and second gate stacks 170 and 270.

As an example, the first transistor TR1 formed in the first region I of the substrate 101 may include a first source/drain region 123, a first spacer 121, a first interface film 141, a first dielectric film 143, and a first gate stack 170. The first gate stack 170 may include a first TiAlC film 151, a first barrier film 153 and a first metal film 155.

The second transistor TR2 formed in the second region II of the substrate 101 may include a second source/drain region 223, a second spacer 221, a second interface film 241, a second dielectric film 243, and a second gate stack 270. The second gate stack 270 herein may include a second TiAlC film 251, a second barrier film 253, and a second metal film 255.

The first and second source/drain regions 123 and 223 may be formed by implanting a predetermined impurity into the substrate 101. When the first and second transistors TR1 and TR2 according to an exemplary embodiment of the present inventive concept are NMOS transistors, n-type impurities may be implanted into the first and second source/drain regions 123 and 223.

The first and second source/drain regions 123 and 223 may be positioned in an upper region of the substrate. The first and second source/drain regions 123 and 223 in a form of an epitaxial layer may be formed in the trench formed in the substrate 101. However, the shape of each of the first and second source/drain regions 123 and 223 is not limited to illustrated particular shape.

The interlayer insulating film 130 may include a first trench 135 and a second trench 235 formed on the first and second regions I and II of the substrate 101, respectively. The first and second spacers 121 and 221 may be disposed on either side of the first trench 135 and the second trench 235, respectively.

For example, each of the first and second spacers 121 and 221 may include at least one of silicon nitride (SiN), silicon oxynitride (SiON), silicon oxide ($SiO_2$), silicon oxycarbidenitride (SiOCN), or a combination thereof.

While the first and second spacers 121 and 221 may each be a single film, exemplary embodiments of the present inventive concept are not limited thereto. When the first and/or second spacers 121 and 221 include a plurality of films, at least one film among the films included in each of the first and second spacers 121 and 221 may include a low-k dielectric material such as silicon oxycarbonitride (SiOCN).

When at least one of the first and second spacers 121 and 221 include a plurality of films, at least one film among the films included in each of the first and second spacers 121 and 221 may have an L-shape.

In some cases, the first and second spacers 121 and 221 may serve as a guide for forming a self-aligned contact. Thus, the first and second spacers 121 and 221 may include a material having an etch selectivity with respect to the interlayer insulating film 130.

As an example, first and second interface films 141 and 241, first and second dielectric films 143 and 243, and first and second gate stacks 170 and 270 may be sequentially formed in the first and second trenches 135 and 235 formed in the first and second regions I and II of the substrate 101.

The first and second interface films 141 and 241 may increase a connection strength between the substrate 101 and the first and second dielectric films 143 and 243. The first and second interface films 141 and 241 may include a low-k dielectric material layer having a dielectric constant (k) of about 9 or lower, such as a silicon oxide film (e.g., in which k is about 4) or a silicon oxynitride film (e.g., in which k is from about 4 to about 8 depending on content of oxygen atoms and nitrogen atoms). Alternatively, the first and second interface films 141 and 241 may each include a silicate, or a combination of the films described above.

The first and second dielectric films 143 and 243 may each include a material having a relatively high dielectric constant. In an exemplary embodiment of the present inventive concept, the first and second dielectric films 143 and 243 may include a material such as, for example, $HfO_2$, $Al_2O_3$, $ZrO_2$, or $TaO_2$; however, exemplary embodiments of the present inventive concept are not limited thereto.

Referring again to FIG. 1, each of the first and second dielectric films 143 and 243 may have a shape extended in a first direction (for example, a vertical direction in FIG. 1) along the sidewalls of the first and second spacers 121 and 221. In an exemplary embodiment of the present inventive concept, the first and second dielectric films 143 and 243 having this shape may be formed as a result of the first and second dielectric films 143 and 243 being formed by replacement process or gate last process.

However, exemplary embodiments of the present inventive concept are not limited thereto, and the shapes of the first and second dielectric films 143 and 243 may be modified to other forms as desired. As an example, in an exemplary embodiment of the present inventive concept, the first and second dielectric films 143 and 243 may be formed by using gate first process, and thus the first and second spacers may have such a shape that they do not extend upwardly along the sidewalls of the first and second spacers 121 and 221.

Referring again to FIG. 1, first and second gate stacks 170 and 270 may be formed on first and second dielectric films 143 and 243 in first and second regions I and II of the substrate 101, respectively.

As an example, the first gate stack 170 may include a first TiAlC film 151, a first barrier film 153, and a first metal film 155, which are sequentially formed on the first dielectric film 143, and the second gate stack 270 may include a second lanthanum oxide film 245, a second TiAlC film 251, a second barrier film 253, and a second metal film 255, which are sequentially formed on the second dielectric film 243.

The first and second TiAlC films 151 and 251 may include TiAlC. The first and second barrier films 153 and 253 may include TiN, for example and may prevent the materials included in the first and second metal films 155 and 255 from diffusing into the first and second TiAlC films 151 and 251. The first and second metal films 155 and 255 may include Al, or W and may fill the remaining portions of the first and second trenches 135 and 235 in the first and second regions I and II.

The second region II may include a second lanthanum oxide film 245. The second lanthanum oxide film 245 may include LaO, for example. Thus, the first transistor TR1 formed in the first region I and the second transistor TR2 formed in the second region II may have different threshold voltages. As an example, the threshold voltage Vt2 of the second transistor TR2 including the second lanthanum oxide film 245 may be smaller than the threshold voltage Vt1 of the first transistor TR1. However, exemplary embodiments of the present inventive concept are not limited thereto.

The first and second gate stacks 170 and 270 according to an exemplary embodiment of the present inventive concept may each include no tantalum nitride (TaN) as a work function adjusting material. Thus, the threshold voltages Vt1 and Vt2 of the first and second transistors TR1 and TR2 may each be controlled through the presence or absence of the second lanthanum oxide film 245.

A semiconductor device according to some exemplary embodiments of the present inventive concept will be described in more detail below with reference to FIG. 2.

Figure 2:
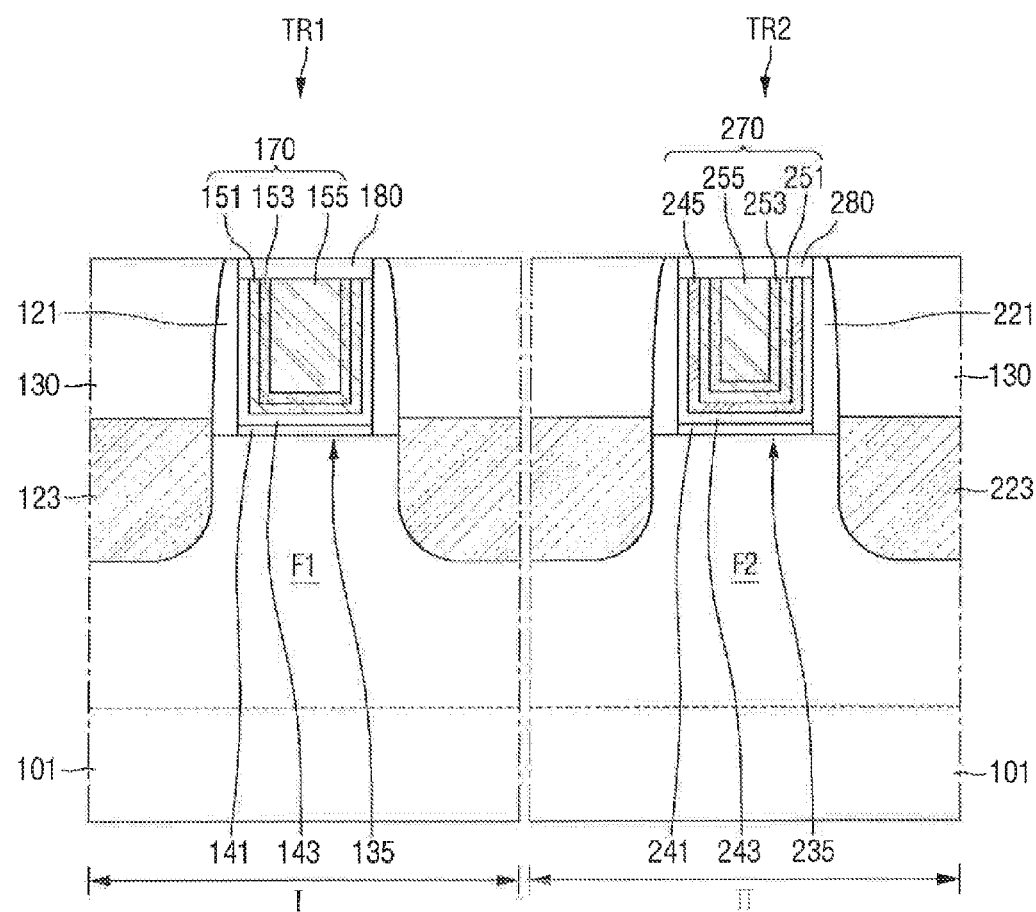
FIG. 2 is a cross-sectional view illustrating a semiconductor device an exemplary embodiment of the present inventive concept.

FIG. 2 is a cross-sectional view illustrating a semiconductor device an exemplary embodiment of the present inventive concept.

The semiconductor device according an exemplary embodiment of the present inventive concept described below with reference to FIG. 2 is substantially the same as the semiconductor device described above with reference to FIG. 1, except that it includes a capping film on the gate stack. Thus, duplicative descriptions may be omitted.

Referring to FIG. 2, a semiconductor device according to an exemplary embodiment of the present inventive concept may include first and second regions I and II. The first and second transistors TR1 and TR2 may be formed in the first and second regions I and II of the substrate 101, respectively.

The first and second transistors TR1 and TR2 may each include first and second source/drain regions 123 and 223, first and second spacers 121 and 221, first and second interface films 141 and 241, first and second dielectric films 143 and 243, and first and second gate stacks 170 and 270.

First and second capping films 180 and 280 may be disposed on the first and second gate stacks 170 and 270, respectively. As an example, the first and second capping films 180 and 280 may be formed on the first and second gate stacks 170 and 270, respectively, and may substantially cover the first and second trenches 135 and 235. The first and second capping films 180 and 280 may include a nitride (for example, at least one of SiN, SiON, or SiCON) or an oxide. The first and second capping films 180 and 280 may block the first and second gate stacks 170 and 270 from the outside to prevent a change in performance of the first and second gate stacks 170 and 270. For example, oxygen atoms may penetrate into the first and second gate stacks 170 and 270, where the threshold voltages of the first and second gate stacks 170 and 270 may be changed. Thus, the first and second capping films 180 and 280 may keep the threshold voltages of the first and second gate stacks 170 and 270 substantially constant.

A method for manufacturing a semiconductor device according to some exemplary embodiments of the present inventive concept will be described below in more detail with reference to FIGS. 3 to 20.

FIGS. 3 to 20 are perspective views and cross-sectional views illustrating method of manufacturing a semiconductor device according to some exemplary embodiments of the present inventive concept. FIGS. 3 to 6 and 18 are perspective views, and FIGS. 7 to 17, 19 and 20 are cross-sectional views.

Figure 3:
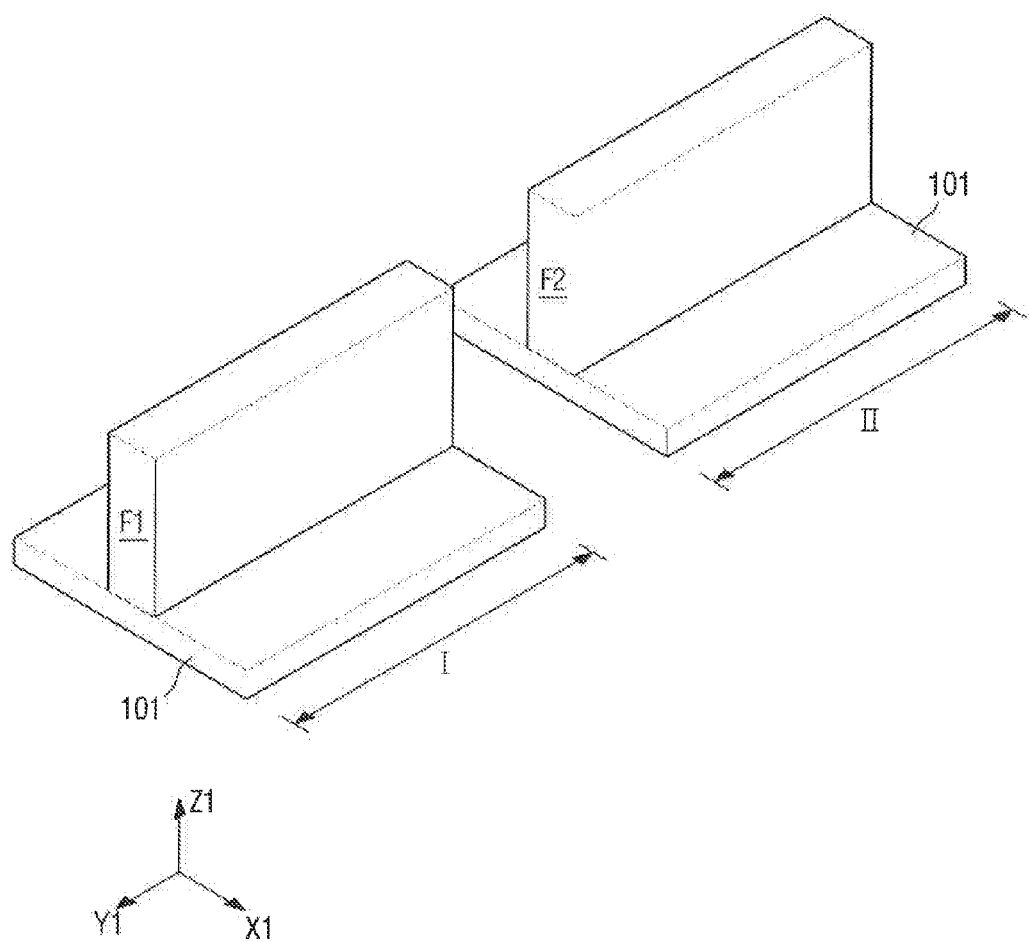
FIGS. 3 to 20 are perspective views and cross-sectional views illustrating method of manufacturing a semiconductor device according to some exemplary embodiments of the present inventive concept.

Referring to FIG. 3, the first fin F1 and second fin F2 may be formed on the substrate 101, respectively. The first region I and the second region II may be defined in the substrate 101. The first region 1 and the second region II may be adjoined with each other or may be separated from each other.

The first fin F1 may be formed in the first region I, and the second fin F2 may be formed in the second region II. The first and second fins F1 and F2 may protrude in the third direction Z1. The first and second fins F1 and F2 may elongate along the second direction Y1 which is a length direction, and may have a long side in the second direction Y1 and a short side in the first direction X1. However, exemplary embodiments of the present inventive concept are not limited thereto. For example, the long side direction may be the first direction X1 and the short side direction may be the second direction Y1.

The first and second fins F1 and F2 may be a portion of the substrate 101, and may include an epitaxial layer grown from the substrate 101. For example, Si, or SiGe may be included in the substrate 101.

Figure 4:
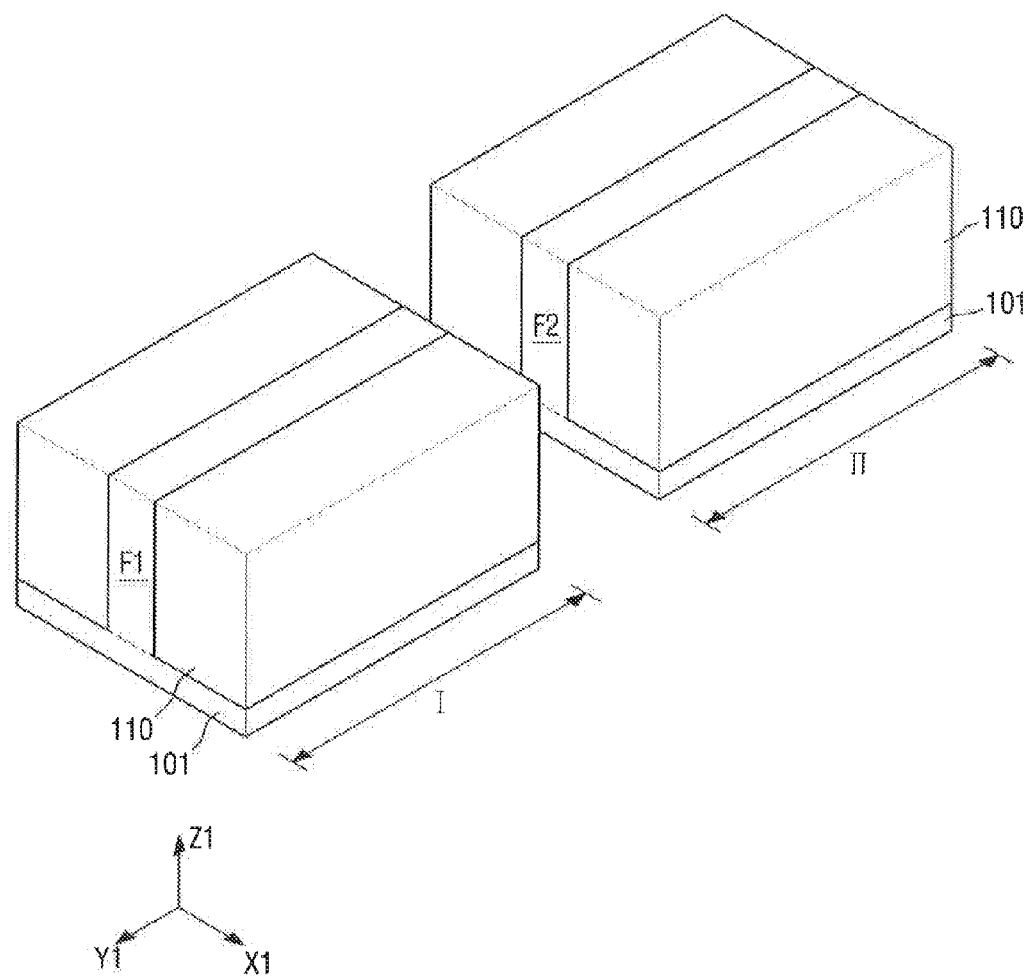

Referring to FIG. 4, a field insulating film 110 may be formed on the substrate 101, and may cover sidewalls of the first and second fins F1 and F2. The field insulating film 110 may include a material including at least one of a silicon oxide film, a silicon nitride film, or a silicon oxynitride film.

Figure 5:
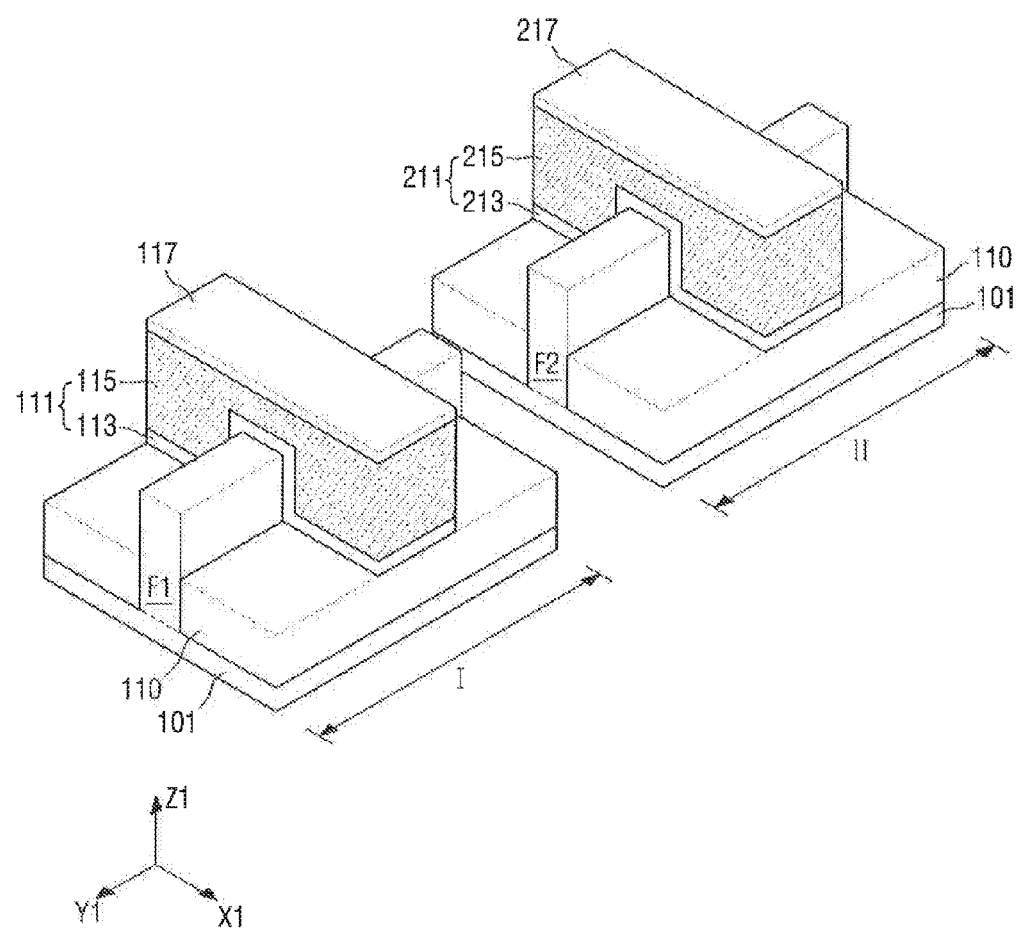

Referring to FIG. 5, an upper portion of the field insulating film 110 may be recessed to expose the upper portions of the first and second fins F1 and F2. The recess process may include a selective etch process.

A part of the first and second fins F1 and F2 protruding upward from the field insulating film 110 may be formed by an epitaxial process. For example, after formation of the field insulating film 110, instead of proceeding with a recess process, a part of the first and second fins F1 and F2 may be formed by an epitaxial process that uses an upper portion of the first and second fins F1 and F2 exposed by the field insulating film 110 as a seed.

Further, doping for adjusting a threshold voltage may be performed on the exposed first and second fins F1 and F2. For example, the first fin F1 in the first region I may be doped with boron (B) as an impurity, and the second fin F2 in the second region II may be doped with phosphorus (P) or arsenic (As) as an impurity. However, exemplary embodiments of the present inventive concept are not limited thereto, and the first and second fins F1 and F2 may be doped with the same kind of impurities as each other.

First and second dummy gate structures 111 and 211 may be formed on the first and second fins F1 and F2, respectively, which intersect the first and second fins F1 and F2. While the first and second dummy gate structures 111 and 211 may intersect the first and second fins F1 and F2 in a vertical direction (e.g., in the first direction X1), exemplary embodiments of the present inventive concept are not limited thereto. The first and second dummy gate structures 111 and 211 may intersect the first and second fins F1 and F2 by forming an acute angle and/or an obtuse angle with the first direction X1.

The first and second dummy gate structures 111 and 211 may include dummy gate insulating films 113 and 213 and dummy gate electrodes 115 and 215, respectively. The dummy gate insulating films 113 and 213 and the dummy gate electrodes 115 and 215 may be sequentially stacked.

The dummy gate insulating films 113 and 213 may be conformally formed on the upper portion of the sidewalls and the upper surfaces of the first and second fins F1 and F2 which are exposed (e.g., which are not covered by the field insulating film 110). The dummy gate insulating films 113 and 213 may be disposed between the dummy gate electrodes 115 and 215 and the field insulating film 110.

The dummy gate electrode 115 and 215 may be formed on the dummy gate insulating films 113 and 213.

As an example, the dummy gate electrodes 115 and 215 may include silicon oxide, and the dummy gate insulating films 113 and 213 may include polysilicon.

Each of the dummy hard mask films 117 and 217 may be formed on the first and second dummy gate structures 111 and 211. The dummy hard mask films 117 and 217 may include at least one of silicon oxide, silicon nitride, and silicon oxynitride.

Figure 6:
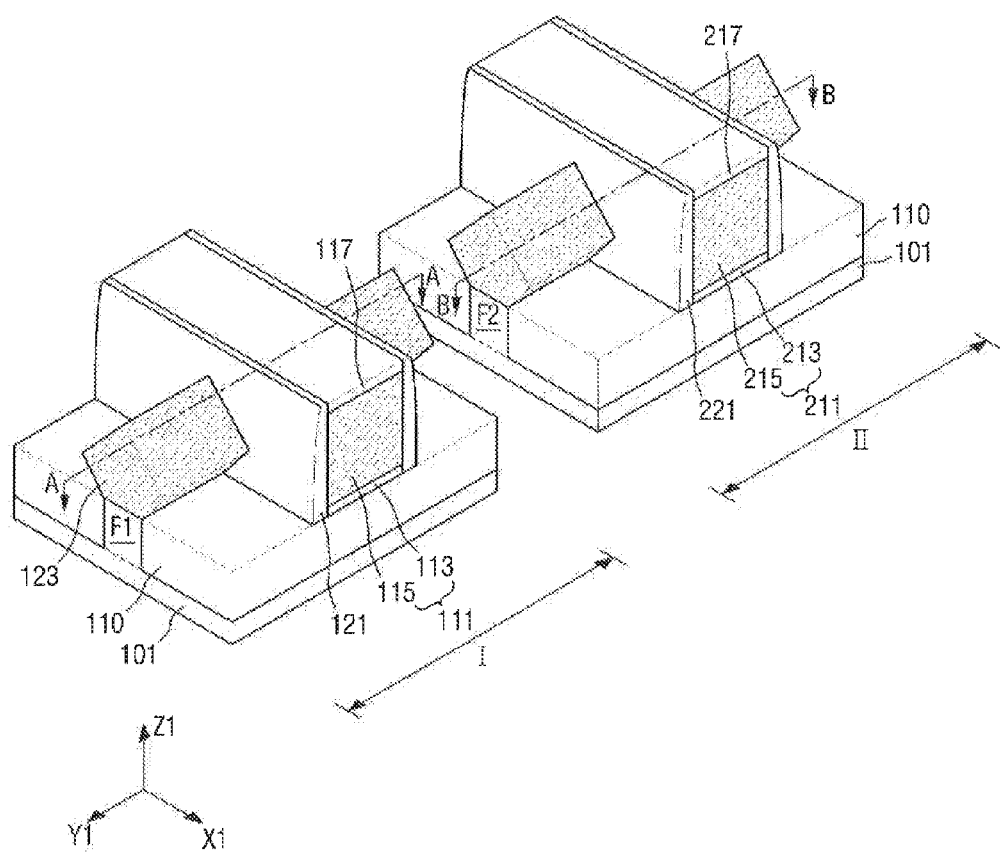
Figure 7:
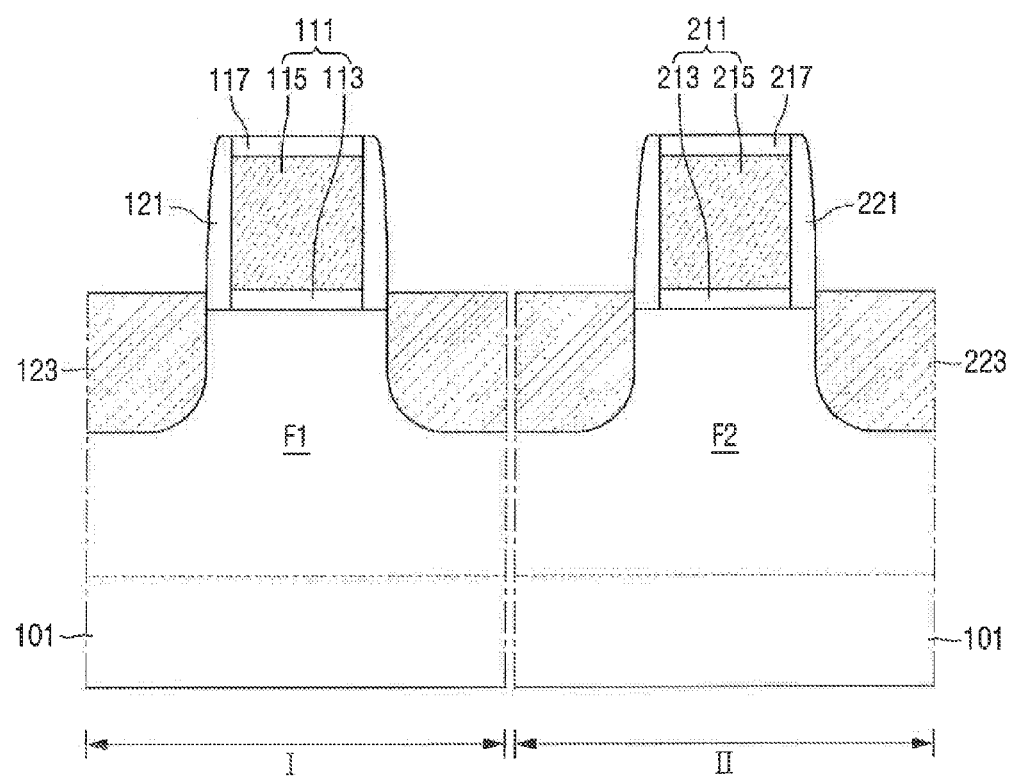

Referring to FIG. 6 and also to FIG. 7 which is a cross-sectional view taken on lines A-A and B-B in FIG. 6, first and second spacers 121 and 221 may be formed on either sidewall of the first and second dummy gate structures 111 and 211. FIG. 7 is a cross-sectional view taken on lines A-A and B-B of FIG. 6.

The first and second spacers 121 and 221 may expose the upper surface of the dummy hard mask films 117 and 217.

For example, each of the first and second spacers 121 and 221 may include at least one of silicon nitride (SiN), silicon oxynitride (SiON), silicon oxide (SiO2), silicon oxycarbidenitride (SiOCN), or a combination thereof.

While each of the first and second spacers 121 and 221 may each be a single film, exemplary embodiments of the present inventive concept are not limited thereto. When at least one of the first and second spacers 121 and 221 includes a plurality of films, at least one film among the films included in each of the first and second spacers 121 and 221 may include a low-k dielectric material such as silicon oxycarbonitride (SiOCN).

When at least one of the first and second spacers 121 and 221 includes a plurality of films, at least one film among the films included in each of the first and second spacers 121 and 221 may have an L-shape.

In some cases, the first and second spacers 121 and 221 may serve as a guide for forming a self-aligned contact. Thus, the first and second spacers 121 and 221 may include a material having an etch selectivity with respect to the interlayer insulating film 130.

The exposed first and second fins F1 and F2, which are not covered by the first and second dummy gate structures 111 and 211, may be etched. The first and second fins F1 and F2 may be etched using the first and second spacers 121 and 221 and the first and second dummy gate structures 111 and 211 as an etch mask.

First and second source/drain regions 123 and 223 may be formed in the etched portions of the first and second fins F1 and F2. The first source/drain region 123 may be formed in the first fin F1, and the second source/drain region 223 may be formed in the second fin F2. The first and second source/drain regions 123 and 223 may be an elevated source/drain region. Thus, the upper surfaces of the first and second source/drain regions 123 and 223 may be higher than the upper surfaces of the first and second fins F1 and F2.

The first source/drain region 123 and/or the second source/drain region 223 may include a tensile stress material. The first source/drain region 123 and/or the second source/drain region 223 may each include a same material as the substrate 101 (e.g., a tensile stress material). For example, when the substrate 101 includes Si, the first source/drain region 123 and/or the second source/drain region 223 may include Si or one or more other materials (e.g., SiC or SiP) having a lower lattice constant than Si; however, exemplary embodiments of the present inventive concept are not limited thereto.

As an example, the first source/drain region 123 and/or the second source/drain region 223 may include a compressive stress material. For example, the compressive stress material may be a material such as SiGe, which has a greater lattice constant than Si. The first and second source/drain regions 123 and 223 may be formed by epitaxial growth.

Although the first and second source/drain regions 123 and 223 may each have a pentagonal shape (see, e.g., FIG. 6), exemplary embodiments of the present inventive concept are not limited thereto. For example, the first and second source/drain regions 123 and 223 may have a shape such as a quadrangle, a circle, or a hexagon.

Figure 8:
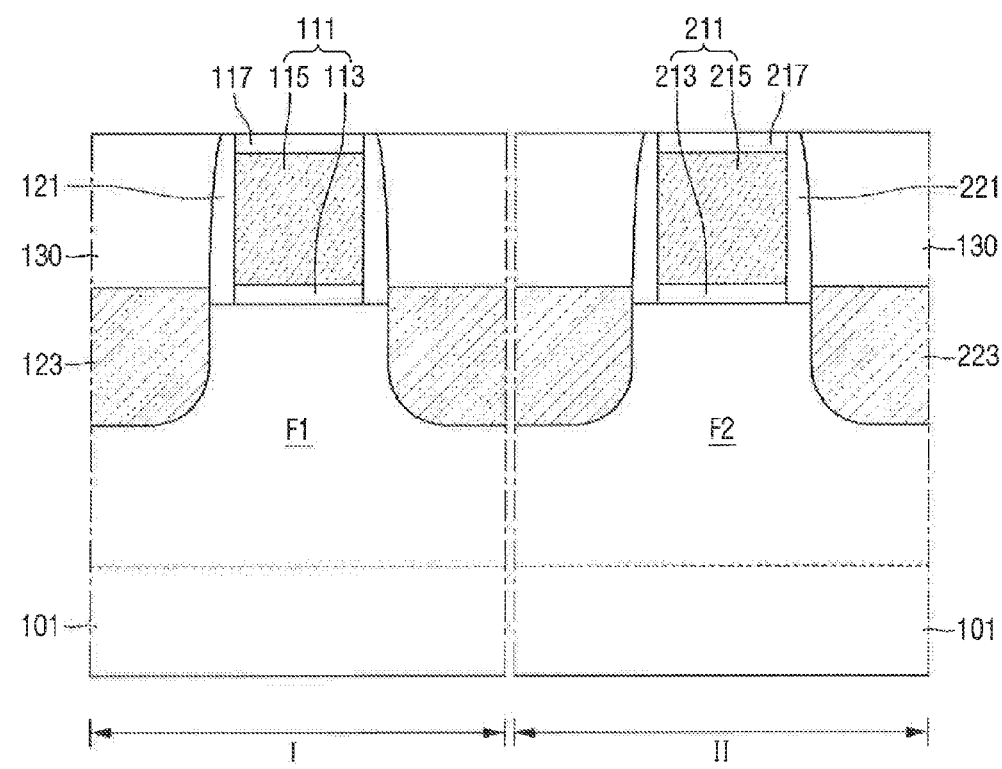

Referring to FIG. 8, an interlayer insulating film 130 may be formed on and may substantially cover the first and second source/drain regions 123 and 223. The interlayer insulating film 130 may substantially cover the sidewalls of the first and second spacers 121 and 221, and expose the upper surfaces of the dummy hard mask films 117 and 217. The interlayer insulating film 130 may include silicon oxide, for example.

Figure 9:
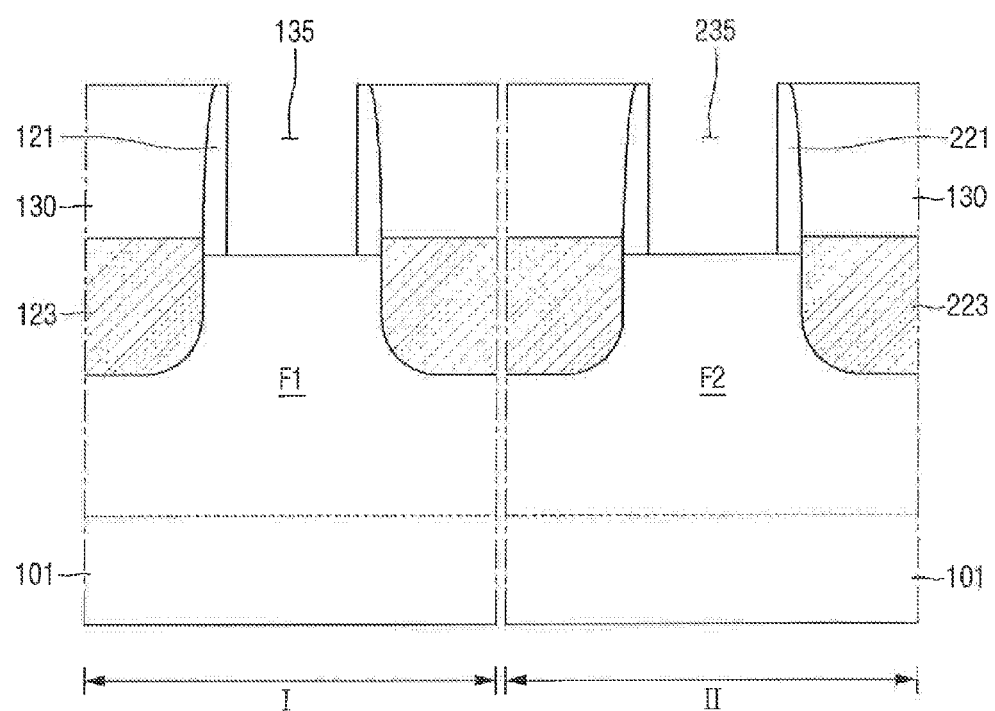

Referring to FIG. 9, first and second trenches 135 and 235 may expose the upper portion of the first and second fins F1 and F2. The hard mask films 117 and 217 may be removed. The hard mask films 117 and 217 may be removed through a planarization process, and when the planarization process is performed, the interlayer insulating film 130 may also be partially etched.

The first and second dummy gate structures 111 and 211 may be removed. The dummy gate electrodes 115 and 215 and the dummy gate insulating films 113 and 213 may be removed to expose the first and second fins F1 and F2. The first trench 135 may be formed at the location where the first dummy gate structure 111 was present, and the second trench 235 may be formed at the location where the second dummy gate structure 211 was present. The sidewalls of the first and second spacers 121 and 221 may be exposed by the first and second trenches 135 and 235.

Figure 10:
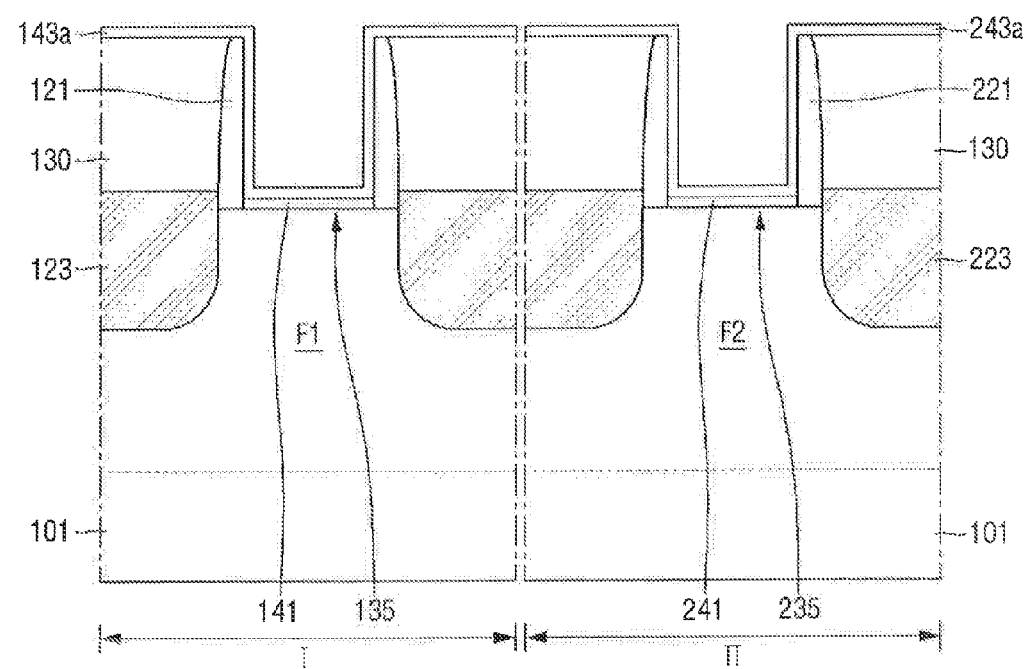

Referring to FIG. 10, first and second interface films 141 and 241 may be formed in the first and second trenches 135 and 235, respectively. The first and second interface films 141 and 241 may be formed along the upper portion of the sidewalls and the upper surfaces of the first and second fins F1 and F2.

The first and second interface films 141 and 241 may be formed by oxidizing the exposed first and second fins F1 and F2 in the first and second trenches 135 and 235, but exemplary embodiments of the present inventive concept are not limited thereto. The first and second interface films 141 and 241 may be formed along the bottom surfaces of the first and second trenches 135 and 235, respectively.

A first dielectric film 143a may be formed in the first trench 135, and a second dielectric film 243a may be formed in the second trench 235. As an example, the first dielectric film 143a may be formed conformally along the sidewalls and the bottom surface of the first trench 135, and may be formed conformally along the field insulating film 110 and the upper portion of the sidewalls and the upper surface of the first fin F1. The second dielectric film 243a may be conformally formed along the sidewalls and the bottom surface of the second trench 235, and may be conformally formed along the field insulating film 110 and the upper portion of the sidewalls and the upper surface of the second fin F2. Further, the first and second dielectric films 143a and 243a may also be formed on the interlayer insulating film 130.

The first and second dielectric films 143a and 243a may include a high-k dielectric material having a higher dielectric constant than silicon oxide film. For example, the first and second dielectric films 143a and 243a may include materials selected from HfSiON, HfO$_2$, ZrO$_2$, Ta$_2$O$_5$, TiO$_2$, SrTiO$_3$, or (Ba,Sr)TiO$_3$. Such first and second dielectric films 143a and 243a may be formed to a desired thickness depending on a type of device to be formed.

Figure 11:
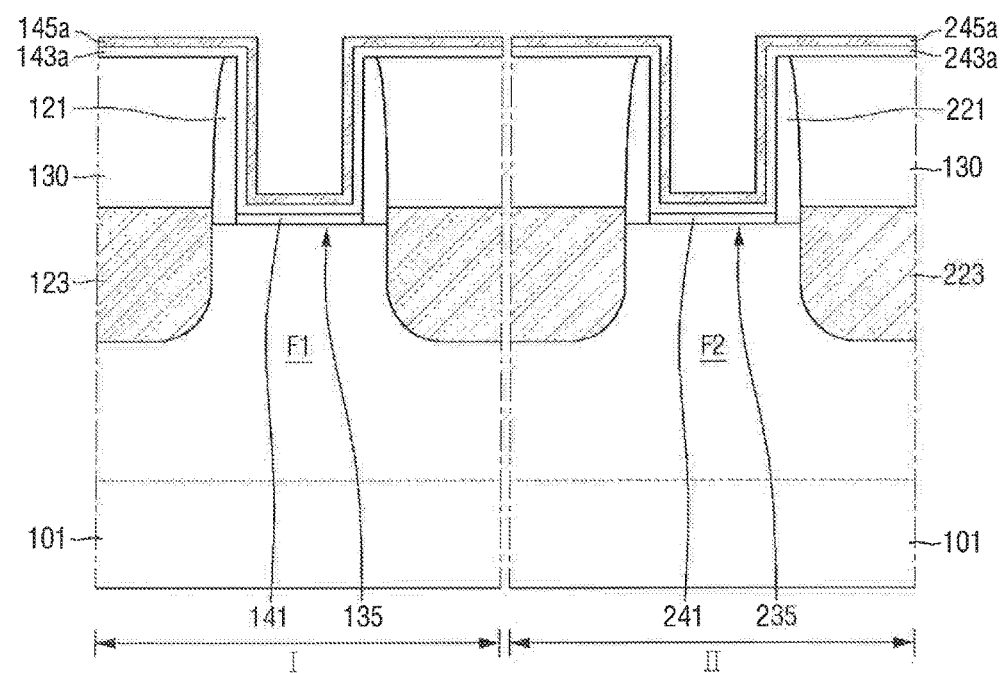

Referring to FIG. 11, a first lanthanum oxide film 145a may be formed in the first trench 135, and a second lanthanum oxide film 245a may be formed in the second trench 235. The first and second lanthanum oxide films 145a and 245a may be conformally formed along the sidewalls and bottom surfaces of the first and second trenches 145 and 245, respectively. Further, they may be formed along the upper portion of the sidewalls and upper surfaces of the first and second fins F1 and F2. The first and second lanthanum oxide films 145a and 245a may include, but are not limited to, LaO.

Figure 12:
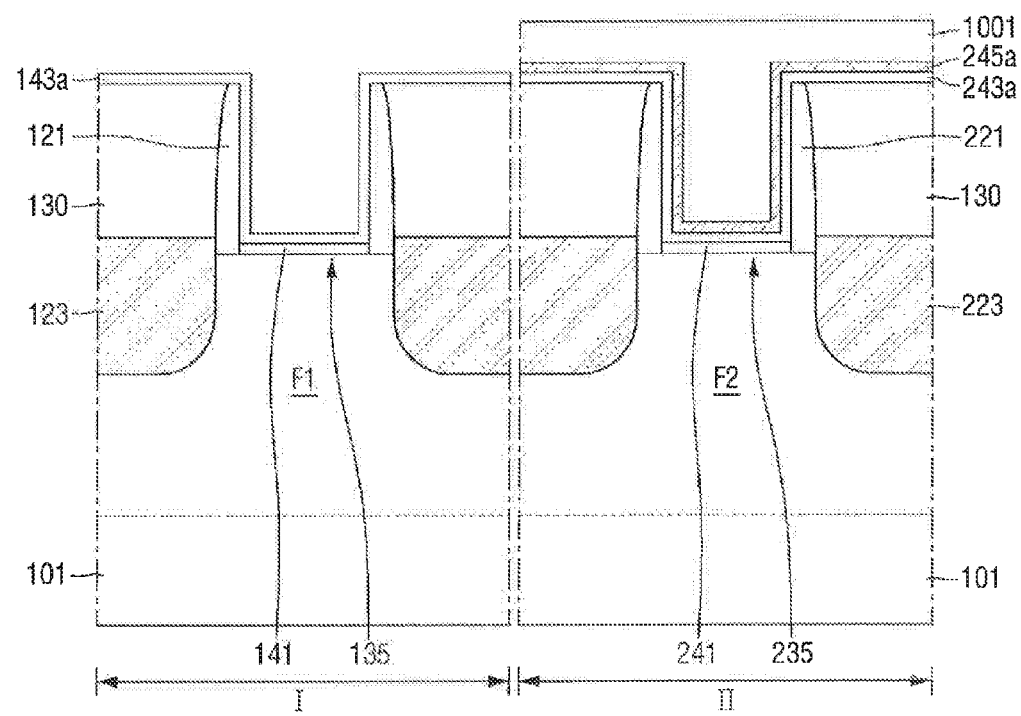

Referring to FIG. 12, the first lanthanum oxide film 145a in the first region I may be removed through the first mask pattern 1001. As an example, the first mask pattern 1001 may be formed by forming a mask layer substantially covering the first and second regions I and II, and patterning the mask layer. The first lanthanum oxide film 145a in the first region I may be removed by an etching process using the first mask pattern 1001 as an etching mask. Thus, the first dielectric film 143a may be exposed.

Figure 13:
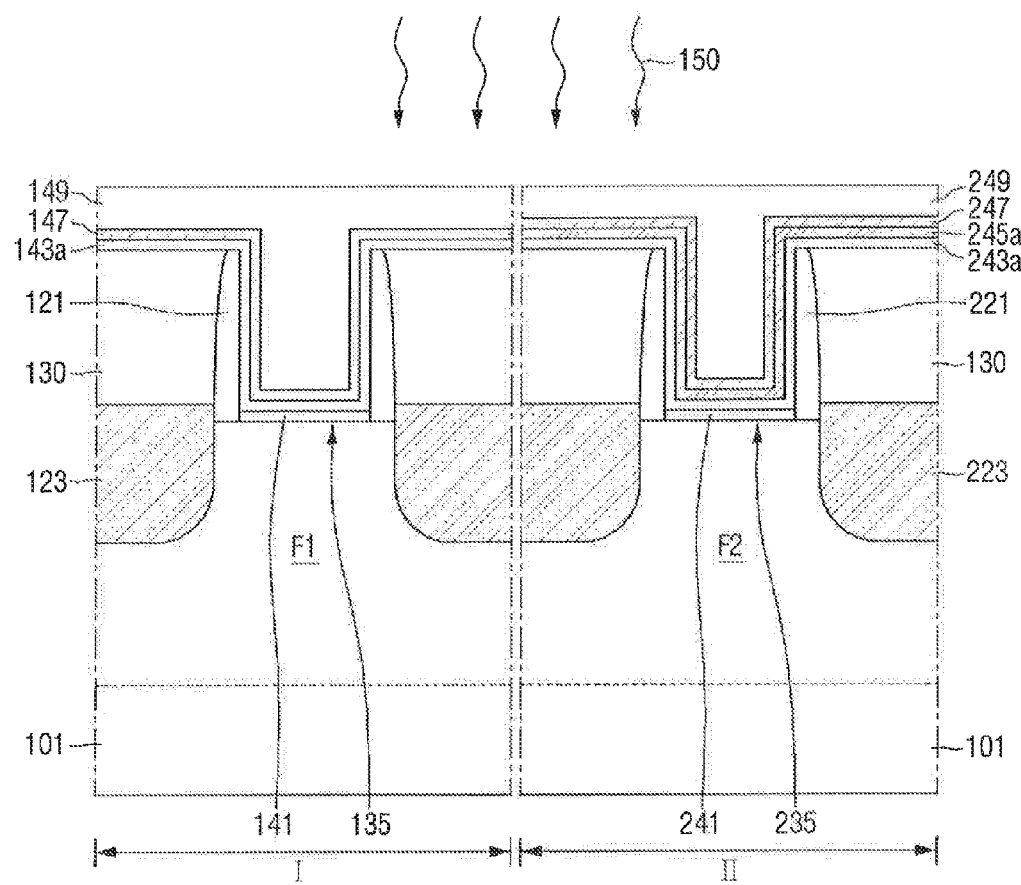

Referring to FIG. 13, first and second diffusion films 147 and 247 and first and second blocking films 149 and 249 may be sequentially formed. The first diffusion film 147 may be formed in the first trench 135, and the second diffusion film 247 may be formed in the second trench 235. The first and second diffusion films 147 and 247 may be conformally formed along the sidewalls and bottom surfaces of the first and second trenches 135 and 235, respectively. Further, they may be formed along the upper portion of the sidewalls and upper surfaces of the first and second fins F1 and F2. The first and second diffusion films 147 and 247 may include, but are not limited to, TiN.

First and second blocking films 149 and 249 may be formed on the first and second diffusion films 147 and 247, respectively. The first and second blocking films 149 and 249 may substantially fill the first and second trenches 135 and 235, and may substantially cover the first and second diffusion films 147 and 247 and may prevent the first and second diffusion films 147 and 247 from being exposed to the outside. The first and second blocking films 149 and 249 may include Si, for example.

Annealing 150 may then be performed. The first and second dielectric films 143a and 243a may include oxygen atoms. The oxygen atoms may be bonded to other materials (e.g., Hf, Zr, Ta, or Ti) in the first and second dielectric films 143a and 243a, but some may have broken bonds. If the bonding is broken, a leakage current may be generated and the performance of the transistor may be degraded. Annealing 150 may be performed to bond oxygen atoms to the broken bond portion, which may reduce or eliminate a leakage current. When the annealing 150 is performed, oxygen atoms included in the first diffusion film 147 may be supplied to the first dielectric film 143a. Further, oxygen atoms included in the second diffusion film 247 and/or the second lanthanum oxide film 245a may be supplied to the second dielectric film 243a.

When the first and second diffusion films 147 and 247 are exposed during the annealing 150, the external oxygen atoms may penetrate into the first and second diffusion films 147 and 247 during the annealing 150, and the number of oxygen atoms moving to the bottom of the first and second diffusion films 147 and 247 may increase. When the oxygen atoms are provided in excess of the number of oxygen atoms bonding to materials included in the first and second dielectric films 143a and 243a, an excess of oxygen atoms may react with the first and second fins F1 and F2 in the first and second trenches 135 and 235. Thus, the thickness of the first and second interface films 141 and 241 may increase and the performance of the transistor may be degraded. Thus, the first and second blocking films 149 and 249 may be formed on the first and second diffusion films 147 and 247 to block the first and second diffusion films 147 and 247 from the outside during the annealing 150, and thus the amount of oxygen atoms supplied may be controlled.

The annealing 150 may be performed at a temperature of from about 500° C. to about 1500° C.

The thickness of the first and second diffusion films 147 and 247 may vary depending on the number of oxygen atoms to be supplied.

Figure 14:
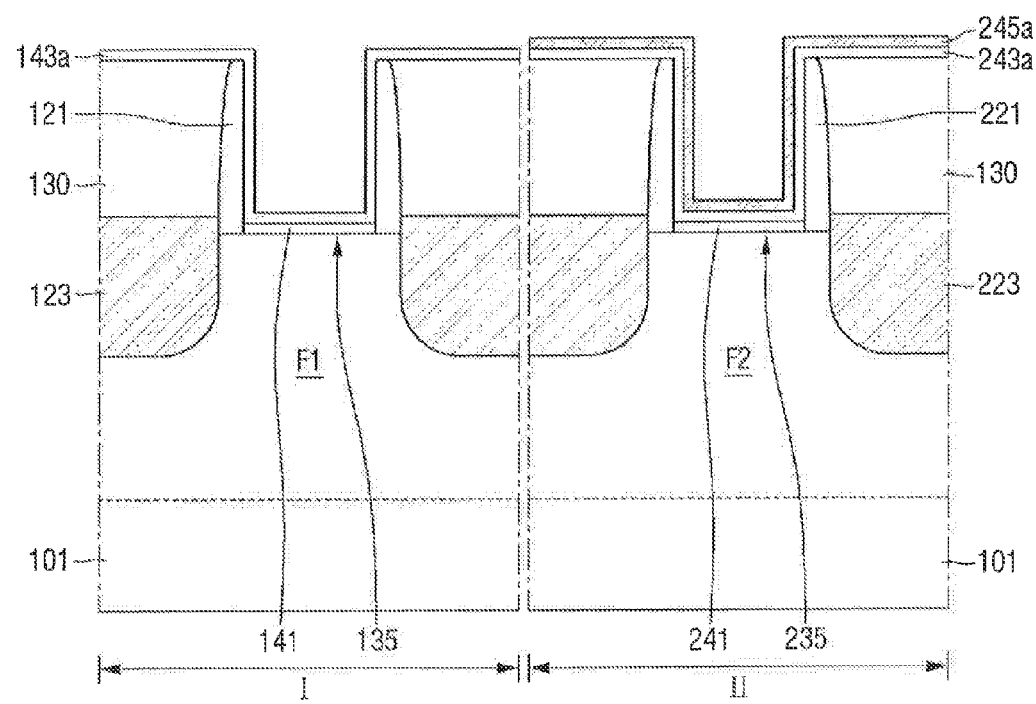

Referring to FIG. 14, the first and second blocking films 149 and 249 and the first and second diffusion films 147 and 247 may be sequentially removed. Thus, the first dielectric film 143a and the second lanthanum oxide film 245a may be exposed.

Figure 15:
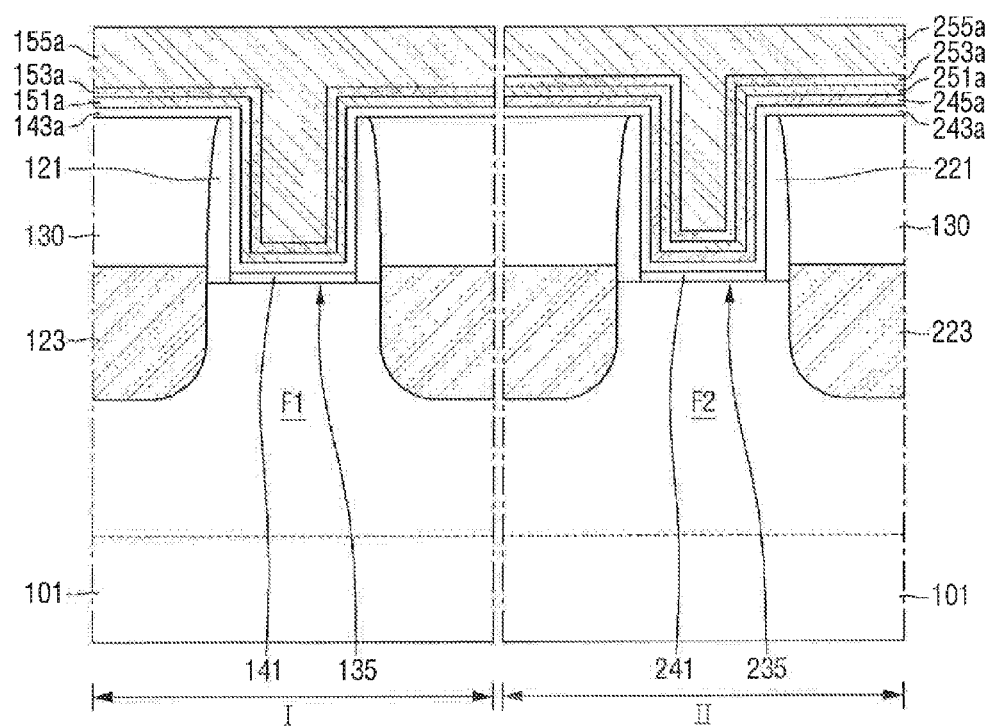

Referring to FIG. 15, first and second TiAlC films 151a and 251a may be formed on the first dielectric film 143a and the second lanthanum oxide film 245a, respectively. The first and second TiAlC films 151a and 251a may be conformally formed along the sidewalls and bottom surfaces of the first and second trenches 135 and 235, respectively. Further, the first and second TiAlC films 151a and 251a may include TiAlC, for example.

First and second barrier films 153a and 253a may be formed on the first and second TiAlC films 151a and 251a, respectively. As an example, the first and second barrier films 153a and 253a may be conformally formed along the sidewalls and the bottom surfaces of the first and second trenches 130 and 230, respectively. The first and second barrier films 153a and 253a may include TiN, for example. The first and second barrier films 153a and 253a may prevent the materials included in the first and second metal films 155a and 255a from diffusing into the first and second trenches 130 and 230.

First and second metal films 155a and 255a may be formed on the first and second barrier films 153a and 253a, respectively. The first and second metal films 155a and 255a may fill the remaining portions of the first and second trenches 130 and 230. The first and second metal films 155a and 255a may include Al, or W, for example.

Figure 16:
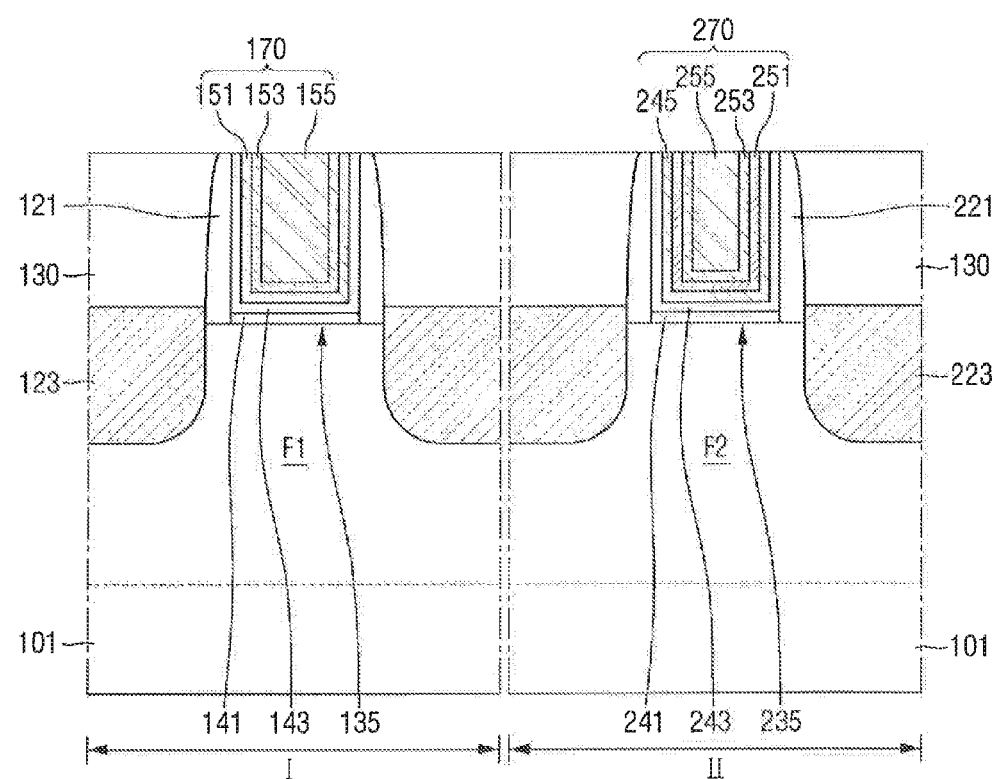

Referring to FIG. 16, first and second gate stacks 170 and 270 may be formed. When the planarization process is performed to expose the interlayer insulating film 130 (see, e.g., FIG. 15), the first gate stack 170 may be formed in the first region I, and the second gate stack 270 may be formed in the second region II.

Figure 17:
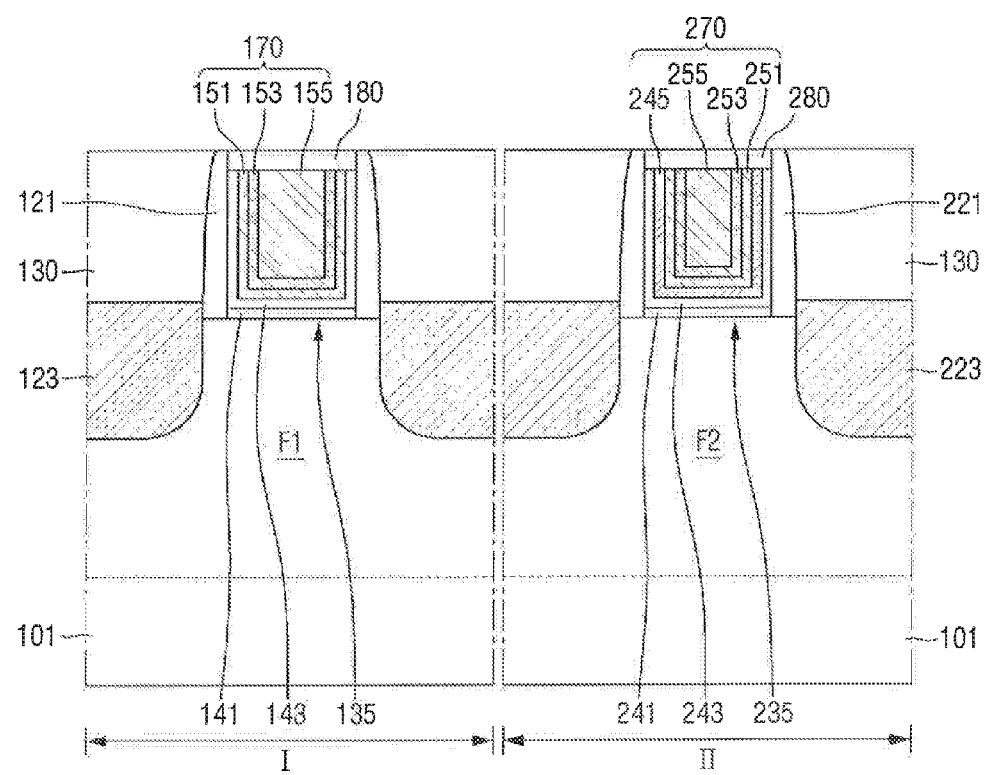

Referring to FIG. 17, first and second capping films 180 and 280 may be formed on the first and second gate stacks 170 and 270, respectively.

A portion of the first and second gate stacks 170 and 270 may be removed to adjust a height of the first and second gate stacks 170 and 270 prior to forming the first and second capping films 180 and 280. Thus, the first and second dielectric films 143 and 243, the first and second barrier films 153 and 253, the first and second TiAlC films 151 and 251, the first and second metal films 155 and 255, and the second lanthanum oxide film 245 may be partially removed from the first and second trenches 135 and 235. In this case, the sidewalls of each of the first and second capping films 180 and 280 may be in direct contact with the sidewalls of the first and second spacers 121 and 221. Further, the upper surface of the first and second capping films 180 and 280 may be disposed on the same plane as the interlayer insulating film 130.

Figure 18:
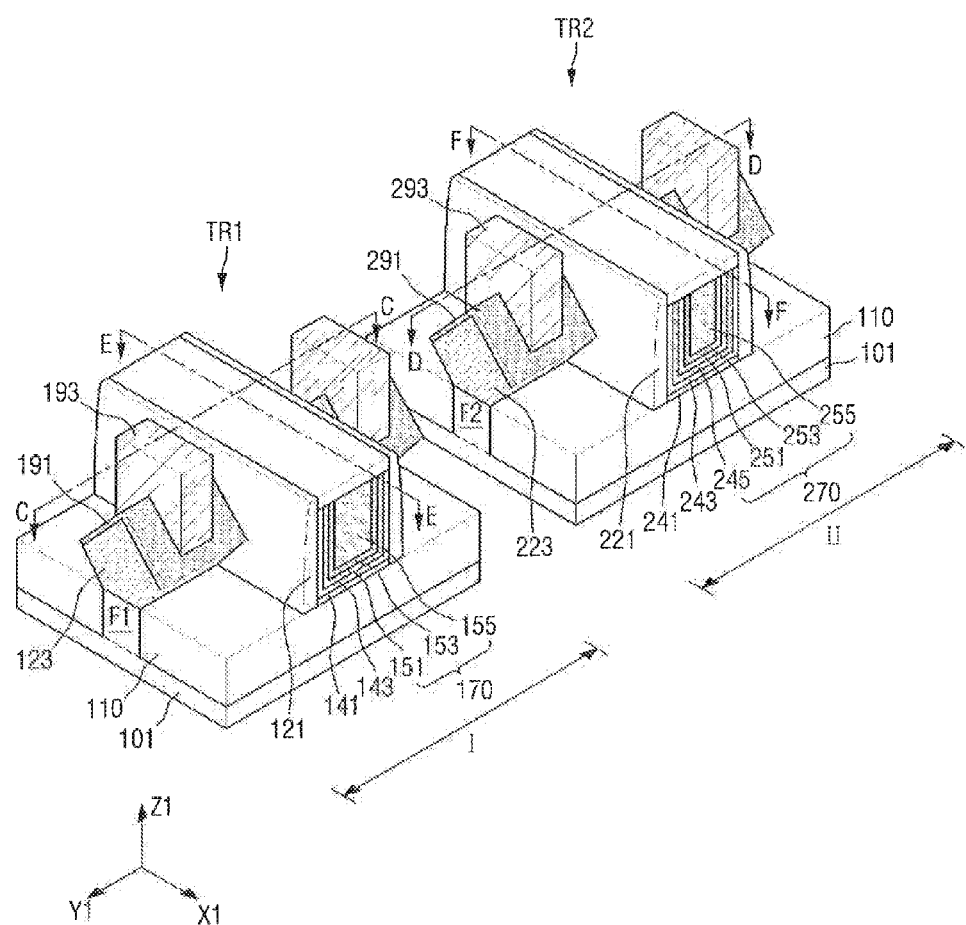
Figure 19:
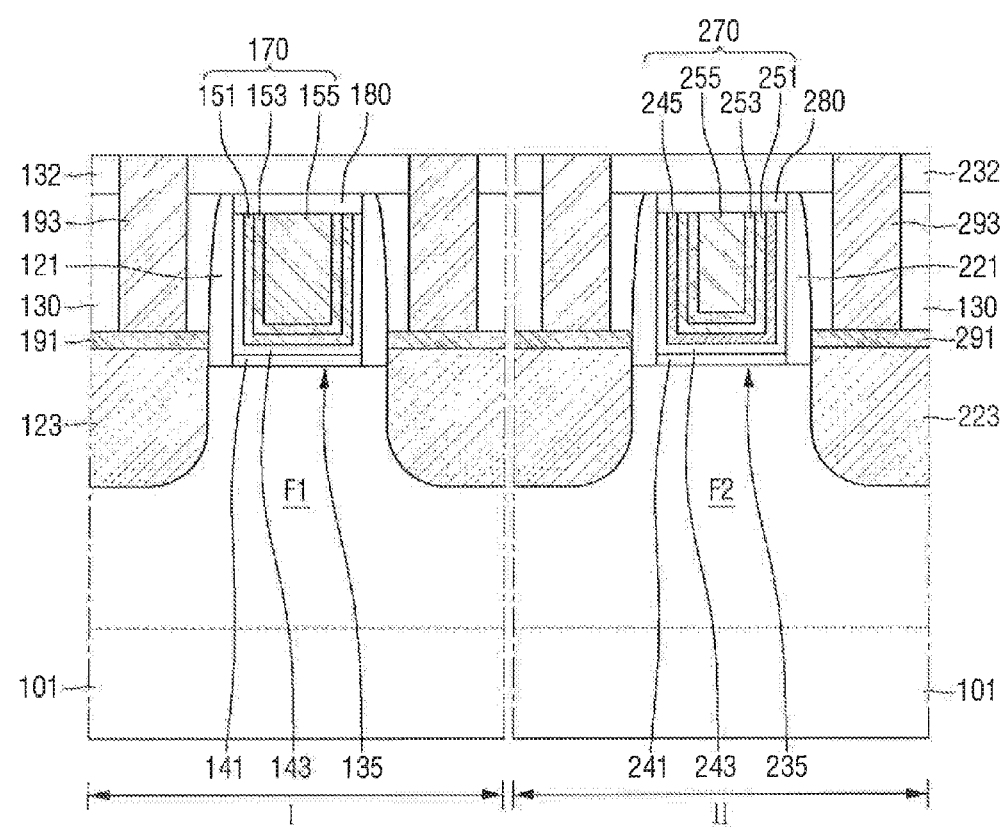
Figure 20:
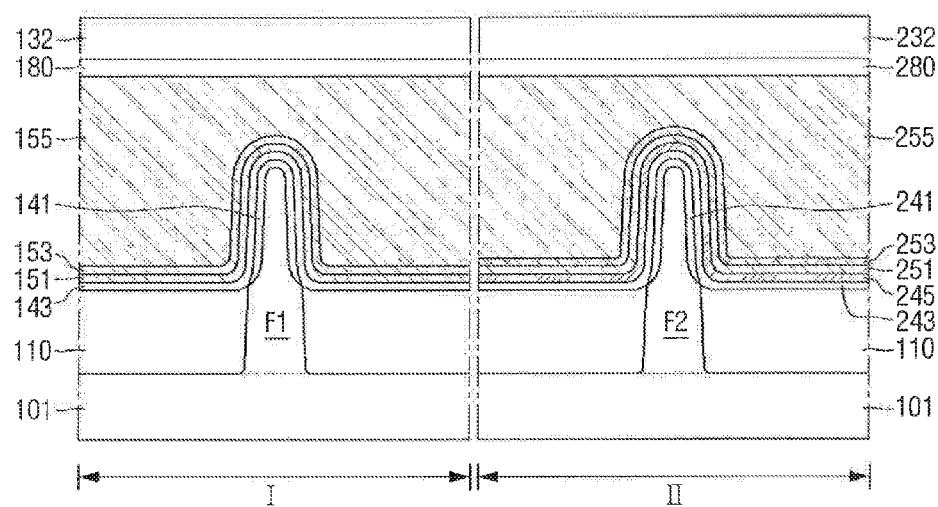

Referring to FIGS. 18 to 20, a first transistor TR1 may be formed in the first region I, and a second transistor TR2 may be formed in the second region II. FIG. 19 is a cross-sectional view taken on line C-C and D-D in FIG. 18, and FIG. 20 is a cross-sectional view taken on lines E-E and F-F in FIG. 18.

Second interlayer insulating films 132 and 232 may be formed on the interlayer insulating film 130. The second interlayer insulating films 132 and 232 may substantially cover the first and second capping films 180 and 280. The second interlayer insulating films 132 and 232 may include a same material as the interlayer insulating film 130, and may include, for example, silicon oxide.

First and second silicide films 191 and 291 may be formed on the first and second source/drain regions 123 and 223, and the first and second contacts 193 and 293 penetrating the insulating film 130 and the second interlayer insulating films 132 and 232 may be formed on the first and second source/drain regions 123 and 223 to form the semiconductor device according to an exemplary embodiment of the present inventive concept; however, exemplary embodiments of the present inventive concept are not limited thereto. The first and second silicide films 191 and 291 may reduce the surface resistance and the contact resistance on of the first and second source/drain regions 123 and 223, and may include, for example, Pt, Ni, or Co. The first and second contacts 193 and 293 may include, for example, W, Al, or Cu.

A semiconductor device according to an exemplary embodiment of the present inventive concept will be described in more detail below with reference to FIG. 21.

Figure 21:
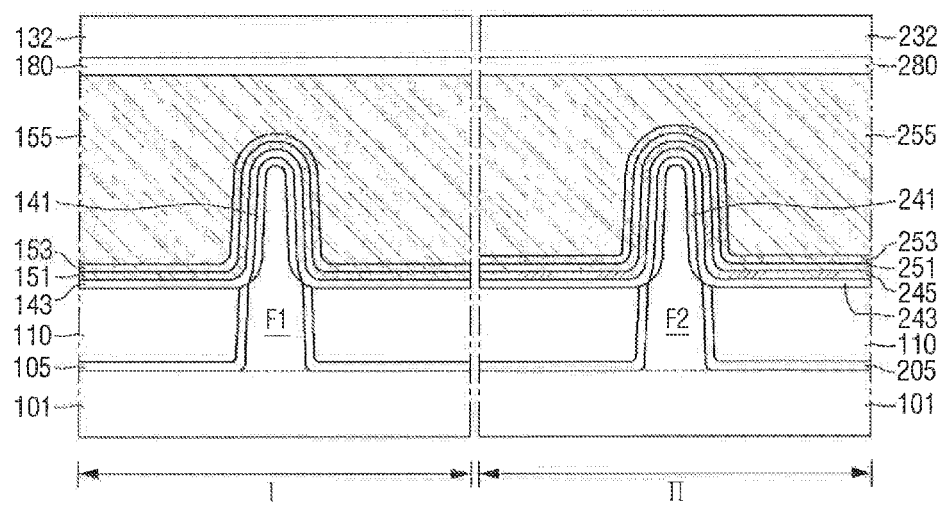
FIG. 21 is a cross-sectional view illustrating a semiconductor device according to an exemplary embodiment of the present inventive concept.

FIG. 21 is a cross-sectional view illustrating a semiconductor device according to an exemplary embodiment of the present inventive concept. The semiconductor device according an exemplary embodiment of the present inventive concept described below with reference to FIG. 21 is substantially the same as the semiconductor device described above with reference to FIG. 20, except that it further includes a second field insulating film between the fin and the field insulating film. Thus, duplicative descriptions may be omitted.

Referring to FIG. 21, second field insulating films 105 and 205 may be formed between the first and second fins F1 and F2 and the field insulating film 110. As an example, the second field insulating films 105 and 205 may substantially cover the upper surface of the substrate 101 and the sidewalls of the first and second fins F1 and F2. The second field insulating films 105 and 205 may be conformally formed along the upper surface of the substrate 101 and the sidewalls of the first and second fins F1 and F2.

A semiconductor device according to an exemplary embodiment of the present inventive concept will now be described in more detail below with reference to FIGS. 22 to 24.

Figure 22:
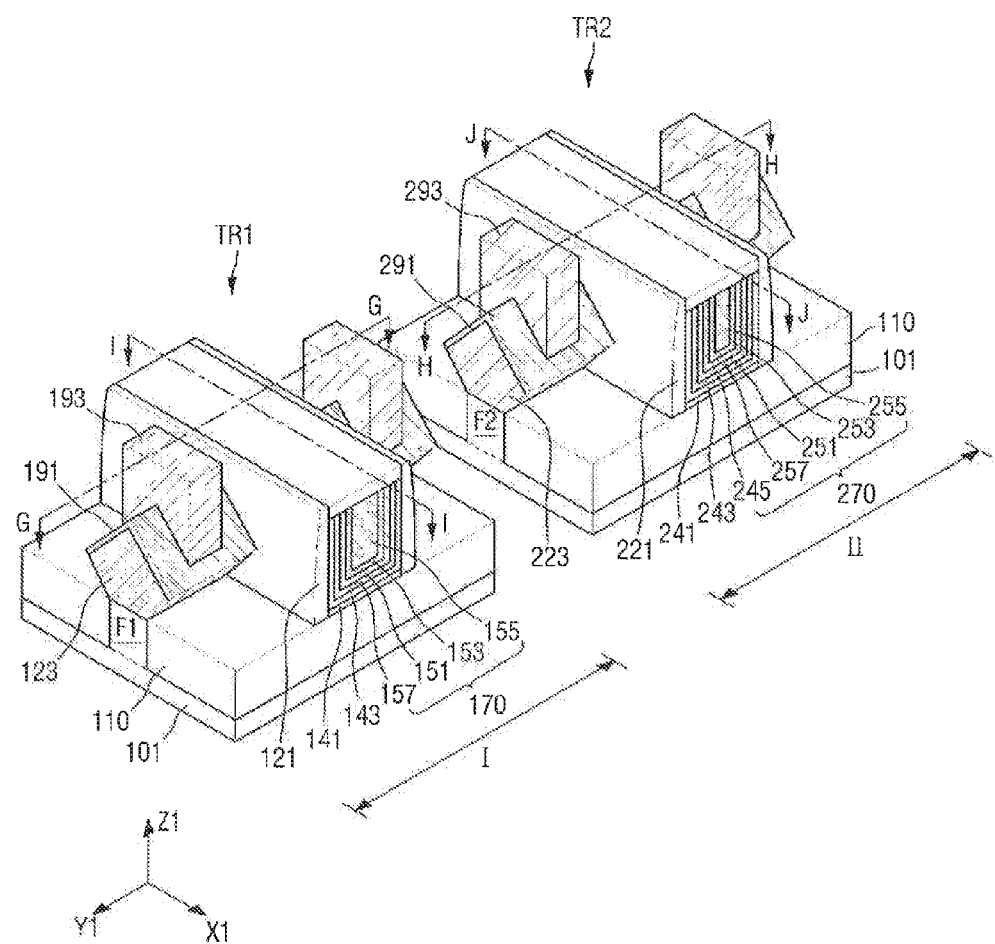
FIGS. 22 to 24 are perspective views and cross-sectional views illustrating a semiconductor device according to an exemplary embodiment of the present inventive concept.
Figure 23:
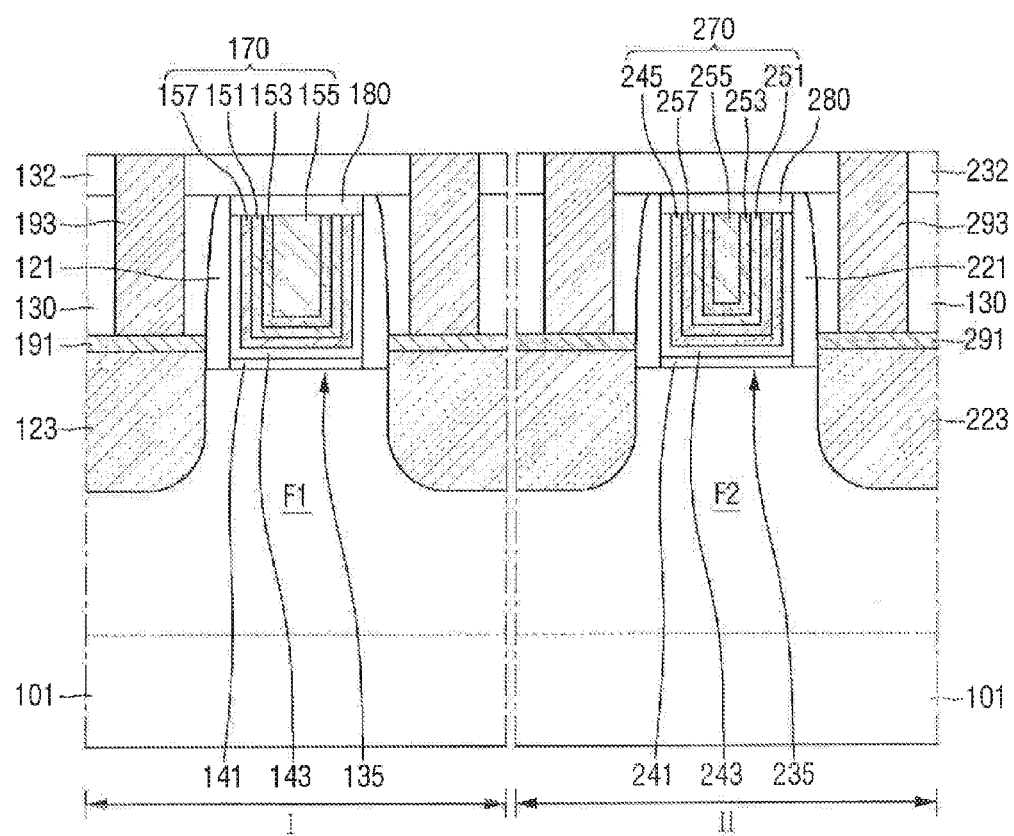
Figure 24:
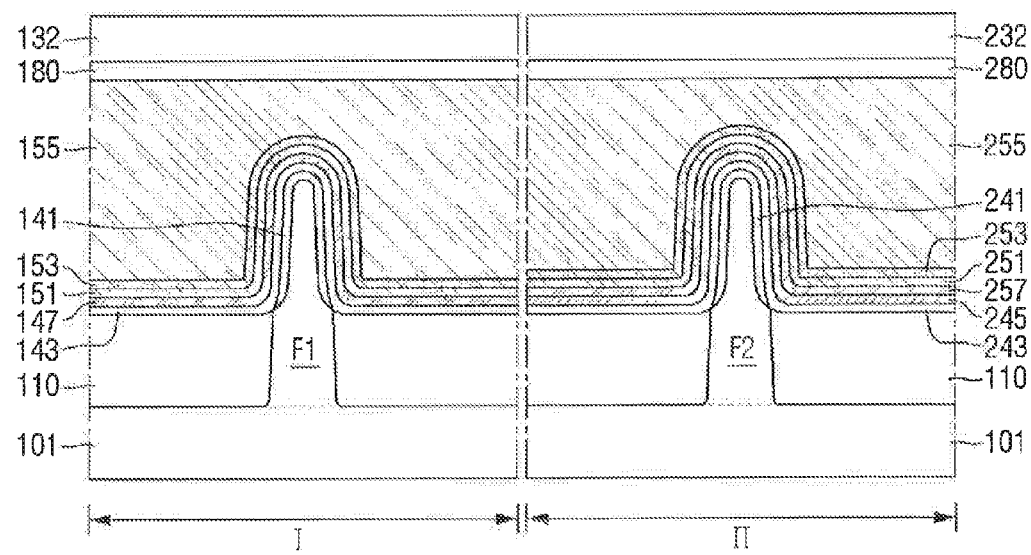

FIGS. 22 to 24 are perspective views and cross-sectional views illustrating a semiconductor device according to an exemplary embodiment of the present inventive concept. FIG. 22 is a perspective view provided to explain a semiconductor device according to some exemplary embodiments of the present inventive concept. FIG. 23 are cross-sectional views taken on lines G-G and H-H in FIG. 22, and FIG. 24 are cross-sectional views taken on lines I-I and J-J in FIG. 22.

The semiconductor device according an exemplary embodiment of the present inventive concept described below with reference to FIG. 23 is substantially the same as the semiconductor device described above with reference to FIGS. 18 to 20, except that each of the first and second gate stacks further includes a first TiN film and a second TiN film. Thus, duplicative descriptions may be omitted.

Referring to FIGS. 18 to 20, the substrate 101 may include first and second regions I and II, and first and second transistors TR1 and TR2 may be formed in the first and second regions I and II, respectively.

The first and second transistors TR1 and TR2 may each include first and second source/drain regions 123 and 223, first and second spacers 121 and 221, first and second interface films 141 and 241, first and second dielectric films 143 and 243, and first and second gate stacks 170 and 270.

As an example, the first transistor TR1 may include the first source/drain region 123, the first spacer 121, a first interface film 141, a first dielectric film 143, and a first gate stack 170. The first gate stack 170 may include a first TiN film 157, a first TiAlC film 151, a second barrier film 153, and a first metal film 155.

The second transistor TR2 may include the second source/drain region 223, the second spacer 221, a second interface film 241, a second dielectric film 243, and a second gate stack 260. The second gate stack 260 herein may include a second lanthanum oxide film 245, a second TiN film 257, a second TiAlC film 251, a second barrier film 253, and a second metal film 255.

In an exemplary embodiment of the present inventive concept, each of the first and second transistors TR1 and TR2 may include a first TiN film 157 and a second TiN film 257, thus controlling the threshold voltages of each of the first and second transistors TR1 and TR2. In an exemplary embodiment of the present inventive concept, the first TiN film 157 and the second TiN film 257 may include TiN, and may have different thicknesses from each other.

A semiconductor device according to some exemplary embodiments of the present inventive concept will be described in more detail below with reference to FIG. 25.

Figure 25:
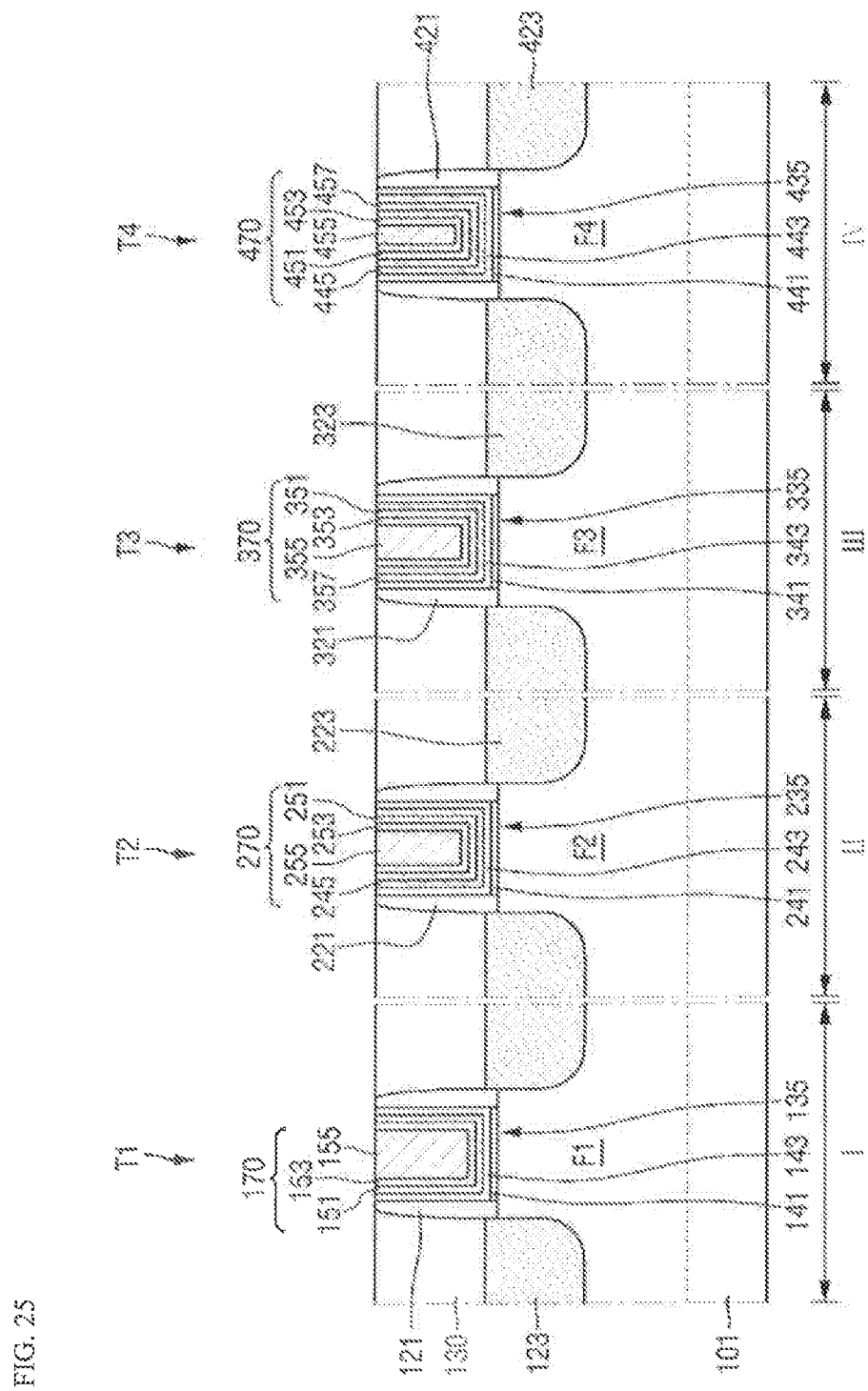
FIG. 25 is a cross-sectional view illustrating a semiconductor device according to an exemplary embodiment of the present inventive concept.

FIG. 25 is a cross-sectional view illustrating a semiconductor device according to an exemplary embodiment of the present inventive concept.

The semiconductor device according to an exemplary embodiment of the present inventive concept may include first to fourth regions I to IV. Each of the first to fourth regions I to IV may include first to fourth transistors T1, T2, T3, and T4.

The first transistor T1 described with reference to FIG. 25 may be substantially the same as the first transistor TR1 described with reference to FIG. 1, and the second transistor T2 described with reference to FIG. 25 may be substantially the same as the second transistor TR2 described with reference to FIG. 1. Thus, duplicative descriptions may be omitted.

The third transistor T3 described with reference to FIG. 25 may be substantially the same as the first transistor TR1 described with reference to FIG. 23, and the fourth transistor T4 described with reference to FIG. 25 may be substantially the same as the second transistor TR2 described with reference to FIG. 23.

As an example, the third transistor T3 may include a third source/drain region 323, a third spacer 321, a third interface film 341, a third dielectric film 343, and a third gate stack 370, and the third gate stack 370 may include a third TiN film 357, a third TiAlC film 351, a third barrier film 353, and a third metal film 355.

As an example, the third source/drain region 323, the third spacer 321, the third interface film 341, the third dielectric film 343, and the third gate stack 370, the third TiN film 357, the third TiAlC film 351, the third barrier film 353, and the third metal film 355 may correspond to the first source/drain region 123, the first spacer 121, the first barrier film 141, the first dielectric film 143, and the first gate stack 170, the first TiN film 157, the first TiAlC film 151, the first barrier film 153, and the first metal film 155 included in the first transistor TR1 in FIG. 23, respectively.

Further, the fourth transistor T4 may include a fourth source/drain region 423, a fourth spacer 421, a fourth interface film 441, a fourth dielectric film 443, a fourth lanthanum oxide film 445, and a fourth gate stack 460, and the fourth gate stack 460 may include a fourth TiN film 457, a fourth TiAlC film 451, a fourth barrier film 453, and a fourth metal film 455.

As an example, the fourth source/drain region 423, the fourth spacer 421, the fourth interface film 441, the fourth dielectric film 443, the fourth gate stack 460, the fourth TiN film 457, the fourth TiAlC film 451, the fourth barrier film 453, the fourth metal film 455, and the fourth lanthanum oxide film 445 may correspond to the second source/drain region 223, the second spacer 221, the second interface film 241, the second dielectric film 243, the second gate stack 260, the second TiN film 257, the second TiAlC film 251, the second barrier film 253, the second metal film 255, and the second lanthanum oxide film 245 included in the second transistor TR2 in FIG. 23, respectively.

In an exemplary embodiment of the present inventive concept, each of the first to fourth transistors T1 to T4 may have different threshold voltages from each other. As an example, the second and fourth transistors T2 and T4 include second and fourth lanthanum oxide films 245 and 445 including LaO, and the first and third transistors T1 and T3 do not include LaO. The third and fourth transistors T3 and T4 may include a third TiN film 357 and a fourth TiN film 457, respectively, which include TiN. The first and second transistors T1 and T2 might not have a configuration corresponding to the third TiN film 357 and the fourth TiN film 457. As an example, each of the first to fourth transistors T1 to T4 may include TaN.

As an example, in an exemplary embodiment of the present inventive concept, the threshold voltage may be varied by including TaN in each of the first to fourth transistors T1 to T4, and including LaO in some of the transistors and not including LaO in the remaining transistors. As an example, in an exemplary embodiment of the present inventive concept, each of the first to fourth transistors T1 to T4 may be N-type transistors, but exemplary embodiments of the present inventive concept are not limited thereto.

When each of the first to fourth transistors T1 to T4 is an N-type transistor, the threshold voltages of the second transistor T2, the first transistor T1, the fourth transistor 14, and the third transistor T3 may increase in this order, but exemplary embodiments of the present inventive concept are not limited thereto.

A semiconductor device according to some exemplary embodiments of the present inventive concept will be described below in more detail with reference to FIG. 26.

Figure 26:
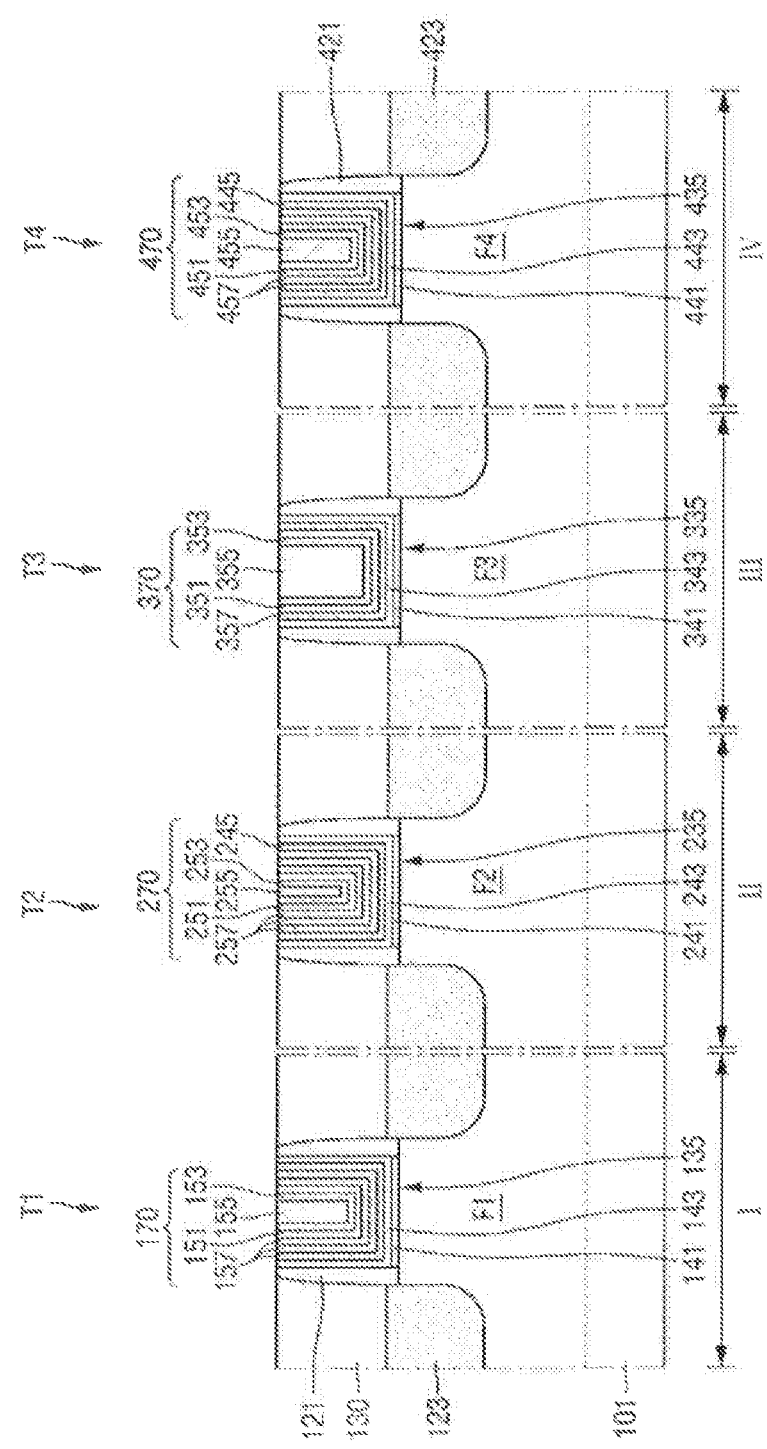
FIG. 26 is a cross-sectional view illustrating a semiconductor device according to an exemplary embodiment of the present inventive concept.

FIG. 26 is a cross-sectional view illustrating a semiconductor device according to an exemplary embodiment of the present inventive concept. The semiconductor device according an exemplary embodiment of the present inventive concept described below with reference to FIG. 26 is substantially the same as the semiconductor device described above with reference to FIG. 25, except that it further includes first and second TiN films 157 and 257. Thus, duplicative descriptions may be omitted.

Referring to FIG. 26, the first transistor T1 may further include a first TiN film 157, and the second transistor T2 may further include a second TiN film 257. Each of the first to fourth TiN films 157, 257, 357, and 457 may have different thicknesses. As an example, the first, second, and fourth TiN films 157, 257, and 457 may each have a multilayer structure, but exemplary embodiments of the present inventive concept are not limited thereto, and one or more of the first, second, and fourth TiN films 157, 257, and 457 may have a single layer structure.

In an exemplary embodiment of the present inventive concept, each of the first to fourth transistors T1 to T4 may have different threshold voltages. As an example, the second and fourth transistors T2 and T4 may include second and fourth lanthanum oxide films 245 and 445 including LaO, and the first and third transistors T1 and T3 might not include LaO. Alternatively, each of the first to fourth transistors T1 to T4 may include TaN.

As an example, in an exemplary embodiment of the present inventive concept, the threshold voltage may be varied by including TaN in each of the first to fourth transistors T1 to T4, and including LaO in some of the transistors and not including LaO in the remaining transistors. As an example, in an exemplary embodiment of the present inventive concept, each of the first to fourth transistors T1 to T4 may be a P-type transistor, but exemplary embodiments of the present inventive concept are not limited thereto.

When each of the first to fourth transistors T1 to T4 is a P-type transistor, the threshold voltages of the first transistor T1, the second transistor T2, the third transistor T3, and the fourth transistor T4 may increase in this order; however, exemplary embodiments of the present inventive concept are not limited thereto.

Referring to FIGS. 27 to 42, a method for manufacturing a semiconductor device according to some exemplary embodiments of the present inventive concept and a semiconductor device fabricated thereby will be described in more detail. The semiconductor device described with reference to FIGS. 27 to 42 may be an exemplary embodiment of the semiconductor device described with reference to the first region I of FIGS. 22 to 24. As an example, the first dielectric film 143 in the first region I in FIGS. 22 to 24 may be substantially the same as the first dielectric film 143 of the semiconductor device described with reference to FIGS. 27 to 42. However, exemplary embodiments of the present inventive concept are not limited thereto, and the semiconductor device described with reference to FIGS. 27 to 42 may be different from the semiconductor device described with reference to FIGS. 22 to 24.

Figure 27:
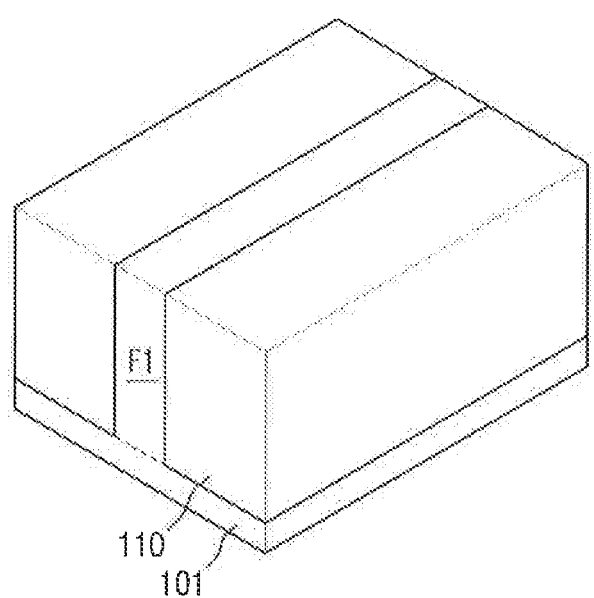
FIGS. 27 to 39 are views illustrating method of manufacturing a semiconductor device according to some exemplary embodiments of the present inventive concept.
Figure 28:
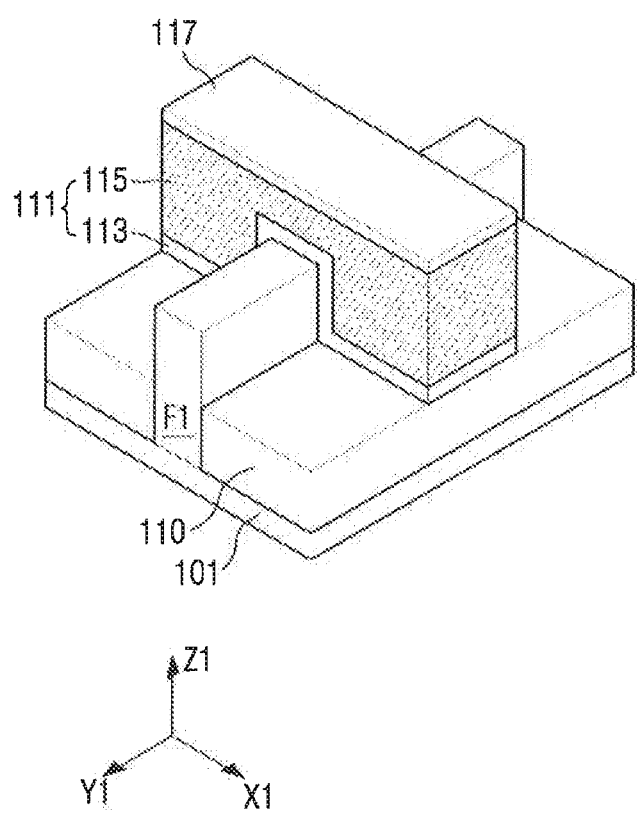
Figure 29:
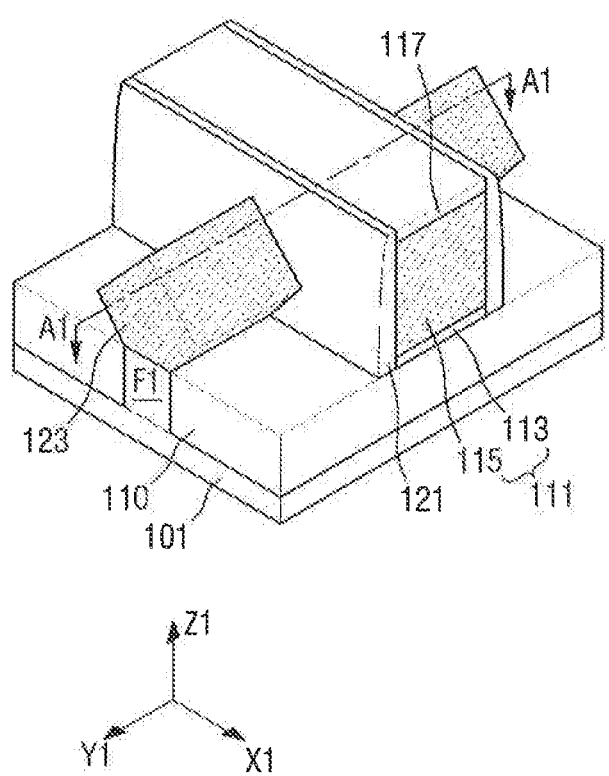
Figure 30:
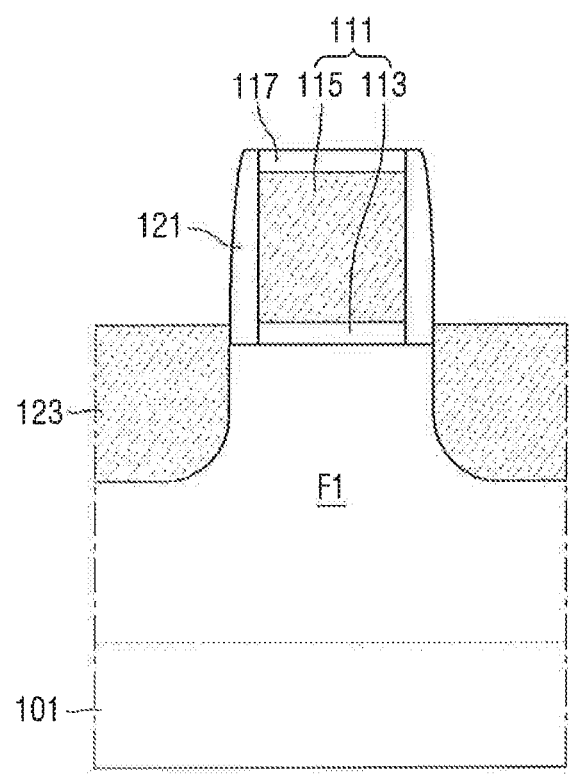
Figure 40:
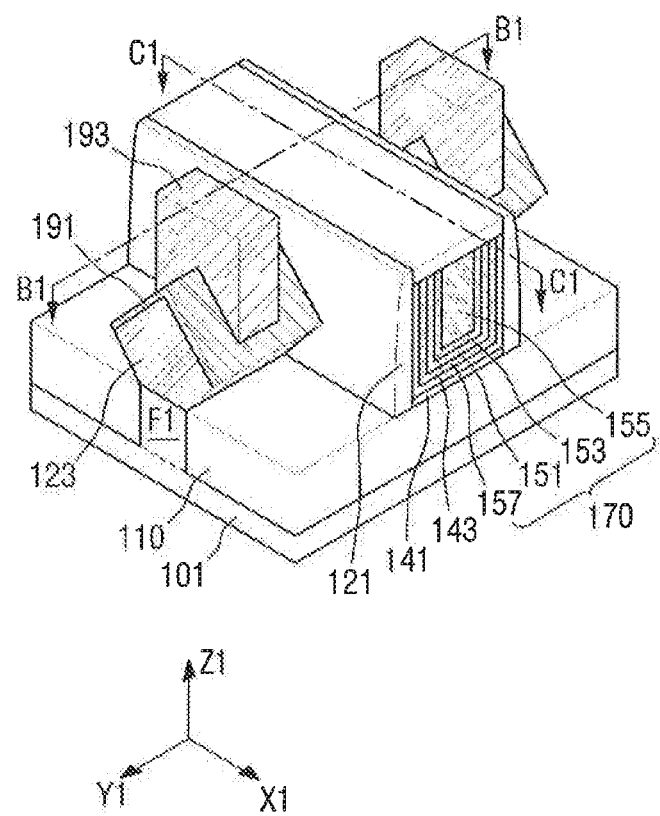
FIGS. 40 to 42 are perspective views and cross-sectional views illustrating a semiconductor device according to an exemplary embodiment of the present inventive concept.
Figure 41:
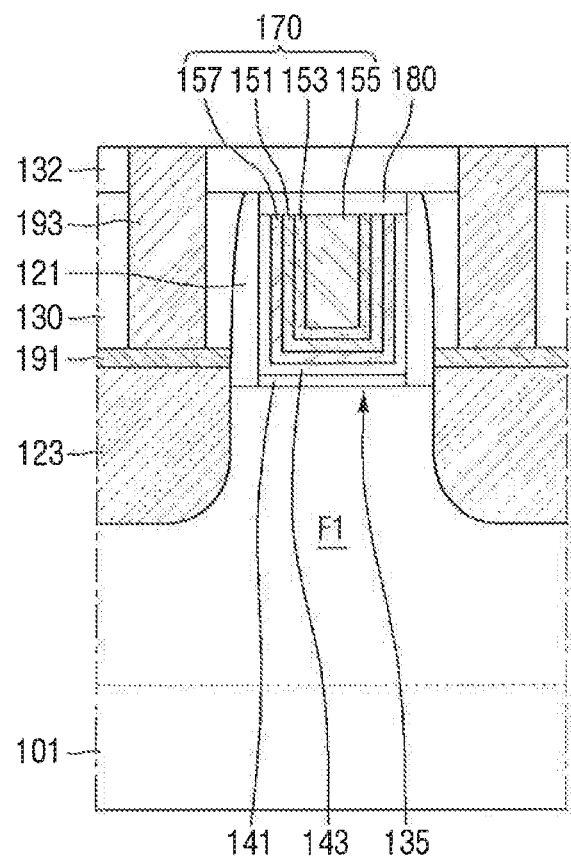
Figure 42:
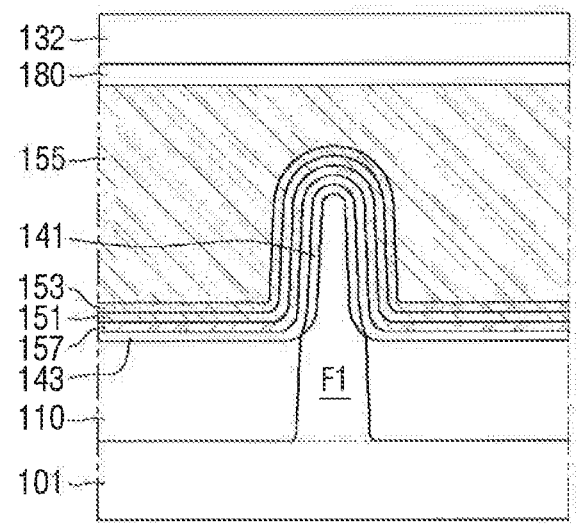

FIGS. 27 to 39 are views illustrating method of manufacturing a semiconductor device according to some exemplary embodiments of the present inventive concept. FIGS. 27 to 29 are perspective views, and FIGS. 30 to 39 are cross-sectional views. FIG. 30 is a cross-sectional view taken on line A1-A1 in FIG. 29. FIGS. 40 to 42 are perspective views and cross-sectional views illustrating a semiconductor device according to an exemplary embodiment of the present inventive concept. FIG. 41 is a cross-sectional view taken on line B1-B1 of FIG. 40, and FIG. 42 is a cross-sectional view taken on line C1-C1 of FIG. 40.

Referring first to FIG. 27, the first fin F1 may be formed on the substrate 101. The first fin F1 may protrude in a third direction Z1. The first fin F1 may elongate along the second direction Y1 which is a length direction, and may have a long side in the second direction Y1 and a short side in the first direction X1. However, exemplary embodiments of the present inventive concept are not limited thereto. For example, the long side direction may be the first direction X1 and the short side direction may be the second direction Y1.

The first fin F1 may be a part of the substrate 101, and may include an epitaxial layer grown from the substrate 101. For example, Si, or SiGe may be included in the substrate 101.

A field insulating film 110 may be formed on the substrate 101 and may substantially cover sidewalls of the first fin F1. The field insulating film 110 may include a material including at least one of a silicon oxide film, a silicon nitride film, or a silicon oxynitride film.

Referring to FIG. 28, an upper portion of the field insulating film 110 may be recessed to expose the upper portion of the first fin F1. The recess process may include a selective etch process.

A part of the first fin F1 protruding upward from the field insulating film 110 may be formed by an epitaxial process. For example, after formation of the field insulating film 110, instead of proceeding a recess process, a part of the first fin F1 may be formed by an epitaxial process that uses an upper surface of the first fin F1 exposed by the field insulating film 110 as a seed.

Further, doping for adjusting a threshold voltage may be performed on the exposed first fin F1. For example, the first fin F1 may be doped with boron (B) as an impurity and doped with phosphorus (P) or arsenic (As).

First dummy gate structures 111 intersecting the first fin F1 may be formed on the first fin F1. Although the first dummy gate structure 111 may intersect the first fin F1 in a vertical direction (e.g., in the first direction X1—see, e.g., FIG. 28), exemplary embodiments of the present inventive concept are not limited thereto. The first dummy gate structure 111 may intersect the first fin F1 by forming an acute angle and/or an obtuse angle with the first direction X1.

The first dummy gate structure 111 may include a dummy gate insulating film 113 and a dummy gate electrode 115. The dummy gate insulating film 113 and the dummy gate electrode 115 may be sequentially stacked.

The dummy gate insulating film 113 may be conformally formed on the upper portion of the sidewalls and the upper surface of the first fin F1 that is exposed (e.g., not covered by the field insulating film 110). Further, the dummy gate insulating film 113 may be disposed between the dummy gate electrode 115 and the field insulating film 110.

The dummy gate electrode 115 may be formed on the dummy gate insulating film 113.

For example, the dummy gate electrode 115 may include silicon oxide, and the dummy gate insulating film 113 may include polysilicon.

A dummy hard mask film 117 may be formed on the first dummy gate structure 111. The dummy hard mask film 117 may include at least one of silicon oxide, silicon nitride, or silicon oxynitride.

Referring to FIGS. 29 and 30, a spacer 121 may be formed on either sidewall of the first dummy gate structure 111. The spacer 121 may expose the upper surface of the hard mask film 117.

For example, the spacer 121 may include at least one of silicon nitride (SiN), silicon oxynitride (SiON), silicon oxide (SiO$_2$), silicon oxycarbonitride (SiOCN), or a combination thereof.

While the spacer 121 may be a single film, exemplary embodiments of the present inventive concept are not limited thereto. When the spacer 121 is a plurality of films, at least one film among the films included in the spacer 121 may include a low-k dielectric material such as silicon oxycarbonitride (SiOCN).

Further, when the spacer 121 is a plurality of films, at least one film among the films included in the spacer 121 may have an L-shape.

In some cases, the spacer 121 may serve as a guide for forming a self-aligned contact. Thus, the spacer 121 may include a material having an etch selectivity with respect to the first interlayer insulating film 130.

The exposed first fin F1, which is not covered by the first dummy gate structure ill, may be etched. The first fin F1 may be etched using the spacer 121 and the first dummy gate structure 111 as an etching mask.

A first source/drain region 123 may be formed in the etched portion of the first fin F1. The first source/drain region 123 may be formed in the first fin F1. The first source/drain region 123 may be an elevated source/drain region. Thus, the upper surface of the first source/drain region 123 may be higher than the upper surface of the first fin F1 (see, e.g., FIG. 30).

The first source/drain region 123 may include a tensile stress material. The first source/drain region 123 may include a same material as the substrate 101 (e.g., a tensile stress material). For example, when the substrate 101 is Si, the first source/drain region 123 may be Si, or another material (e.g., SiC, or SiP) that has a lower lattice constant than Si.

The first source/drain region 123 may include a compressive stress material. For example, the compressive stress material may be a material such as SiGe, which has a greater lattice constant than Si. The first source/drain region 123 may be formed by epitaxial growth.

Although the first source/drain region 123 may have a pentagonal shape (see, e.g., FIG. 29), exemplary embodiments of the present inventive concept are not limited thereto. For example, the first source/drain region 123 may have a shape such as a quadrangle, a circle, or a hexagon.

Figure 31:
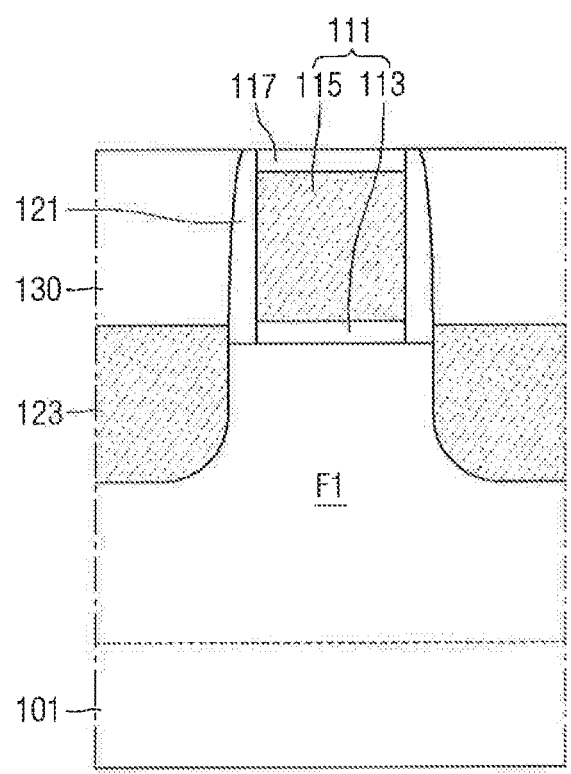

Referring to FIG. 31, a first interlayer insulating film 130 may be formed on and may substantially cover the first source/drain region 123. The interlayer insulating film 130 may substantially cover the sidewalls of the first spacer 121, and may expose the upper surface of the hard mask film 117. The first interlayer insulating film 130 may include silicon oxide, for example.

Figure 32:
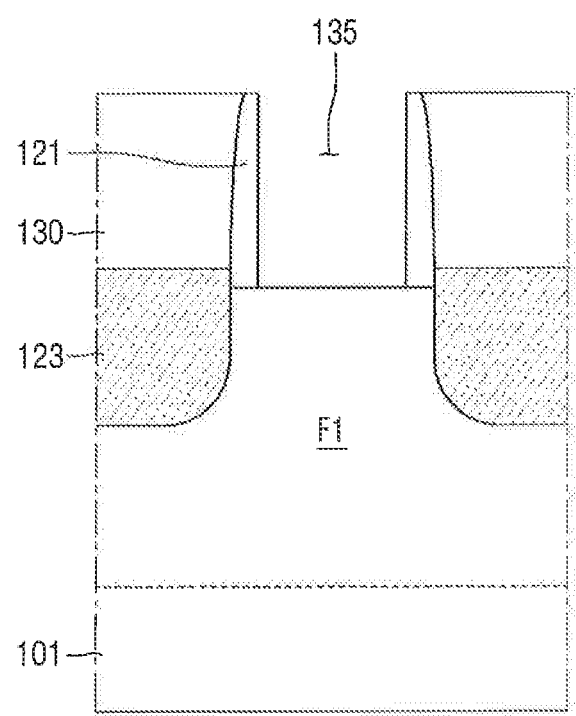

Referring to FIG. 32, a first trench 135 exposing the upper portion of the first fin F1 may be formed. The dummy hard mask film 117 may be removed. The dummy hard mask film 117 may be removed through a planarization process, and when the planarization process is performed, the first interlayer insulating film 130 may also be partially etched.

The first dummy gate structure 111 may be removed. The dummy gate electrode 115 and the dummy gate insulating film 113 may be removed to expose the first fin F1. The first trench 135 may be formed at a location where the first dummy gate structure 111 was present. The sidewalls of the spacer 121 may be exposed by the first trench 135.

Figure 33:
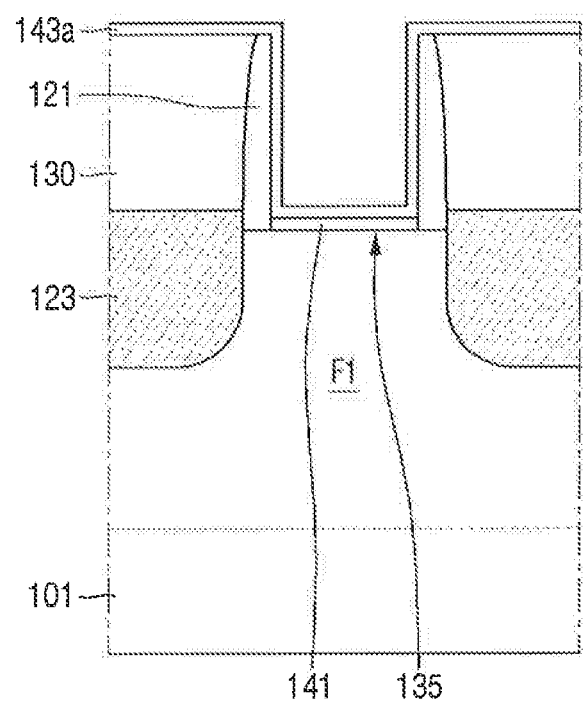

Referring to FIG. 33, a first interface film 141 may be formed in the first trench 135. The first interface film 141 may be formed along the upper portion of the sidewalls and the upper surface of the first fin F1.

The first interface film 141 may be formed by oxidizing the exposed first fin F1 in the first trench 135, but exemplary embodiments of the present inventive concept are not limited thereto. The first interface film 141 may be formed along the bottom surface of the first trench 135. The first interface film 141 may increase a bonding strength between the first fin F1 and the first dielectric film 143a. The first interface film 141 may include a low dielectric material layer having a dielectric constant (k) of about 9 or lower, such as a silicon oxide film (e.g., k is about 4) or a silicon oxynitride film (e.g., k is from about 4 to about 8 depending on content of oxygen atoms and nitrogen atoms). Alternatively, the first interface film 141 may include a silicate, or a combination of the films described above.

A first dielectric film 143a may be formed in the first trench 135. As an example, the first dielectric film 143a may be formed conformally along the sidewalls and the bottom surface of the first trench 135, and may be formed conformally along the field insulating film 110 and the upper portion of the sidewalls and the upper surface of the first fin F1. Further, the first dielectric film 143a may also be formed on the first interlayer insulating film 130.

The first dielectric film 143a may include a high-k dielectric material having a higher dielectric constant than silicon oxide film. For example, the first dielectric film 143a may include materials selected from HfSiON, $HfO_2$, $ZrO_2$, $Ta_2O_5$, $TiO_2$, $SrTiO_3$, or $(Ba,Sr)TiO_3$. Such first dielectric film 143a may be formed to a desired thickness depending on a type of the device to be formed.

Figure 34:
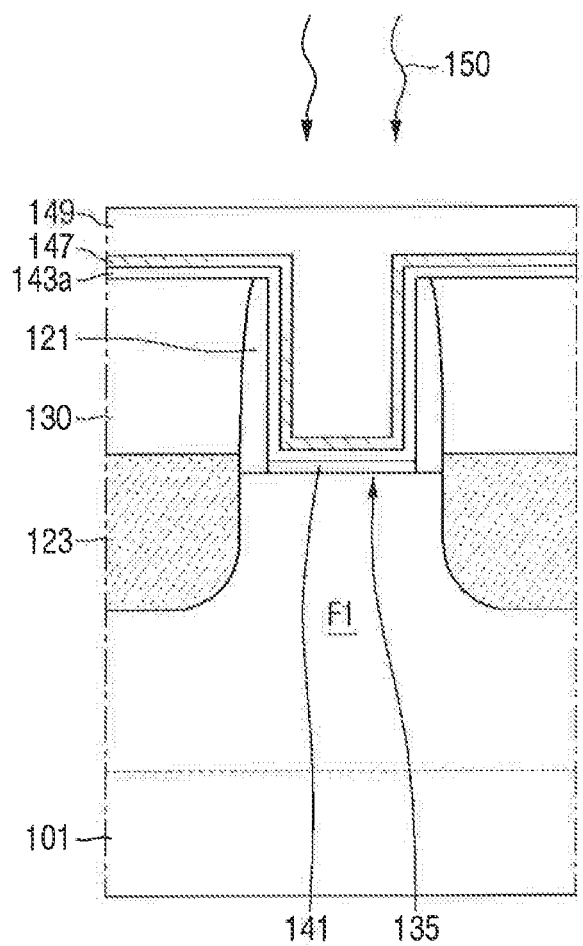

Referring to FIG. 34, a first diffusion film 147 and a first blocking film 149 may be sequentially formed. A first diffusion film 147 may be formed in the first trench 135. The first diffusion film 147 may be conformally formed along the sidewalls and the bottom surface of the first trench 135. Further, it may be formed along the upper portion of the sidewalls and upper surface of the first fin F1. For example, the first diffusion film 147 may include, but are not limited to, TiN.

A first blocking film 149 may be formed on the first diffusion film 147. The first blocking film 149 may substantially fill the first trench 135, may substantially cover the first diffusion film 147 and may prevent the first diffusion film 147 from being exposed to the outside. The first blocking film 149 may include Si, for example.

Annealing 150 may be performed. The first dielectric film 143a may include oxygen atoms. The oxygen atoms may be bonded to other materials (e.g., Hf, Zr, Ta, or Ti) in the first dielectric film 143a, but some may have broken bonds. If the bonding is broken, a leakage current may be generated and the performance of the transistor may be degraded. Annealing 150 may be performed to bond oxygen atoms to the broken bond portion. When the annealing 150 is performed, oxygen atoms included in the first diffusion film 147 may be supplied to the first dielectric film 143a.

When the first diffusion film 147 is exposed during the annealing 150, the external oxygen atoms may penetrate into the first diffusion film 147 during the annealing 150, and the number of oxygen atoms moving to the bottom of the first diffusion film 147 may increase. When the oxygen atoms are supplied in excess of the number of oxygen atoms bonding to materials included in the first dielectric film 143a, an excess of oxygen atoms may react with the first fin F1 in the first trench 135. Thus, the thickness of the first interface film 141 may increase and the performance of the transistor may be degraded. Thus, the first blocking film 149 may be formed on the first diffusion film 147 to block the first diffusion film 147 from the outside during the annealing 150, and thus the amount of oxygen atoms supplied may be controlled.

The annealing 150 may be performed at a temperature of from about 500° C. to about 1500° C.

The thickness of the first diffusion film 147 may vary depending on the number of oxygen atoms supplied.

Figure 35:
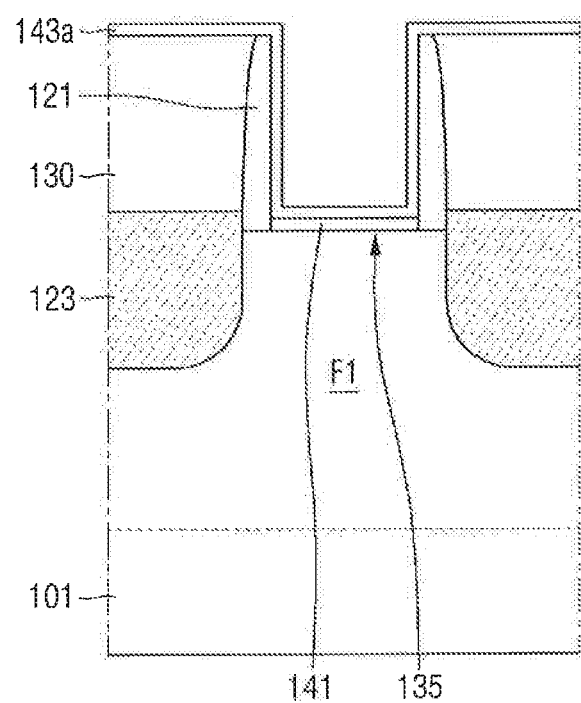

Referring to FIG. 35, the first blocking film 149 and the first diffusion film 147 may be sequentially removed. Thus, the first dielectric film 143a may be exposed again.

Figure 36:
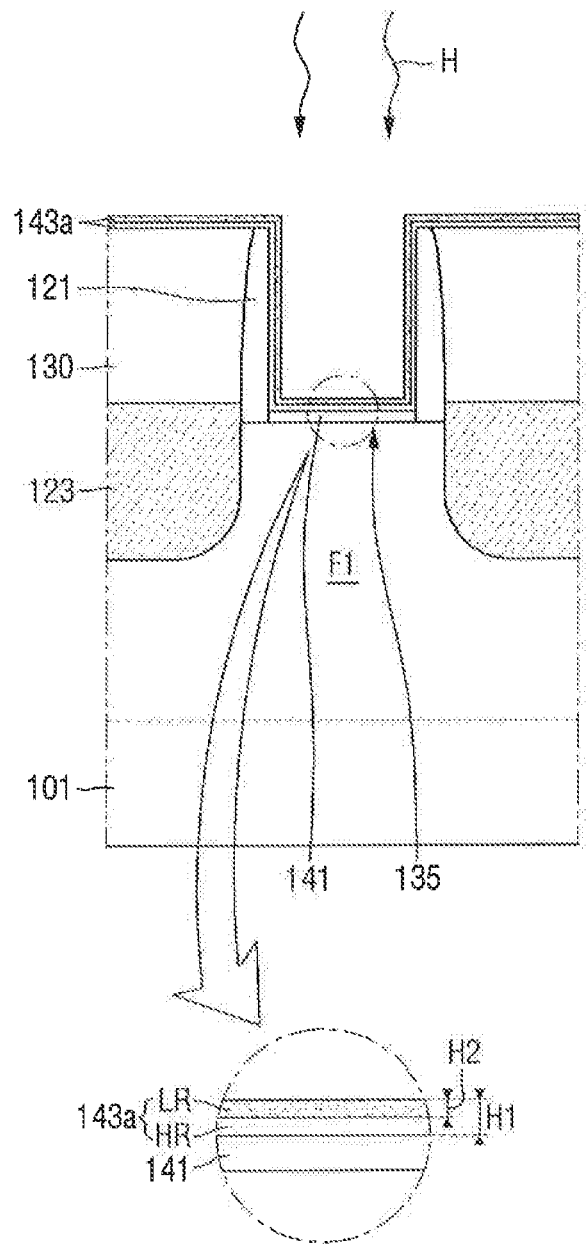

Referring to FIG. 36, a baking process (H) may be performed. Thus, the first dielectric film 143a may include a first porosity region HR and a second porosity region LR. The porosity of the second porosity region LR may be higher than that of the first porosity region HR. The porosity of the first porosity region HR and the second porosity region LR may be formed through oxygen vacancies formed by removal of oxygen contained in the first dielectric film 143a.

As an example, in an exemplary embodiment of the present inventive concept, oxygen included in the material of the surface of the first dielectric film 143a may be removed through the heat applied during the baking process (H) to form an oxygen vacancy, and such a region may have a relatively high porosity as compared with the region in contact with the spacer 121 of the first dielectric film 143a and the first interface film 141. Thus, a region having a relatively high porosity may be referred to herein as a second porosity region LR, and a region having a relatively low porosity may be referred to herein as a first porosity region HR. Although the first porosity region HR and the second porosity region LR may have a relatively clear boundary, exemplary embodiments of the present inventive concept are not limited thereto. The porosity of the second porosity region LR may vary continuously. That is, the porosity of the second porosity region LR may be progressively decreased within the second porosity region LR in a direction from the upper surface of the first dielectric film 143a to the first interface film 141.

The area adjacent to the first interface 141 or the first spacer 121 in the first dielectric film 143a may have the same porosity before and after the baking process (H) as compared with the surface of the first dielectric film 143a. Thus, in an exemplary embodiment of the present inventive concept, a region having the same porosity before and after the baking process (H) in the first dielectric film 143a may be referred to as a first porosity region HR, and a region where the porosity has changed before and after the baking process (H) may be referred to as a second porosity region LR.

The thickness H2 of the second porosity region LR may be less than half of the thickness H1 of the first dielectric film 143a. As an example, the thickness H2 of the second porosity region LR may be thinner than the thickness H1-H2 of the first porosity region HR. However, exemplary embodiments of the present inventive concept are not limited thereto, and the thicknesses of the first and second porosity regions LR and HR may be variously changed, as desired.

In an exemplary embodiment of the present inventive concept, since the oxygen porosity in the second porosity region LR of the first dielectric film 143a changes before and after the baking process (H), the threshold voltage of the semiconductor device may be adjusted.

Figure 37:
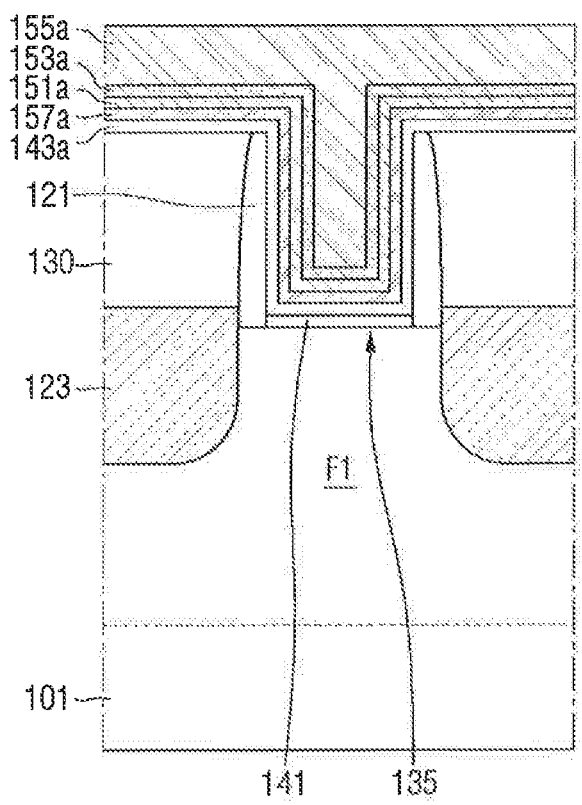

Referring to FIG. 37, a first TiN film 157a may be formed on the first dielectric film 143a. The first TiN film 157a may include TiN. The first TiN film 157a may be conformally formed along the sidewalls and the bottom surface of the first trench 135. A first TiAlC 151a is formed on the first TiN film 157a. The first TiAlC film 151a may include TiAlC, for example. The first TiAlC film 151a may be conformally formed along the sidewalls and the bottom surface of the first trench 135. A first barrier film 153a is formed on the first TiAlC 151a. The first barrier film 153a may be formed along the sidewalls and the bottom surface of the first trench 135. The first barrier film 153a may be formed conformally along the upper portion of the sidewalls and upper surface of the first fin F1, respectively. The first barrier film 153a may include TiN, for example.

A first metal film 155a may be formed on the first barrier film 153a. The first metal film 155a may substantially fill the remaining portion of the first trench 135. The first metal film 155a may include Al or W, for example.

Figure 38:
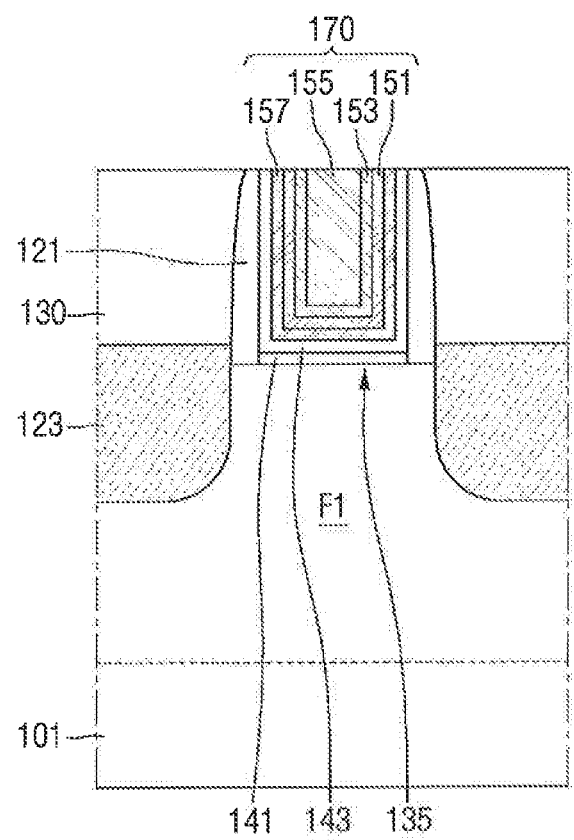

Referring to FIG. 38, the first gate stack 170 may be formed. In the resultant form, when the planarization process is performed to expose the first interlayer insulating film 130, a first gate stack 170 including the first interface film 141, the first dielectric film 143, the first TiN film 157, the first TiAlC 151, the first barrier film 153, and the first metal film 155 may be formed. The first dielectric film 143, the first TiN film 157, the first TiAlC 151, and the first barrier film 153 may have a concave shape in the first trench 135.

Figure 39:
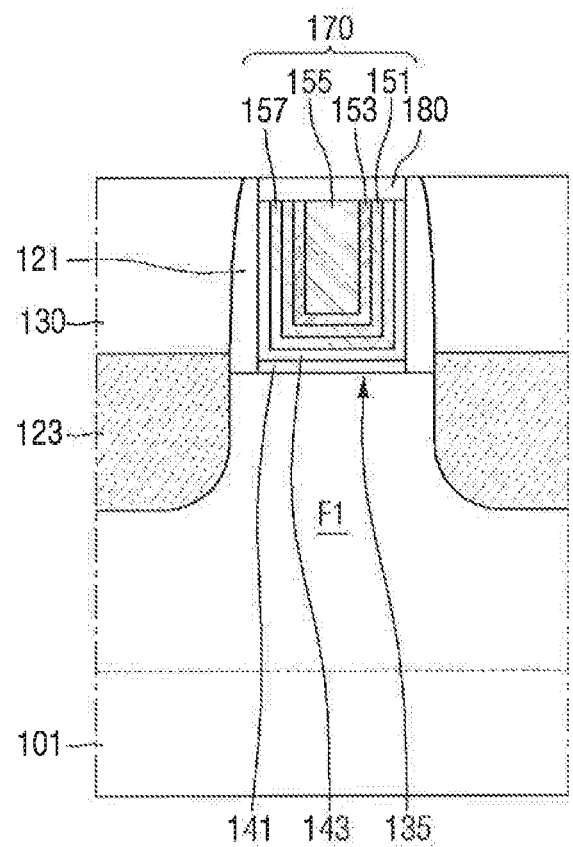

Referring to FIG. 39, a first capping film 180 may be formed on the first gate stack 170. As an example, a first capping film 180 may be formed on the first gate stack 170 and may substantially cover the first trench 135. The first capping film 180 may include a nitride (e.g., at least one of SiN, SiON, or SiCON) or an oxide. The first capping film 180 may block the first gate stacks 170 from being exposed to the outside to prevent a change in performance of the first gate stack 170. For example, oxygen atoms may penetrate into the first gate stack 170, where the threshold voltage of the first gate stack 170 may be changed. Thus, the first capping film 180 may be formed to keep the threshold voltages of the first gate stack 170 substantially constant. The thickness of the first capping film 180 may range from about 5 Å to about 500 Å.

A part of the first gate stack 170 may be removed to adjust a height of the first gate stack 170 prior to forming the first capping film 180. Thus, the first dielectric film 143, the first TiN film 157, the first TiAlC 151, the first barrier film 153, and the first metal film 155 may be partially removed from the first trench 135. In this case, the sidewalls of the first capping film 180 may be in direct contact with the sidewalls of the first spacer 121. Further, the upper surface of the first capping film 180 may be disposed on the same plane as the first interlayer insulating film 130. The height of the first gate stack 170 may be adjusted to adjust the threshold voltage of the first gate stack 170.

Referring to FIGS. 40 to 42, a second interlayer insulating film 132 may be formed on the first interlayer insulating film 130. The second interlayer insulating film 132 may substantially cover the first capping film 180. The second interlayer insulating film 132 may include a same material as the first interlayer insulating film 130, and may include, for example, silicon oxide.

First silicide film 191 may be formed on the first source/drain region 123, and the first contacts 193 penetrating the first interlayer insulating film 130 and the second interlayer insulating films 132 may be formed on the first source/drain region 123 to form the semiconductor device according to an exemplary embodiment of the present inventive concept. The first silicide film 191 may reduce the surface resistance and the contact resistance on of the first source/drain region 123, and may include, for example, Pt, Ni, or Co. The first contact 193 may include, for example, W, Al, or Cu.

With reference to FIGS. 43 to 49, a method for manufacturing a semiconductor device according to some exemplary embodiments of the present inventive concept and a semiconductor device formed by the method will be described in more detail.

Figure 47:
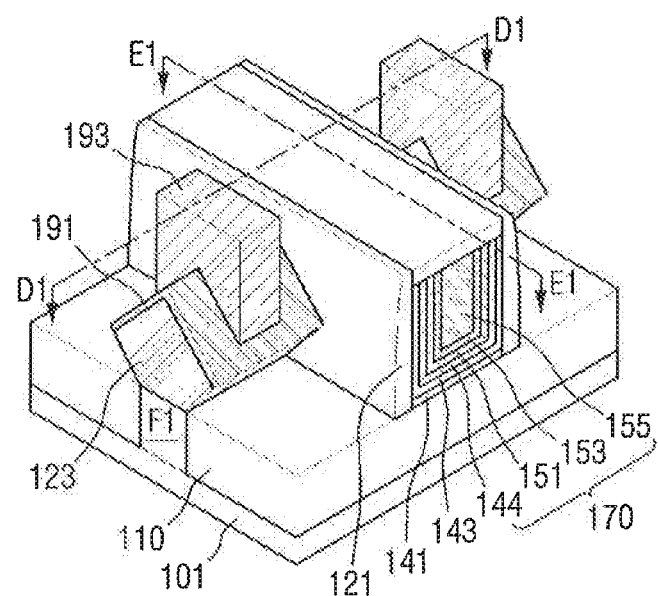
FIGS. 47 to 49 are perspective views and cross-sectional views illustrating a semiconductor device according to an exemplary embodiment of the present inventive concept.
Figure 48:
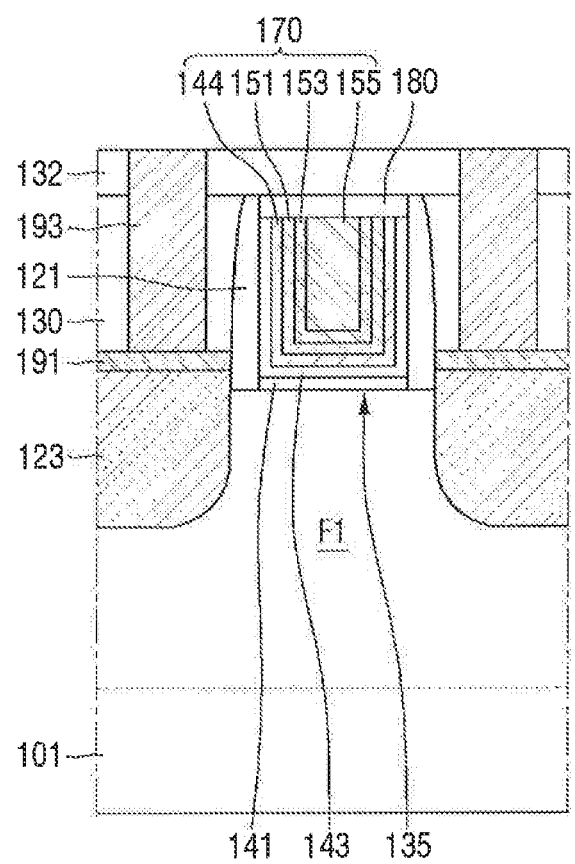
Figure 49:
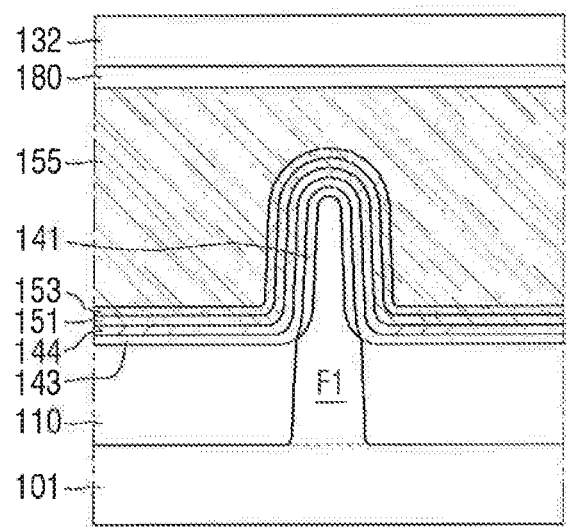

FIGS. 43 to 46 are views illustrating method of manufacturing a semiconductor device according to some exemplary embodiments of the present inventive concept. FIGS. 43 to 46 are cross-sectional views. FIGS. 47 to 49 are perspective views and cross-sectional views illustrating a semiconductor device according to an exemplary embodiment of the present inventive concept. FIG. 47 is a perspective view provided to explain the semiconductor device. FIG. 48 is a cross-sectional view taken on line D1-D1 in FIG. 47, and FIG. 49 is a cross-sectional view taken on line E1-E1 in FIG. 47.

The semiconductor device according to an exemplary embodiment of the present inventive concept described with reference to FIGS. 43 to 49 may be substantially the same as the semiconductor device described with reference to FIGS. 27 to 42, except that it includes an oxide layer instead of the conductive film. Thus, duplicative descriptions may be omitted. The semiconductor device according to an exemplary embodiment of the present inventive concept described with reference to FIGS. 43 to 49 may be a detailed embodiment of the semiconductor device described with reference to the first region I of FIGS. 22 to 24; however, exemplary embodiments of the present inventive concept are not limited thereto.

Figure 43:
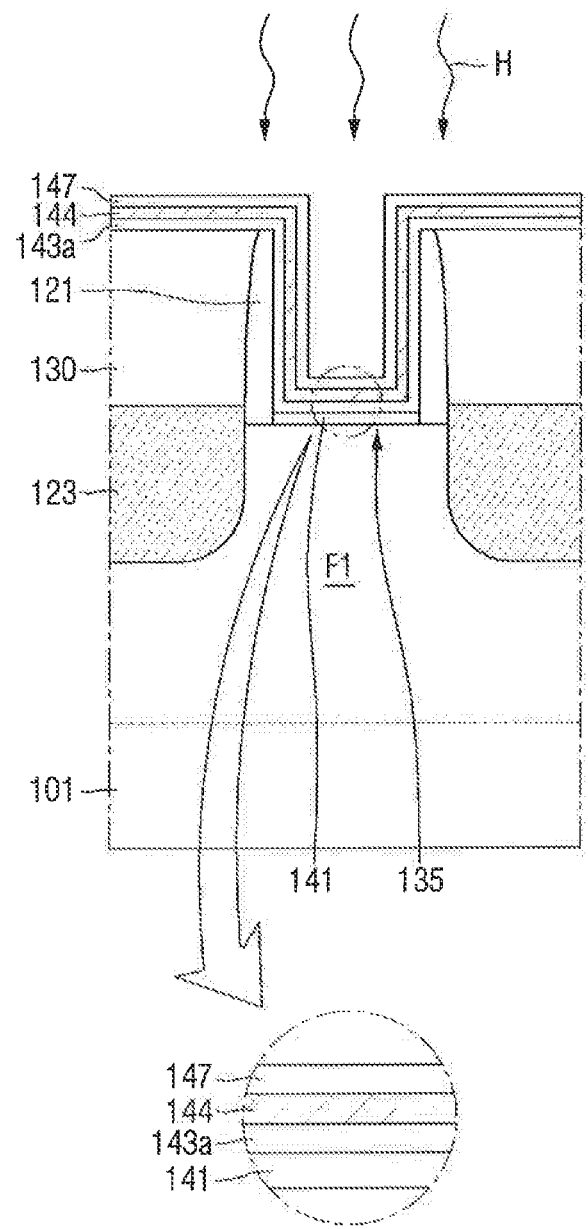
FIGS. 43 to 46 are views illustrating method of manufacturing a semiconductor device according to some exemplary embodiments of the present inventive concept.

The intermediate step in FIG. 43 may be the next step to the intermediate step in FIG. 34 according to an exemplary embodiment of the present inventive concept. Referring to FIG. 43, after the annealing 150 is performed, the first blocking film 149 may be removed to expose the first diffusion film 147. The baking process (H) may be performed on the exposed first diffusion film 147.

When the baking process (H) is performed on the first diffusion film 147, an oxide layer 144 may be formed between the first diffusion film 147 and the first dielectric film 143a. Although the first diffusion film 147, the first dielectric film 143a, and the oxide layer 144 may have similar thicknesses, exemplary embodiments of the present inventive concept are not limited thereto. Each of the thicknesses of the first diffusion film 147, the first dielectric film 143a, and the oxide layer 144 may be controlled differently through the time and temperature of performing the baking process (H).

In the baking process (H), the oxygen atoms included in the first dielectric film 143a might not escape to the outside due to the first diffusion film 147. Thus, an oxide layer 144 may be formed between the first diffusion film 147 and the first dielectric film 143a. The oxide layer 144 may include an oxidized form of the material included in the first dielectric film 143a. In addition, the oxide layer 144 may include an oxidized form of the material included in the first diffusion film 147. However, exemplary embodiments of the present inventive concept are not limited thereto.

In an exemplary embodiment of the present inventive concept, since the oxide layer 144 is formed on the first dielectric film 143a, the threshold voltage of the transistor formed of the semiconductor device including the oxide layer 144 may be controlled.

Figure 44:
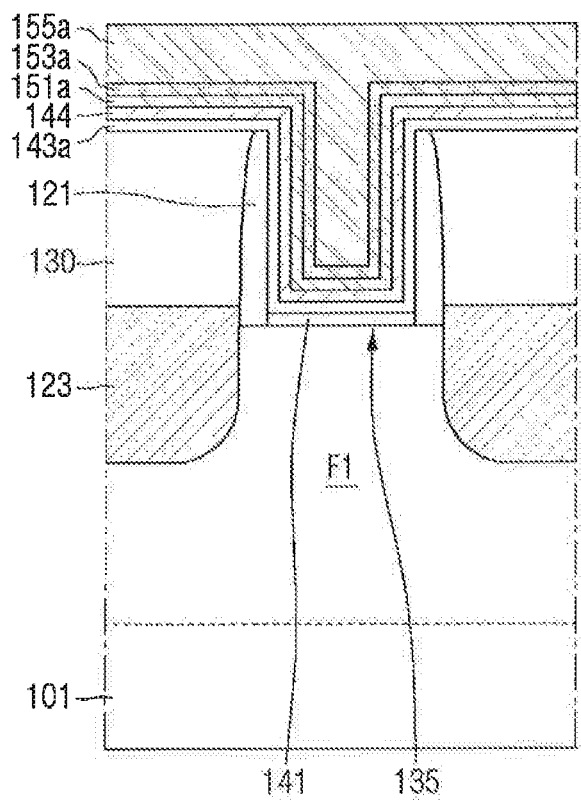

Referring to FIG. 44, an oxide layer 144 may be formed on the first dielectric film 143a. A first TiAlC 151a may be formed on the oxide layer 144. The first TiAlC 151a may include TiAlC, for example. The first TiAlC film 151a may be conformally formed along the sidewalls and the bottom surface of the first trench 135. A first barrier film 153a may be formed on the first TiAlC 151a. The first barrier film 153a may be formed along the sidewalls and the bottom surface of the first trench 135. The first barrier film 153a may be formed conformally along the upper portion of the sidewalls and upper surface of the first fin F1, respectively. The first barrier film 153a may include TiN, for example.

A first metal film 155a is formed on the first barrier film 153a. The first metal film 155a may fill the remaining portion of the first trench 135. The first metal film 155a may include Al, or W, for example.

Figure 45:
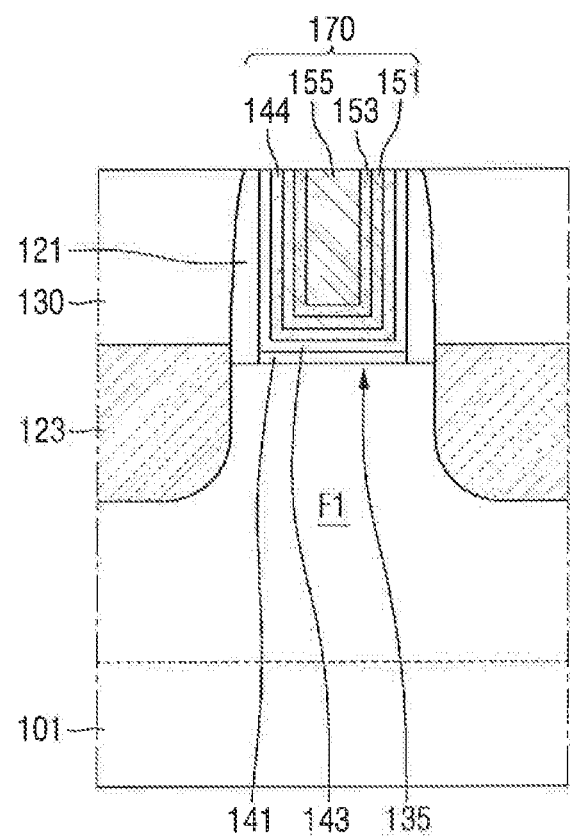

Referring to FIG. 45, the first gate stack 170 may be formed. In the resultant (see, e.g., FIG. 44), when the planarization process is performed to expose the first interlayer insulating film 130, a first gate stack 170 including the first interface film 141, the first dielectric film 143, the oxide layer 144, the first TiAlC 151, the first barrier film 153, and the first metal film 155 may be formed. The first dielectric film 143, the oxide layer 144, the first TiAlC 151, and the first barrier film 153 may have a concave shape in the first trench 135.

Figure 46:
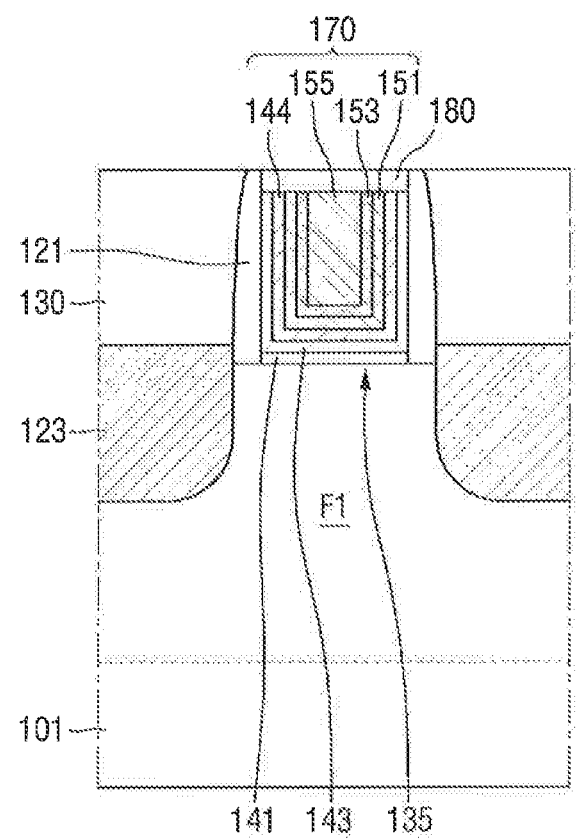

Referring to FIG. 46, a first capping film 180 may be formed on the first gate stack 170. As an example, a first capping film 180 may be formed on the first gate stack 170 and may substantially cover the first trench 135. The first capping film 180 may include a nitride (e.g., at least one of SiN, SiON, or SiCON) or an oxide. The first capping film 180 may block the first gate stacks 170 from being exposed to the outside to prevent a change in performance of the first gate stack 170.

A part of the first gate stack 170 may be removed to adjust a height of the first gate stack 170 prior to forming the first capping film 180. Thus, the first dielectric film 143, the oxide layer 144, the first TiAlC 151, the first barrier film 153, and the first metal film 155 may be partially removed. In this case, the sidewalls of the first capping film 180 may be in direct contact with the sidewalls of the first spacer 121. Further, the upper surface of the first capping film 180 may be disposed on the same plane as the first interlayer insulating film 130. The height of the first gate stack 170 may be adjusted to adjust the threshold voltage of the first gate stack 170.

Referring to FIGS. 47 to 49, a semiconductor device including an oxide layer 144 disposed between the first dielectric film 143 and the first TiAlC 151 may be formed.

In an exemplary embodiment of the present inventive concept, the oxide layer 144 may be formed between the first dielectric film 143 and the first diffusion film 147 through the baking process (H). Thus, the semiconductor device according to an exemplary embodiment of the present inventive concept may have a different threshold voltage as compared with the semiconductor device not including the oxide layer 144.

A semiconductor device according to some exemplary embodiments of the present inventive concept will be described in more detail below with reference to FIG. 50.

Figure 50:
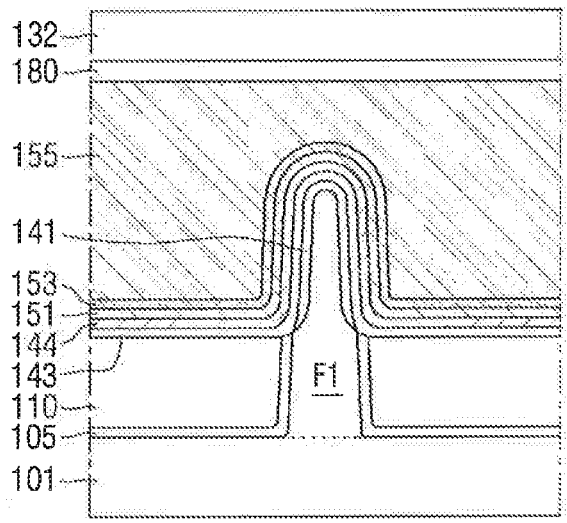
FIG. 50 is a cross-sectional view illustrating a semiconductor device according to an exemplary embodiment of the present inventive concept.

FIG. 50 is a cross-sectional view illustrating a semiconductor device according to an exemplary embodiment of the present inventive concept. The semiconductor device according an exemplary embodiment of the present inventive concept described below with reference to FIG. 50 is substantially the same as the semiconductor device described above with reference to FIG. 49, except that it further includes a second field insulating film between the finm and the field insulating film. Thus, duplicative descriptions may be omitted.

Referring to FIG. 50, a second field insulating film 105 may further be formed between the first fin F1 and the field insulating film 110. As an example, the second field insulating film 105 may substantially cover the upper surface of the substrate 101 and the sidewalls of the first fin F1. The second field insulating film 105 may be conformally formed along the upper surface of the substrate 101 and the sidewalls of the first fin F1.

With reference to FIGS. 3 to 10 and 51 to 62, a method for manufacturing a semiconductor device according to some exemplary embodiments of the present inventive concept and a semiconductor device formed by the method will be described in more detail.

Figure 60:
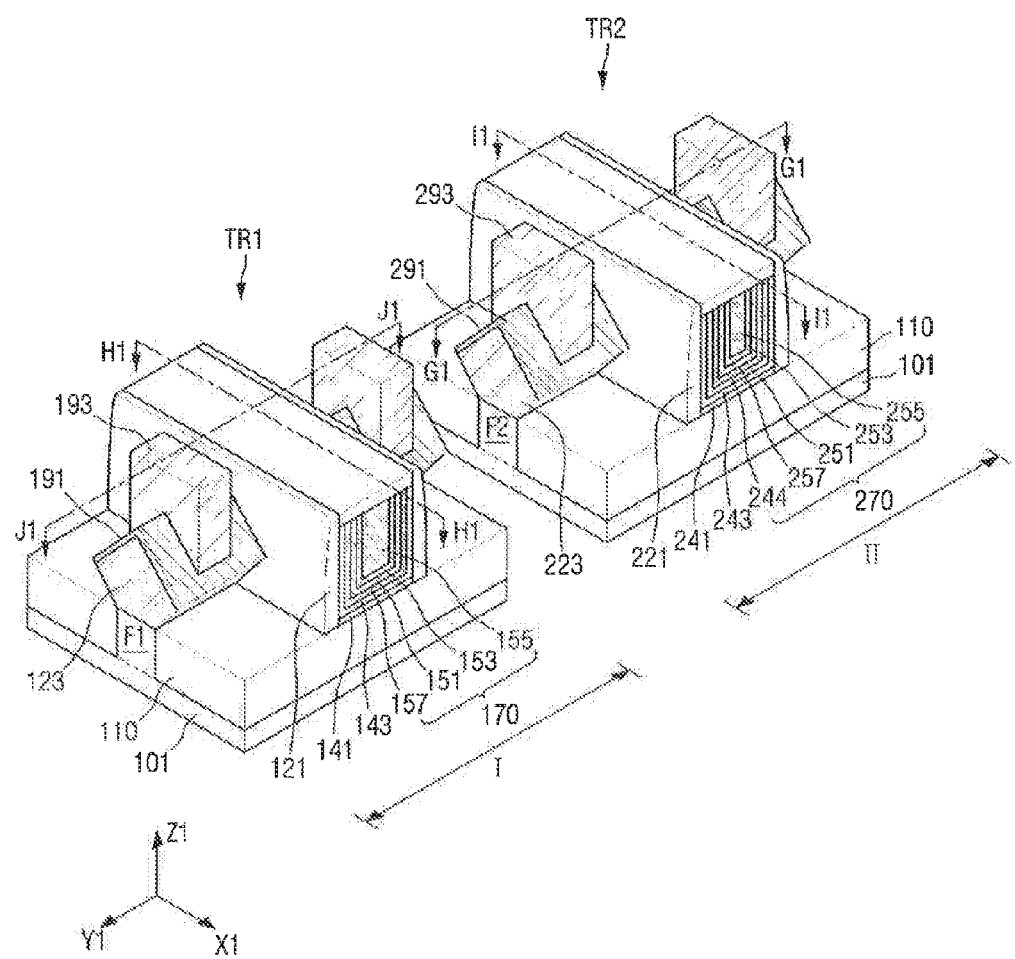
FIGS. 60 to 62 are perspective views and cross-sectional views illustrating a semiconductor device according to an exemplary embodiment of the present inventive concept.
Figure 61:
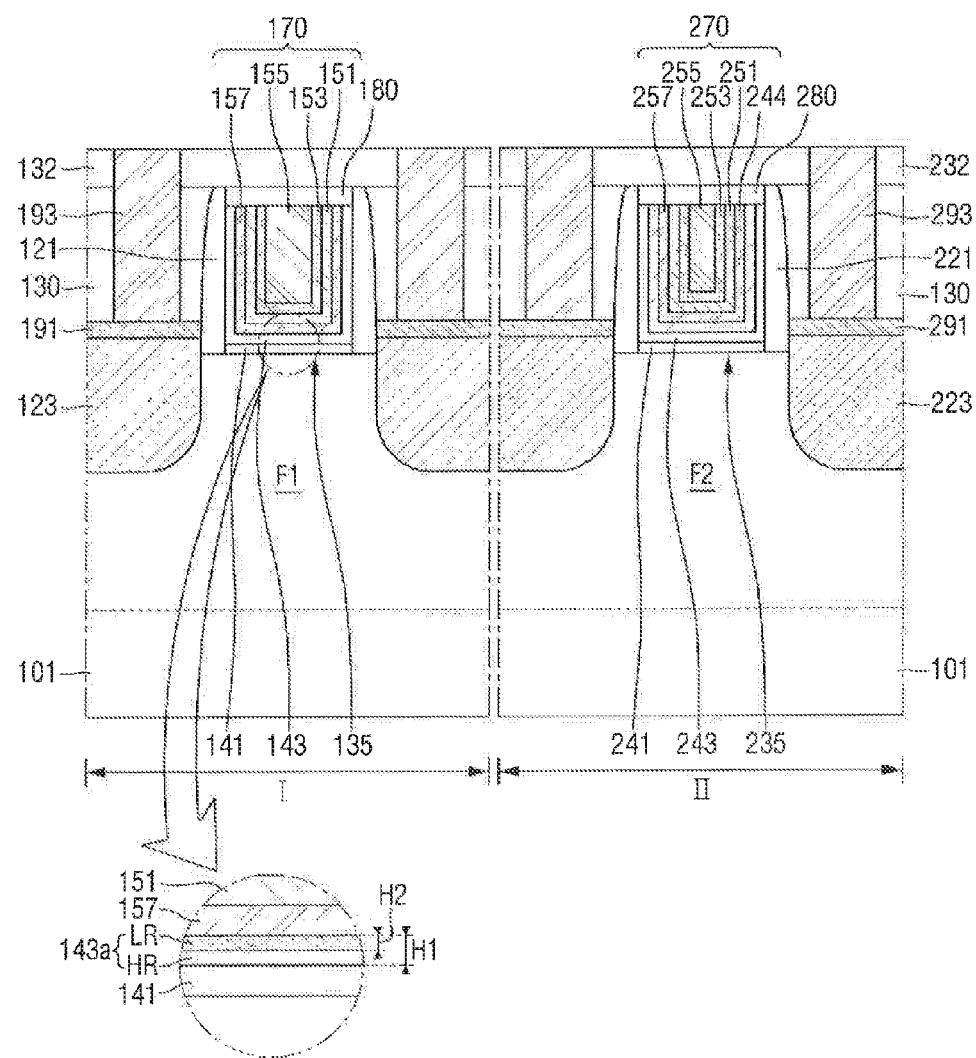
Figure 62:
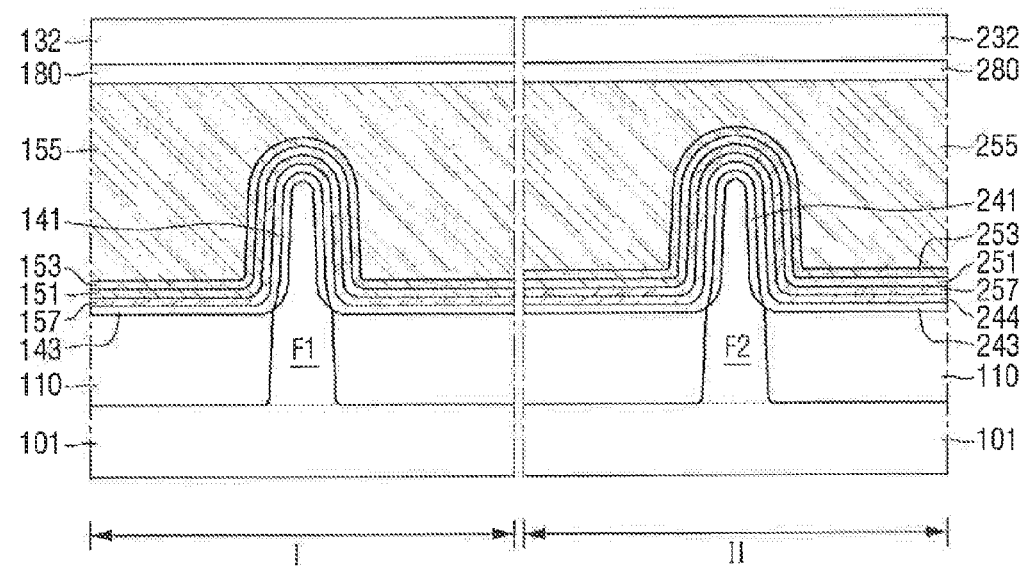

FIGS. 51 to 59 are views illustrating method of manufacturing a semiconductor device according to some exemplary embodiments of the present inventive concept. FIGS. 51 to 59 are cross-sectional views. FIGS. 60 to 62 are perspective views and cross-sectional views illustrating a semiconductor device according to an exemplary embodiment of the present inventive concept. FIG. 60 is perspective views, FIG. 61 is sectional views taken on lines J1-J1 and G1-G1 in FIG. 60, and FIG. 62 is sectional views taken on lines H1-H1 and I1-I1 in FIG. 60.

The method for fabricating the semiconductor device according to some exemplary embodiments of the present inventive concept may include substantially the same process as the processes described with reference to FIGS. 3 to 10 described above. Thus, FIG. 51 will now be described in more detail according to the description of FIGS. 3 and 10.

Figure 51:
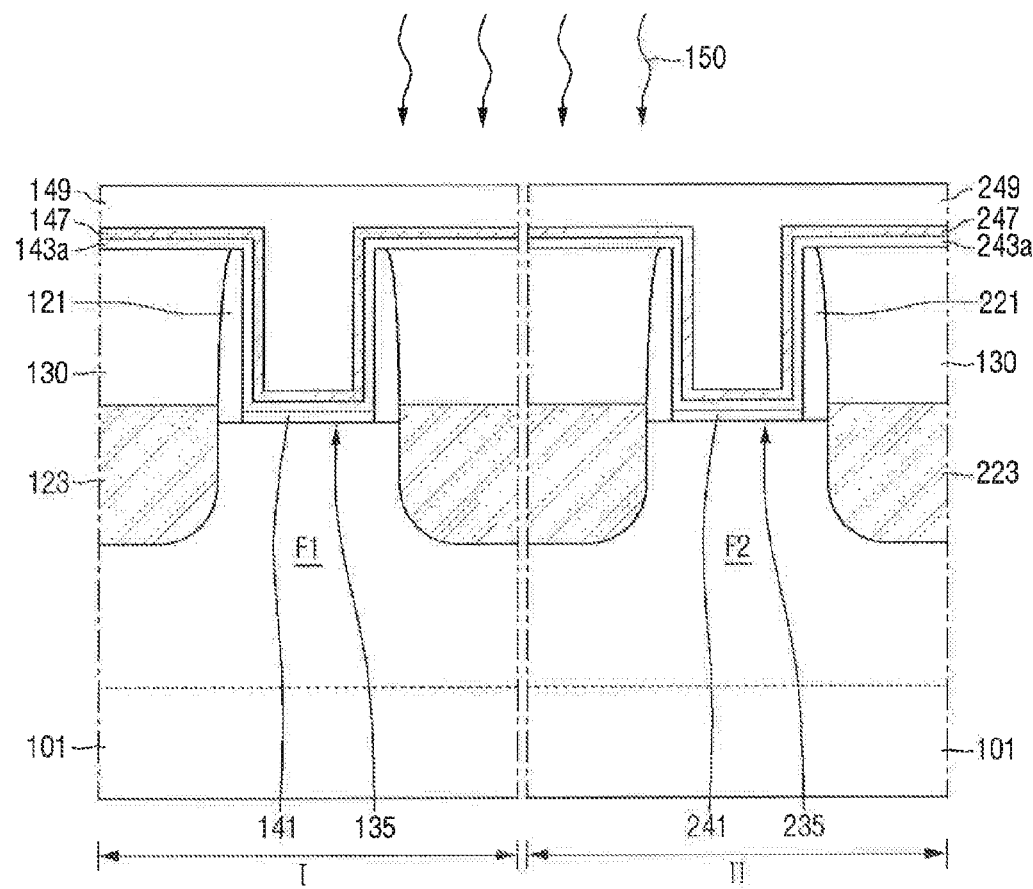
FIGS. 51 to 59 are views illustrating method of manufacturing a semiconductor device according to some exemplary embodiments of the present inventive concept.

Referring to FIG. 51, first and second diffusion films 147 and 247 and first and second blocking films 149 and 249 may be sequentially formed. A first blocking film 149 may be formed in the first trench 135, and a second blocking film 249 may be formed in the second trench 235. The first and second diffusion films 147 and 247 may be conformally formed along the sidewalls and bottom surfaces of the first and second trenches 135 and 235, respectively. Further, they may be formed along the upper portion of the sidewalls and upper surfaces of the first and second fins F1 and F2. For example, the first and second diffusion films 147 and 247 may include, but are not limited to, TiN.

Then, first and second blocking films 149 and 249 may be formed on the first and second diffusion films 147 and 247, respectively. The first and second blocking films 149 and 249 may substantially fill the first and second trenches 135 and 235, may substantially cover the first and second diffusion films 147 and 247, and may prevent the first and second diffusion films 147 and 247 from being exposed to the outside. The first and second blocking films 149 and 249 may include Si, for example.

Annealing 150 may then be performed. The first and second dielectric films 143a and 243a may include oxygen atoms. The oxygen atoms may be bonded to other materials (e.g., Hf, Zr, Ta, or Ti) in the first and second dielectric films 143a and 243a, but some may have broken bonds. If the bonding is broken, a leakage current may be generated and the performance of the transistor may be degraded. Annealing 150 may be performed to bond oxygen atoms to the broken bond portion, thus reducing an occurrence of a leakage current. When the annealing 150 is performed, oxygen atoms included in the first blocking film 149 may be supplied to the first dielectric film 143a. Further, the oxygen atoms included in the second blocking film 249 may be supplied to the second dielectric film 243a.

When the first and second diffusion films 147 and 247 are exposed during the annealing 150, the external oxygen atoms may penetrate into the first and second diffusion films 147 and 247 during the annealing 150, and the number of oxygen atoms moving to the bottom of the first and second diffusion films 147 and 247 may increase. When oxygen atoms are provided in excess of the number of oxygen atoms bonding to materials included in the first and second dielectric films 143a and 243a, an excess of oxygen atoms may react with the first and second fins F1 and F2 in the first and second trenches 135 and 235. Thus, the thickness of the first and second interface films 141 and 241 may increase and the performance of the transistor may be degraded. Thus, the first and second blocking films 149 and 249 may be formed on the first and second diffusion films 147 and 247 to block the first and second diffusion films 147 and 247 from the outside during the annealing 150, and thus the amount of oxygen atoms supplied may be controlled.

The annealing 150 may be performed at a temperature of from about 500° C. to about 1500° C.

The thickness of the first and second diffusion films 147 and 247 may vary depending on the number of oxygen atoms to be supplied.

Figure 52:
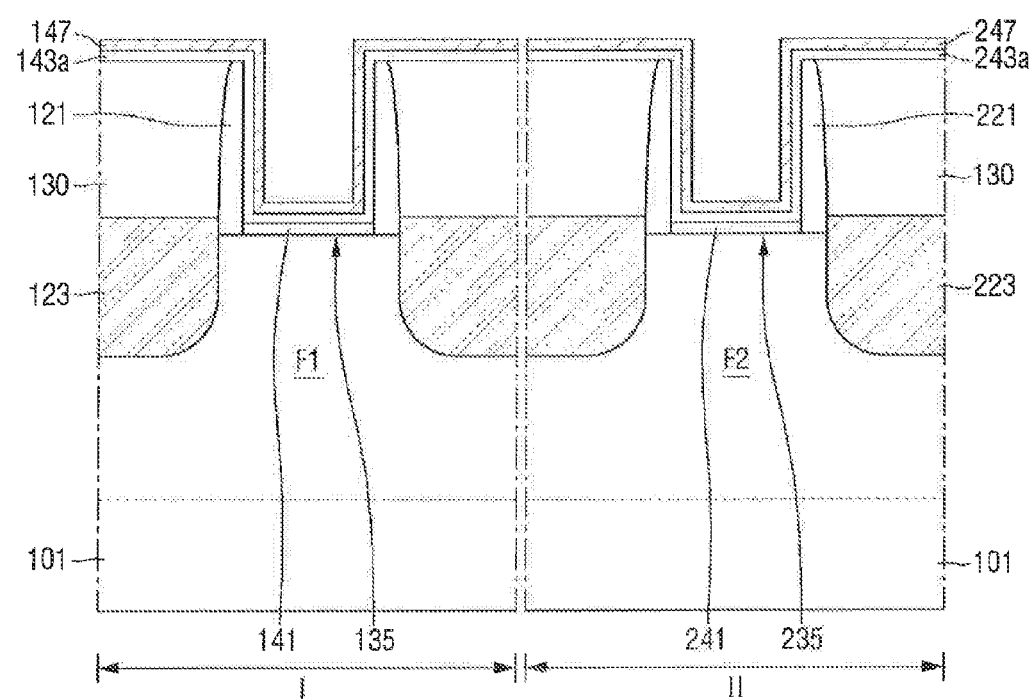

Referring to FIG. 52, the first and second blocking films 149 and 249 may be removed to expose the first and second diffusion films 147 and 247.

Figure 53:
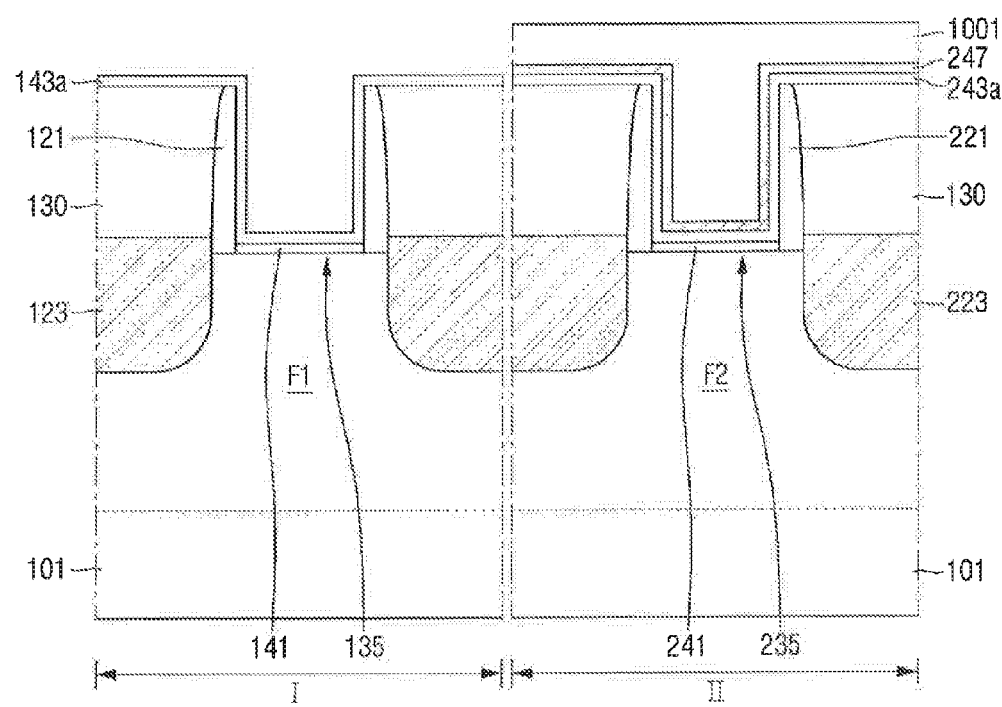

Referring to FIG. 53, a mask pattern 1001 substantially covering the second region II may be formed to remove a first diffusion film 147 disposed in the first region I. As an example, after formation of a mask layer covering the first and second regions I and II, the mask layer may be patterned by the mask pattern 1001 through a patterning process. Then, the exposed first diffusion film 147 may be removed by an etching process. Thus, the first dielectric film 143a may be exposed.

Figure 54:
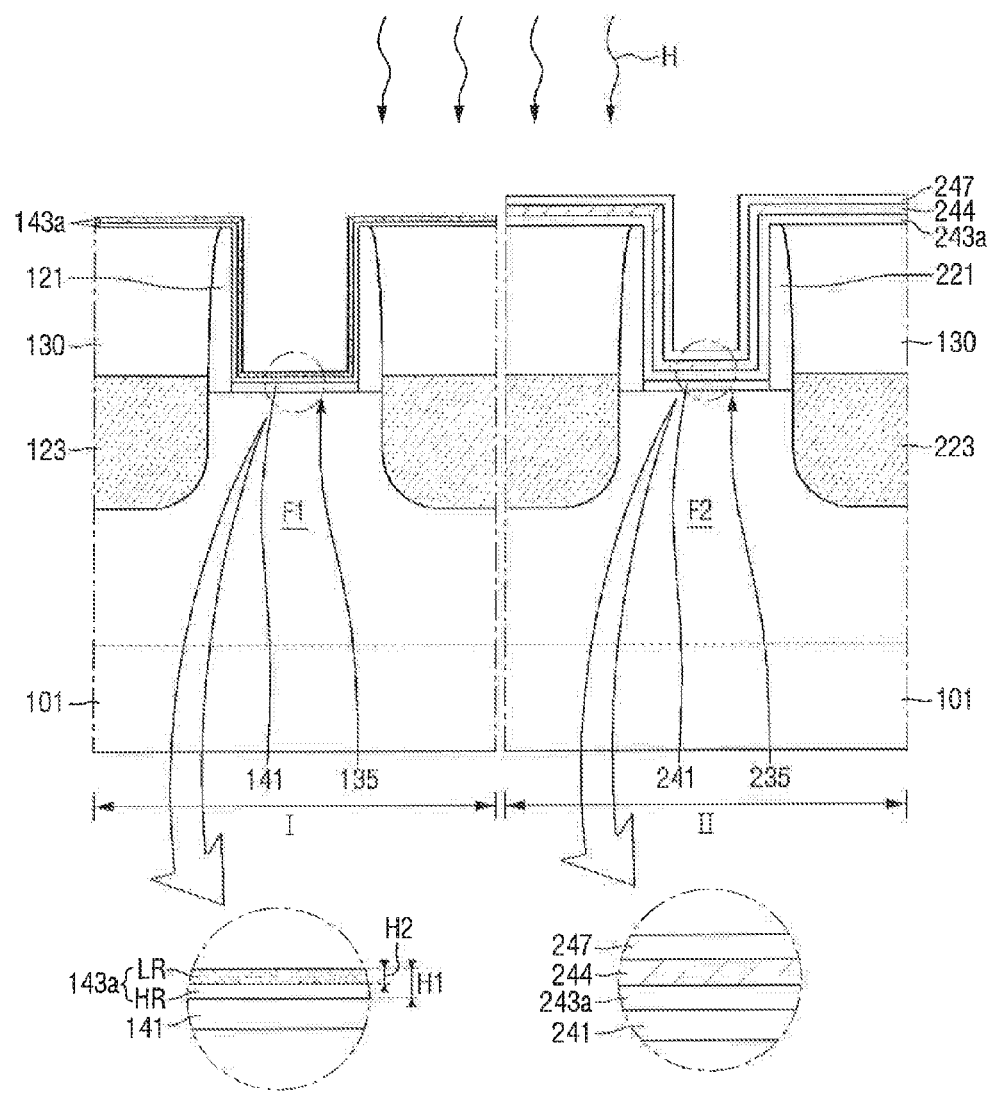

Referring to FIG. 54, the mask pattern 1001 disposed in the second region II may be removed, and the baking process (H) may be performed. Thus, a first porosity region HR and a second porosity region LR may be formed within the first dielectric film 143a disposed in the first region I. In the second region II, an oxide layer 244 may be formed between the second dielectric film 243a and the second diffusion film 247.

The porosity of the second porosity region LR may be higher than that of the first porosity region HR. The porosity of the first porosity region HR and the second porosity region LR may be formed through oxygen vacancies formed by removal of oxygen contained in the first dielectric film 143a.

As an example, in an exemplary embodiment of the present inventive concept, oxygen included in the material of the surface of the first dielectric film 143a may be removed through the heat applied during the baking process (H) to form an oxygen vacancy, and the region of the exposed surface of such dielectric film 143a may have a relatively high porosity as compared with the region in direct contact with the spacer 121 of the first dielectric film 143a and the first interface film 141. Thus, according to an exemplary embodiment of the present inventive concept, a region having a relatively high porosity may be referred to herein as a second porosity region LR, and a region having a relatively low porosity may be referred to herein as a first porosity region HR. Although the first porosity region HR and the second porosity region LR may have a relatively clear boundary exemplary embodiments of the present inventive concept are not limited thereto. The porosity of the second porosity region LR may vary continuously. That is, the porosity of the second porosity region LR may be progressively decreased in a direction from the upper surface of the first dielectric film 143a to the first interface film 141 within the second porosity region LR.

The area adjacent to the first interface 141 or the first spacer 121 in the first dielectric film 143a may have substantially the same porosity before and after the baking process (H) as compared with the surface of the first dielectric film 143a. Thus, in an exemplary embodiment of the present inventive concept, a region having the same porosity before and after the baking process (H) in the first dielectric film 143a may be referred to as a first porosity region HR, and a region where the porosity has changed before and after the baking process (H) may be referred to as a second porosity region LR.

The thickness H1 of the second porosity region LR may be less than half of the thickness H1 of the first dielectric film 143a. As an example, the thickness H2 of the second porosity region LR may be thinner than the thickness H1-H2 of the first porosity region HR. However, exemplary embodiments of the present inventive concept are not limited thereto, and the thicknesses of the first and second porosity regions LR and HR may be variously changed, as desired.

In an exemplary embodiment of the present inventive concept, since the oxygen porosity in the second porosity region LR of the first dielectric film 143a changes before and after the baking process (H), the threshold voltage of the semiconductor device disposed in the first region I may be adjusted.

When the baking process (H) is performed on the second diffusion film 247, an oxide layer 244 may be formed between the second diffusion film 247 and the second dielectric film 243a. Although the second diffusion film 247, the second dielectric film 243a, and the oxide layer 244 may have similar thicknesses, exemplary embodiments of the present inventive concept are not limited thereto. Each of the thicknesses of the second diffusion film 247, the second dielectric film 243a, and the oxide layer 244 may be controlled differently through the time and temperature of performing the baking process (H).

In the baking process (H), the oxygen atoms included in the second dielectric film 243a might not escape to the outside due to the second diffusion film 247. Thus, an oxide layer 244 may be formed between the second diffusion film 247 and the second dielectric film 243a. The oxide layer 244 may include an oxidized form of the material included in the second dielectric film 243a. In addition, the oxide layer 244 may include an oxidized form of the material included in the second diffusion film 247. However, exemplary embodiments of the present inventive concept are not limited thereto.

In an exemplary embodiment of the present inventive concept, since the oxide layer 244 may be formed on the second dielectric film 243a, the threshold voltage of the semiconductor device disposed in the second region II including the oxide layer 244 may be controlled.

As an example, in an exemplary embodiment of the present inventive concept, through the same baking process (H), the first dielectric film 143a having a relatively high porosity in the region including the surface may be formed in the first region I, and an oxide layer 244 may be formed between the second diffusion film 247 and the second dielectric film 243a in the second region II. Thus, the semiconductor device may control the threshold voltages of the transistors included in the first region I and the transistors included in the second region II differently from each other.

Figure 55:
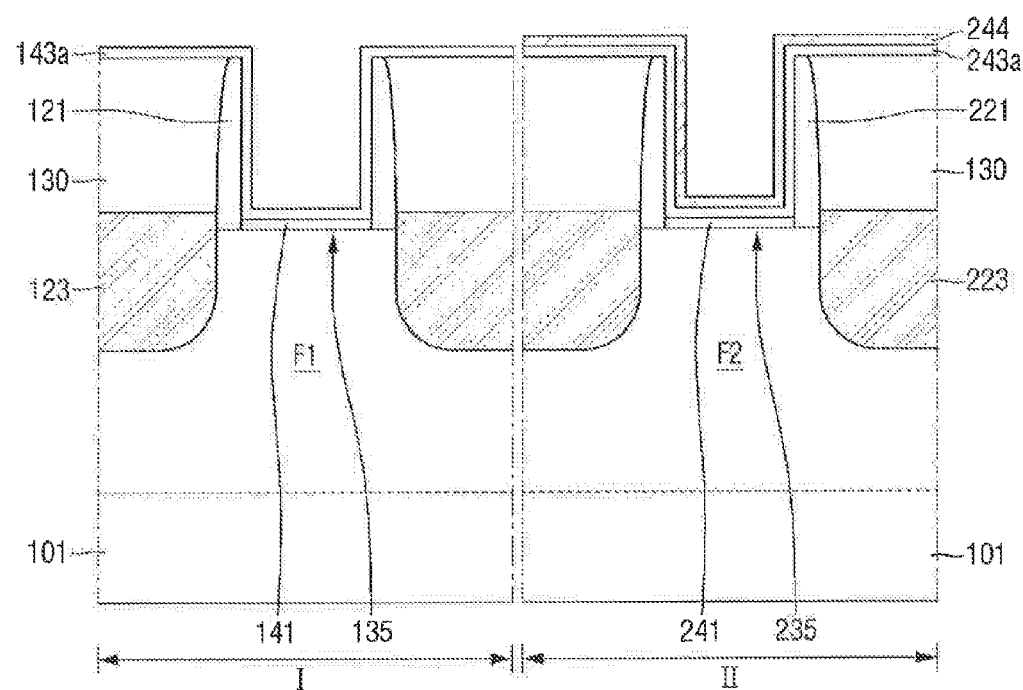

Referring to FIG. 55, the second diffusion film 247 disposed in the second region II may be removed. The second dielectric film 243a may be thinner than the first dielectric film 143a because a portion of the second dielectric film 243a changes into the oxide layer 144. Thus, the upper surfaces of the first dielectric film 143a and the second dielectric film 243a need not be disposed on the same plane. In an exemplary embodiment of the present inventive concept, the thickness including the oxide layer 244 and the second dielectric film 243a may be about twice the thickness of the first dielectric film 143a, but exemplary embodiments of the present inventive concept are not limited thereto. Thus, the thickness including the oxide layer 244 and the second dielectric film 243a may be about 1.1 times or less the thickness of the first dielectric film 143a.

Figure 56:
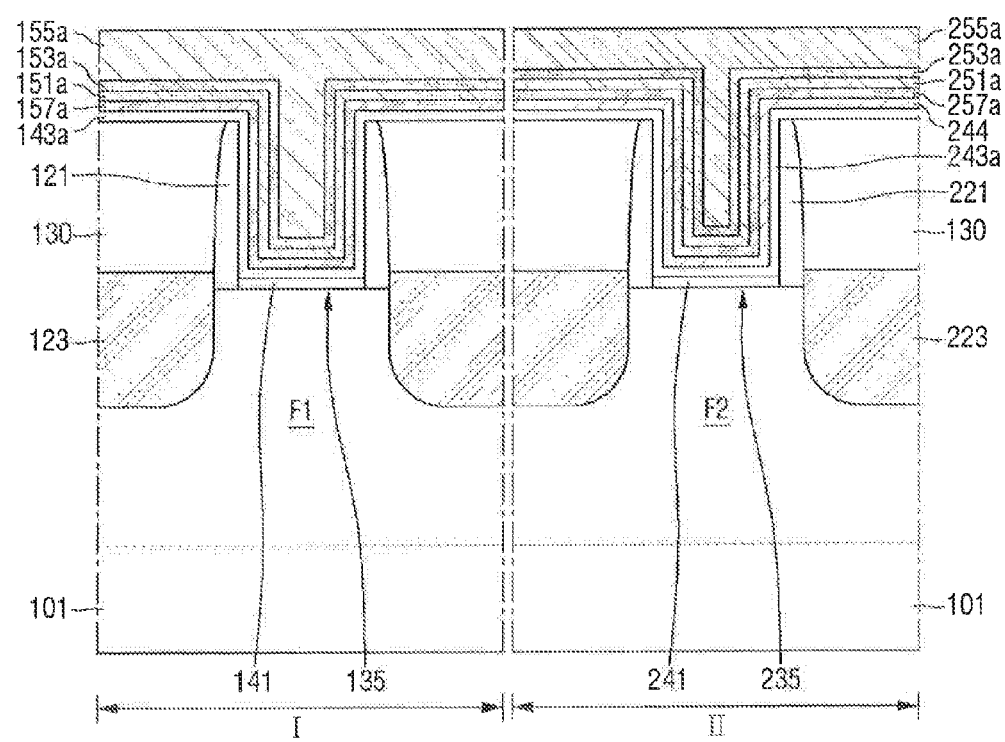

Referring to FIG. 56, first and second TiN films 157a and 257a may be formed on the first dielectric film 143a and the oxide layer 144, respectively. The first and second TiN films 157a and 257a may be conformally formed along the sidewalls and bottom surfaces of the first and second trenches 135 and 235, respectively. The first and second TiN films 157a and 257a may include TiN, for example. First and second TiAlC films 151a and 251a may be formed on the first and second TiN films 157a and 257a, respectively. The first and second TiAlC films 151a and 251a may include TiAlC, for example. The first and second TiAlC films 151a and 251a may be conformally formed along the sidewalls and bottom surfaces of the first and second trenches 135 and 235. First and second barrier films 153a and 253a may be formed on the first and second TiAlC films 151a and 251a, respectively. Each of the first and second barrier films 153a and 253a may be formed along the sidewalls and the bottom surfaces of the first and second trenches 135 and 235. The first and second barrier films 153a and 253a may be formed conformally along the upper portion of the sidewalls and upper surfaces of the first and second fins F1 and F2, respectively. The first and second barrier films 153a and 253a may include TiN, for example.

First and second metal films 155a and 255a may be formed on the first and second barrier films 153a and 253a, respectively. The first and second metal films 155a and 255a may substantially fill the remaining portions of the first and second trenches 135 and 235. The first and second metal films 155a and 255a may include Al, or W, for example.

Figure 57:
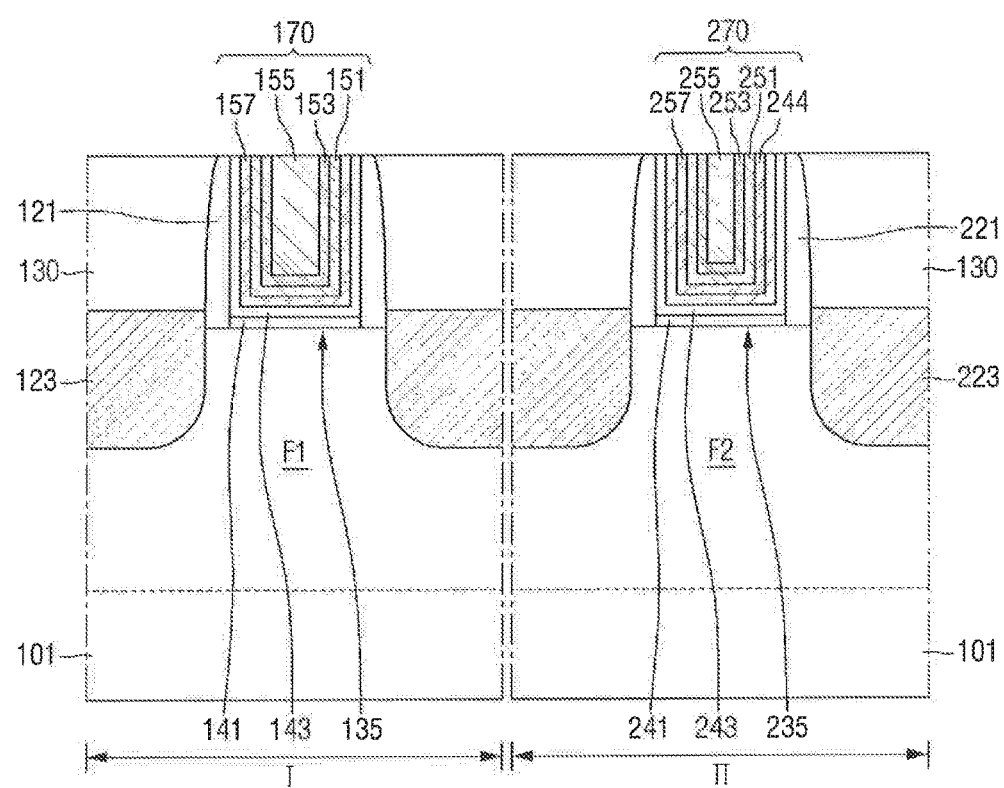

Referring to FIG. 57, the first and second gate stacks 170 and 270 may be formed. In the resultant form (see, e.g., FIG. 38), when the planarization process is performed to expose the first interlayer insulating film 130, a first gate stack 170 including the first interface film 141, the first dielectric film 143, the first TiN film 157, the first TiAlC 151, the first barrier film 153, and the first metal film 155 may be formed. The first dielectric film 143, the first TiN film 157, the first TiAlC 151, and the first barrier film 153 may have a concave shape within the first trench 135.

A second gate stack 270 including a second interface film 241, a second dielectric film 243, a oxide layer 244, a second TiN film 257, a second work function adjustment film 251, a second barrier film 253, and a second metal film 255 may be formed. The second dielectric film 243, the oxide layer 244, the second TiN film 257, the second work function adjustment film 251, and the second barrier film 253 may have a concave shape within the second trench 235.

Figure 58:
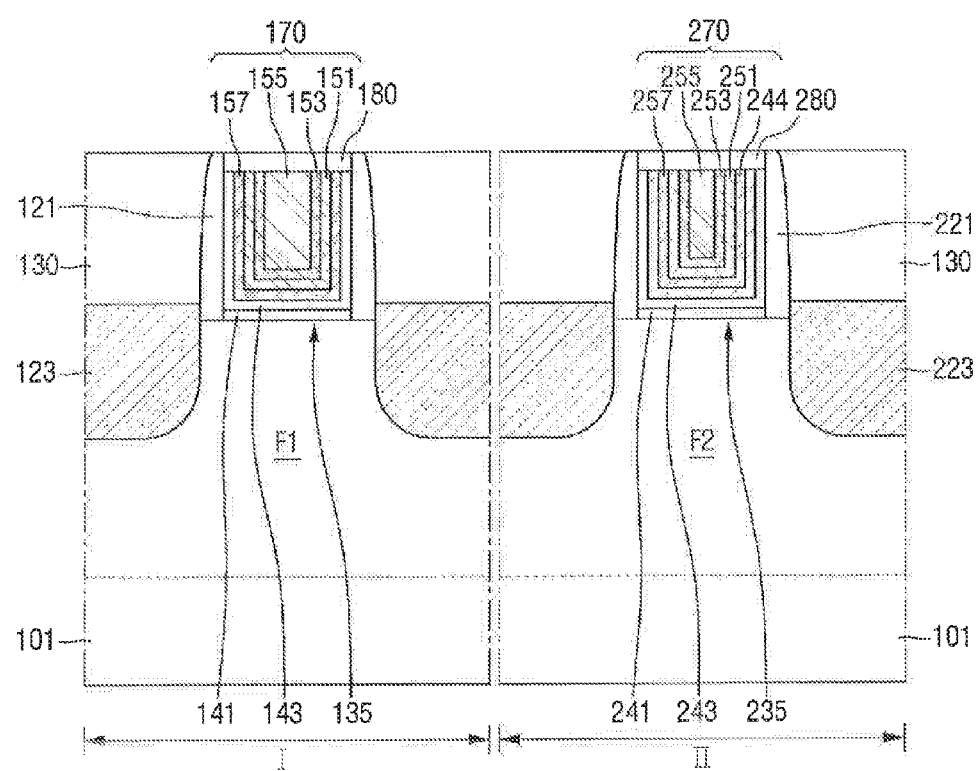

Referring to FIG. 58, first and second capping films 180 and 280 may be formed on the first and second gate stacks 170 and 270, respectively. As an example, each of the first and second capping films 180 and 280 may be formed on the first and second gate stacks 170 and 270, and may substantially cover the first and second trenches 135 and 235. The first and second capping films 180 and 280 may include a nitride (e.g., at least one of SiN, SiON, or SiCON) or an oxide. Each of the first and second capping films 180 and 280 may block the first and second gate stacks 170 and 270 from being exposed to the outside to prevent a change in performance of the first and second gate stacks 170 and 270.

Figure 59:
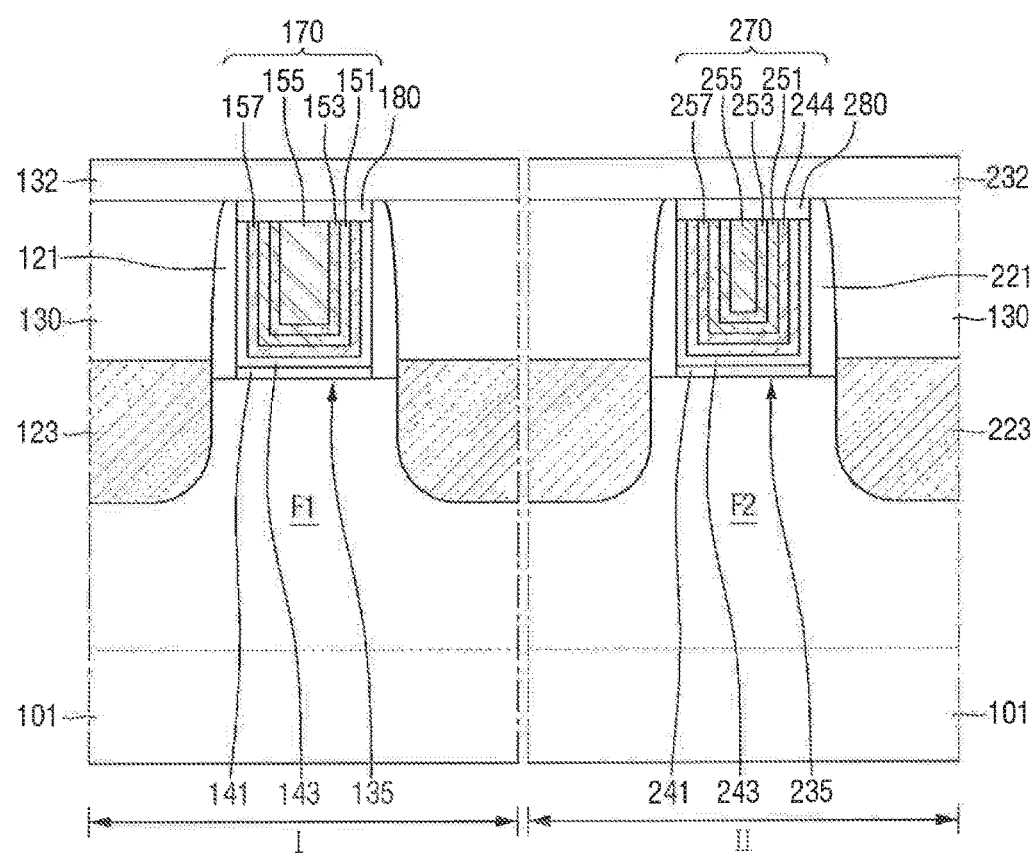

Referring to FIG. 59, second interlayer insulating films 132 and 232 may be formed on the interlayer insulating film 130. The second interlayer insulating films 132 and 232 may substantially cover the first and second capping films 180 and 280. The second interlayer insulating films 132 and 232 may include a same material as the interlayer insulating film 130, and may include, for example, silicon oxide.

Referring to FIGS. 60 to 62, first and second silicide films 191 and 291 may be formed on the first and second source/drain regions 123 and 223, and the first and second contacts 193 and 293 penetrating the insulating film 130 and the second interlayer insulating films 132 and 232 may be formed on the first and second source/drain regions 123 and 223 to form the semiconductor device according to an exemplary embodiment of the present inventive concept. However, exemplary embodiments of the present inventive concept are not limited thereto. The first and second silicide films 191 and 291 may reduce the surface resistance and the contact resistance of the first and second source/drain regions 123 and 223, and may include, for example, Pt, Ni, or Co. The first and second contacts 193 and 293 may include, for example, W, Al, or Cu.

The semiconductor device according to some exemplary embodiments of the present inventive concept may include first and second transistors TR1 and TR2 in the first region I and the second region II, respectively. The threshold voltage of the first transistor TR1 may be adjusted by the first dielectric film 143, and the threshold voltage of the second transistor TR2 may be adjusted by the oxide layer 244. Thus, the first transistor TR1 and the second transistor TR2 may be controlled to have different threshold voltages.

A semiconductor device according to some exemplary embodiments of the present inventive concept will be described in more detail below with reference to FIGS. 63 to 65.

Figure 63:
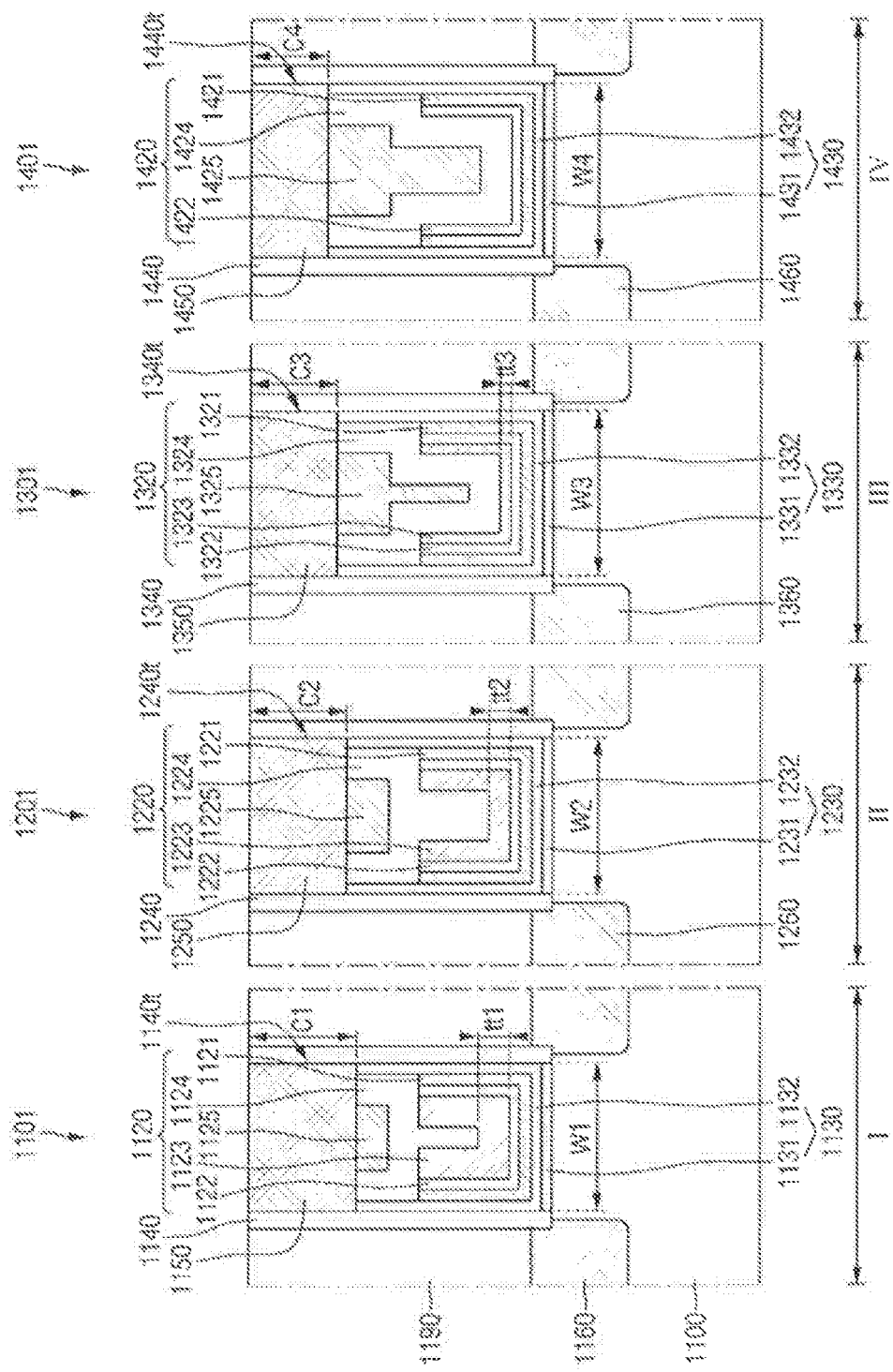
FIG. 63 is a cross-sectional view illustrating a semiconductor device according to an exemplary embodiment of the present inventive concept.

FIG. 63 is a cross-sectional view illustrating a semiconductor device according to an exemplary embodiment of the present inventive concept. FIG. 64 is a cross-sectional view illustrating the fourth filling film of FIG. 63. FIG. 65 is a graphical representation illustrating a height of the gate electrode of a semiconductor device according to some exemplary embodiments of the present inventive concept.

Figure 64:
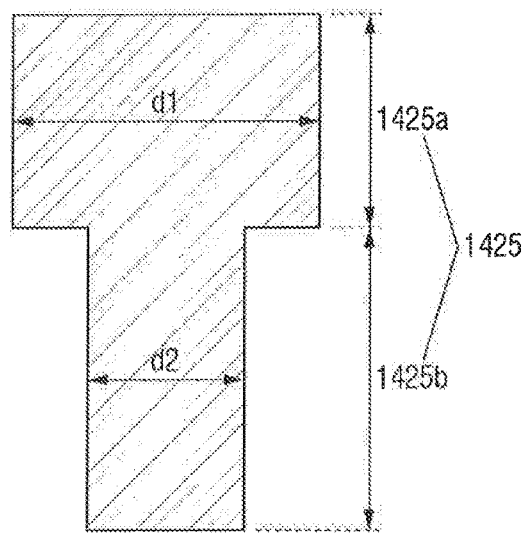
FIG. 64 is a cross-sectional view illustrating the fourth filling film of FIG. 63.
Figure 65:
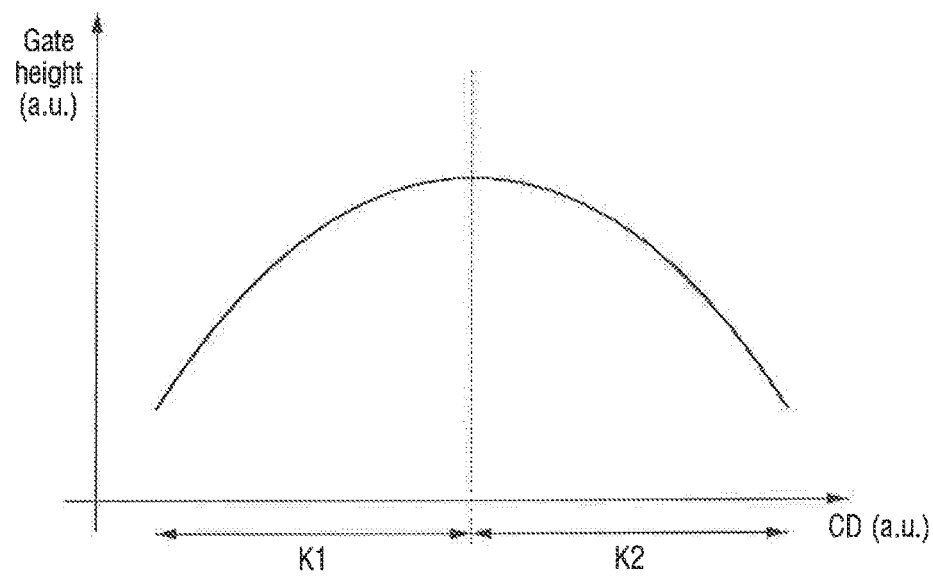
FIG. 65 is a graphical representation illustrating a height of the gate electrode of a semiconductor device according to some exemplary embodiments of the present inventive concept.

Referring to FIGS. 63 to 65, a semiconductor device according to some exemplary embodiments of the present inventive concept may include first to fourth transistors 1101, 1201, 1301, and 1401 formed on a substrate 1100

The substrate 1100 may include first to fourth regions I, II, III, and IV. The first to fourth regions I, II, III, and IV may be separated from each other, or may be connected to each other. All the directions of cutting the first to fourth regions I, II, III, and IV described with reference, for example, to FIG. 1 may be substantially the same, or the directions may be different from each other.

The first to fourth regions I, II, III, and IV may be included in a portion having the same function, for example, a logic region, or an I/O region. Alternatively, the first to fourth regions I, II, III, and IV may each be included in the different functional portions, for example, may each be included in one of a logic region, an SRAM region, or an I/O region.

In the semiconductor device according to some exemplary embodiments of the present inventive concept described with reference to FIG. 63, a PMOS may be formed in the first and second regions I and II of the first to fourth regions I, II, III, and IV, and an NMOS may be formed in the third and fourth regions III and IV of the first to fourth regions I, II, III, and IV.

A substrate 1100 may be a bulk silicon or a silicon-on-insulator SOI. Alternatively, the substrate 1100 may be a silicon substrate, or may include another material such as silicon germanium, silicon germanium on insulator (SGOI), indium antimonide, lead telluride, indium arsenide, indium phosphide, gallium arsenide, or gallium antimonide; however, exemplary embodiments of the present inventive concept are not limited thereto.

As an example, some exemplary embodiments of the present inventive concept will be described in more detail below in which the substrate 1100 includes a silicon; however, exemplary embodiments of the present inventive concept are not limited thereto.

The first transistor 1101 may be formed in the first region I, the second transistor 1201 may be formed in the second region II, the third transistor 1301 may be formed in the third region III, and the fourth transistor 1401 may be formed in the fourth region IV.

Since the first and second regions I and II among the first to fourth regions I, II, III, and IV are regions where the PMOS may be formed, the first and second transistors 1101 and 1201 may be p-type transistors, and since the third and fourth regions III and IV among the first to fourth regions I, II, III, and IV may be regions where the NMOS is formed, the third and fourth transistors 1301 and 1401 may be n-type transistors.

The first transistor 1101 may include a first gate insulating film 1130, a first gate electrode structure 1120, a first gate spacer 1140, and a first source/drain 1160.

The second transistor 1201 may include a second gate insulating film 1230, a second gate electrode structure 1220, a second gate spacer 1240, and a second source/drain 1260.

The third transistor 1301 may include a third gate insulating film 1330, a third gate electrode structure 1320, a third gate spacer 1340, and a third source/drain 1360.

The fourth transistor 1401 may include a fourth gate insulating film 1430, a fourth gate electrode structure 1420, a fourth gate spacer 1440, and a fourth source/drain 1460.

Elements included in each of the first to fourth transistors 1101, 1201, 1301, and 1401 will be described in more detail below.

The interlayer insulating film 1190 may be formed on the substrate 1100 of the first to fourth regions I, II, III, and IV. The interlayer insulating film 1190 may include first to fourth trenches 1140$t$, 1240$t$, 1340$t$, and 1440$t$.

The first to fourth trenches 1140$t$, 1240$t$, 1340$t$, and 1440$t$ corresponding to the first to fourth regions I, II, III, and IV may be formed. As an example, the first trench 1140$t$ may be formed on the substrate 1100 in the first region I, the second trench 1240$t$ may be formed on the substrate 1100 in the second region II, the third trench 1340$t$ may be formed on the substrate 1100 in the third region III, and the fourth trench 1440$t$ may be formed on the substrate 1100 in the fourth region IV.

The interlayer insulating film 1190 may include, for example, at least one of silicon oxide, silicon nitride, silicon oxynitride, or a low-k dielectric material. The low-k dielectric material may include, for example, flowable oxide (FOX), torene silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), silk, polyimide, porous polymeric material, or a combination thereof; however, exemplary embodiments of the present inventive concept are not limited thereto.

The first gate spacer 1140 may be formed on the substrate 1100 in the first region I. The first gate spacer 1140 may define a first trench 1140$t$. For example, sidewalls of the first trench 1140$t$ may be defined by the first gate spacer 1140 and a bottom surface thereof may be defined by an upper surface of the substrate 1100.

A second gate spacer 1240 defining a second trench 1240$t$ may be formed on the substrate 1100 of the second region II. A third gate spacer 1340 defining a third trench 1340$t$ may be formed on the substrate 1100 of the third region III. A fourth gate spacer 1440 defining a fourth trench 1440$t$ may be formed on the substrate 1100 of the fourth region IV.

For example, each of the first to fourth gate spacers 1140, 1240, 1340, and 1440 may include at least one of silicon nitride (SiN), silicon oxynitride (SiON), silicon oxide (SiO$_2$), silicon oxycarbonitride (SiOCN), or a combination thereof.

While the first to fourth spacers 1140, 1240, 1340, and 1440 may each include a single film, exemplary embodiments of the present inventive concept are not limited thereto. When first to fourth spacers 1140, 1240, 1340, and 1440 include a plurality of films, at least one film among the films included in each of the first to fourth spacers 1140, 1240, 1340, and 1440 may include a low-k dielectric material such as silicon oxycarbonitride (SiOCN).

When the first to fourth gate spacers 1140, 1240, 1340, and 1440 include a plurality of films, at least one of the films included in each of the first to fourth gate spacers 1140, 1240, 1340, and 1440 may have an L-shape.

In some cases, the first to fourth spacers 1140, 1240, 1340, and 1440 may serve as a guide for forming a self-aligned contact. Thus, the first to fourth gate spacers 1140, 1240, 1340, and 1440 may include a material having an etch selectivity with respect to the interlayer insulating film 1190.

The first trench 1140$t$ to the fourth trench 1440$t$ may have a first width W1 to a fourth width W4, respectively. As an example, the first trench 1140$t$ may have a first width W1, the second trench 1240$t$ may have a second width W2, the third trench 1340$t$ may have a third width W3, and the fourth trench 1440$t$ may have a fourth width W4.

The first width W1 may be less than the second width W2. The second width W2 may be less than the third width W3. The third width W3 may be less than the fourth width W4. As an example, the first width W1 to the fourth width W4 may be gradually increased.

The first width W1 to the fourth width W4 may be related to the critical dimensions of the gate electrode structures 1120, 1220, 1320, and 1420 inside the first trench 1140$t$ to the fourth trench 1440$t$, respectively. That is, the first width W1 to the fourth width W4 of the first trench 1440$t$ to the fourth trench 1440$t$ may become greater as the critical dimension of the gate electrode structures 1120, 1220, 1320, and 1420 increase.

The first gate insulating film 1130 may be formed on the substrate 1100 in the first region I. It may extend along the sidewalls and bottom surface of first trench 1140$t$. The first gate insulating film 1130 may include a first interfacial layer 1131 and a first high-k insulating film 1132.

The first interfacial layer 1131 may be formed on the substrate 1100. The first interfacial layer 1131 may be formed on the bottom surface of the first trench 1140$t$.

The first high-k insulating film 1132 may be formed on the first interfacial layer 1131. The first high-k insulating film 1132 may be formed along the bottom surface and sidewalls of the first trench 1140t.

The second gate insulating film 1230 may be formed on the substrate 1100 in the second region II. It may extend along the sidewalls and bottom surface of the second trench 1240t. The second gate insulating film 1230 may include a second interfacial layer 1231 and a second high-k insulating film 1232.

The second interfacial layer 1231 may be formed on the substrate 1100. The second interfacial layer 1231 may be formed on the bottom surface of the second trench 1240t.

The second high-k insulating film 1232 may be formed on the second interfacial layer 1231. The second high-k insulating film 1232 may be formed along the bottom surface and sidewall of the second trench 1240t.

The third gate insulating film 1330 may be formed on the substrate 1100 in the third region III. It may extend along the sidewalls and bottom surface of third trench 1340t. The third gate insulating film 1330 may include a third interfacial layer 1331 and a third high-k insulating film 1332.

The third interfacial layer 1331 may be formed on the substrate 1100. The third interfacial layer 1331 may be formed on the bottom surface of the third trench 1340t.

The third high-k insulating film 1332 may be formed on the third interfacial layer 1331. The third high-k insulating film 1332 may be formed along the bottom surface and sidewall of the third trench 1340t.

The fourth gate insulating film 1430 may be formed on the substrate 1100 of the fourth region IV. It may extend along the sidewalls and the bottom surface of the fourth trench 1440t. The fourth gate insulating film 1430 may include a fourth interfacial layer 1431 and a fourth high-k insulating film 1432.

The fourth interfacial layer 1431 may be formed on the substrate 1100. The fourth interfacial layer 1431 may be formed on the bottom surface of the fourth trench 1440t.

The fourth high-k insulating film 1432 may be formed on the fourth interfacial layer 1431. The fourth high-k insulating film 1432 may be formed along the bottom surface and sidewalls of the fourth trench 1440t.

As an example, the first to fourth interfacial layers 1131, 1231, 1331, and 1431 might not be formed on the sidewalls of the first to fourth trenches 1140t, 1240t, 1340t, and 1440t; however, exemplary embodiments of the present inventive concept are not limited thereto. According to a method of forming the first to fourth interfacial layers 1131, 1231, 1331, and 1431 according to an exemplary embodiment of the present inventive concept, the first to fourth interfacial layers 1131, 1231, 1331, and 1431 may also be formed on the sidewalls of the first to fourth trenches 1140t, 1240t, 1340t, and 1440t.

Each of the first to fourth interfacial layers 1131, 1231, 1331, and 1431 may include, for example, include silicon oxide; however, exemplary embodiments of the present inventive concept are not limited thereto. According, based on the materials included in the substrate 1100 and the materials included in the first to fourth high-k insulating film 1132, 1232, 1332, and 1432, the first to fourth interfacial layers 1131, 1231, 1331, and 1431 may include other materials than silicon oxide.

For example, the first to fourth high-k insulating films 1132, 1232, 1332, and 1432 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

As an example, while the oxides are described with respect to the first to fourth high-k insulating films 1132, 1232, 1332, and 1432, alternatively, the first to fourth high-k insulating films 1132, 1232, 1332, and 1432 may include one or more nitride of the metal materials described above (e.g., hafnium nitride) and/or one or more oxynitride of the metal materials described above (e.g., hafnium oxynitride)); however, exemplary embodiments of the present inventive concept are not limited thereto.

The first gate electrode structure 1120 may be formed on the first gate insulating film 1130. The first gate electrode structure 1120 may fill a portion of the first trench 1140t.

The first gate electrode structure 1120 may include a first lower TiN film 1121, a first etch stop film 1122, a first work function adjustment film 1123, a first insertion film 1124, and a first filling film 1125.

The first lower TiN film 1121 may be formed on the first gate insulating film 1130. The first lower TiN film 1121 may be in direct contact with the first gate insulating film 1130.

The first lower TiN film 1121 may extend along the sidewalls and the bottom surface of the first trench 1140t. The first lower TiN film 1121 may be formed along a profile of the upper surface of the first gate insulating film 1130.

The first lower TiN film 1121 may be formed along substantially the entire bottom surface and only a portion of the sidewalls of the first trench 1140t. As an example, a portion of the first gate insulating film 1130 formed on the sidewalls of the first trench 1140t may be exposed (e.g., need not be covered by the first lower TiN film 1121). As an example, the upper surface of the first gate insulating film 1130 formed along the bottom surface and the lower portion of the sidewalls of the first trench 1140t may be substantially covered with the integral first lower TiN film 1121, but a portion of the upper surface of the first gate insulating film 1130 formed on the upper portion of the sidewalls of the first trench 1140t might not be covered with the first lower TiN film 1121.

The first etch stop film 1122 may be formed on the first lower TiN film 1121. The first etch stop film 1122 may extend along the sidewalls and the bottom surface of the first gate insulating film 1130. The first etch stop film 1122 may be formed along a profile of the first lower TiN film 1121. The first etch stop film 1122 may expose the upper surface of the first gate insulating film 1130 formed along the upper portion of the sidewalls of the first trench 1140t.

The first work function adjustment film 1123 may be formed on the first etch stop film 1122. The first work function adjustment film 1123 may be in direct contact with the first etch stop film 1122. The first work function adjustment film 1123 may extend along the sidewalls and the bottom surface of the first trench 1140t. The first work function adjustment film 1123 may be formed along the profile of the first etch stop film 1122.

The first work function adjustment film 1123 may also expose the first gate insulating film 1130 formed along the upper portion of the sidewalls of the first trench 1140t. The first work function adjustment film 1123 may have a first thickness tt1.

The first insertion film 1124 may be formed on the first work function adjustment film 1123. The first insertion film 1124 may be in direct contact with the first work function adjustment film 1123.

The first insertion film 1124 may extend along the sidewalls and the bottom surface of the first trench 1140*t*. The first insertion film 1124 may be formed along the profile of the first work function adjustment film 1123.

As an example, the first insertion film 1124 may be formed on the first lower TiN film 1121, the first etch stop film 1122, and the first work function adjustment film 1123. The first insertion film 1124 may be in direct contact with the upper surface of the first gate insulating film 1130 exposed by the first lower TiN film 1121, the first etch stop film 1122, and the first work function adjustment film 1123.

The first insertion film 1124 may be formed along the profile of the upper surface of the first gate insulating film 1130, the first lower TiN film 1121, the first etch stop film 1122, and the first work function adjustment film 1123. While the recess formed by the first work function adjustment film 1123 may be substantially filled, the first trench 1140*t* which is not completely filled may be formed on the upper surface.

The first filling film 1125 may be formed on the first insertion film 1124. The first filling film 1125 may partially fill the remaining first trench 1140*t* after the first lower TiN film 1121, the first etch stop film 1122, the first work function adjustment film 1123, and the first insertion film 1124 are formed.

The second gate electrode structure 1220 may be formed on the second gate insulating film 1230. The second gate electrode structure 1220 may substantially fill the second trench 1240*t*.

The second gate electrode structure 1220 may include a second lower TiN film 1221, a second etch stop film 1222, a second work function adjustment film 1223, a second insertion film 1224, and a second filling film 1225.

The second lower TiN film 1221 may be formed on the second gate insulating film 1230. The second lower TiN film 1221 may be in direct contact with the second gate insulating film 1230.

The second lower TiN film 1221 may extend along the sidewalls and the bottom surface of the second trench 1240*t*. The second lower TiN film 1221 may be formed along a profile of the upper surface of the second gate insulating film 1230.

The second lower TiN film 1221 may be formed along substantially the entire bottom surface and only a portion of the sidewalls of the second trench 1240*t*. As an example, a portion of the second gate insulating film 1230 formed on the sidewalls of the second trench 1240*t* may be exposed (e.g., need not be covered by the second lower TiN film 1221). As an example, the upper surface of the second gate insulating film 1230 formed along the bottom surface and the lower portion of the sidewalls of the second trench 1240*t* may be substantially covered with the integral second lower TiN film 1221, but a portion of the upper surface of the second gate insulating film 1230 formed on the upper portion of the sidewalls of the second trench 1240*t* might not be covered with the second lower TiN film 1221.

The second etch stop film 1222 may be formed on the second lower TiN film 1221. The second etch stop film 1222 may extend along the sidewalls and the bottom surface of the second gate insulating film 1230. The second etch stop film 1222 may be formed along the profile of the second lower TiN film 1221. The second etch stop film 1222 may also expose the upper surface of the second gate insulating film 1230 formed along the upper portion of the sidewalls of the second trench 1240*t*.

The second work function adjustment film 1223 may be formed on the second etch stop film 1222. The second work function adjustment film 1223 may be in direct contact with the second etch stop film 1222. The second work function adjustment film 1223 may extend along the sidewalls and the bottom surface of the second trench 1240*t*. The second work function adjustment film 1223 may be formed along the profile of the second etch stop film 1222.

The second work function adjustment film 1223 may also expose the second gate insulating film 1230 formed along the upper portion of the sidewalls of the second trench 1240*t*. The second work function adjustment film 1223 may have a second thickness tt2.

The second insertion film 1224 may be formed on the second work function adjustment film 1223. The second insertion film 1224 may be in direct contact with the second work function adjustment film 1223.

The second insertion film 1224 may extend along the sidewalls and the bottom surface of the second trench 1240*t*. The second insertion film 1224 may be formed along the profile of the second work function adjustment film 1223.

As an example, the second insertion film 1224 may be formed on the second lower TiN film 1221, the second etch stop film 1222, and the second work function adjustment film 1223. The second insertion film 1224 may be in direct contact with the upper surface of the second gate insulating film 1230 exposed by the second lower TiN film 1221, the second etch stop film 1222, and the second work function adjustment film 1223.

The second insertion film 1224 may be formed along the profile of the upper surface of the second gate insulating film 1230, the second lower TiN film 1221, the second etch stop film 1222, and the second work function adjustment film 1223. While the recess formed by the second work function adjustment film 1223 may be substantially filled, the second trench 1240*t* which is not completely filled may be formed on the upper surface.

The second filling film 1225 may be formed on the second insertion film 1224. The second filling film 1225 may partially fill the remaining second trench 1240*t* after the second lower TiN film 1221, the second etch stop film 1222, the second work function adjustment film 1223, and the second insertion film 1224 are formed.

The third gate electrode structure 1320 may be formed on the third gate insulating film 1330. The third gate electrode structure 1320 may fill the third trench 1340*t*.

The third gate electrode structure 1320 may include a third lower TiN film 1321, a third etch stop film 1322, a third work function adjustment film 1323, a third insertion film 1324, and a third filling film 1325.

The third lower TiN film 1321 may be formed on the third gate insulating film 1330. The third lower TiN film 1321 may be in direct contact with the third gate insulating film 1330.

The third lower TiN film 1321 may extend along the sidewalls and the bottom surface of the third trench 1340*t*. The third lower TiN film 1321 may be formed along a profile of the upper surface of the third gate insulating film 1330.

The third lower TiN film 1321 may be formed along substantially the entire bottom surface and only a portion of the sidewalls of the third trench 1340*t*. As an example, a portion of the third gate insulating film 1330 formed on the sidewalls of the third trench 1340*t* may be exposed (e.g., need not be covered by the third lower TiN film 1321). As an example, the upper surface of the third gate insulating film 1330 formed along the bottom surface and the lower portion of the sidewalls of the third trench 1340*t* may be substantially covered with the integral third lower TiN film 1321, but a portion of the upper surface of the third gate insulating film 1330 formed on the upper portion of the sidewalls of the third trench 1340t might not be covered with the third lower TiN film 1321.

The third etch stop film 1322 may be formed on the third lower TiN film 1321. The third etch stop film 1322 may extend along the sidewalls and the bottom surface of the third gate insulating film 1330. The third etch stop film 1322 may be formed along the profile of the third lower TiN film 1321. The third etch stop film 1322 may expose the upper surface of the third gate insulating film 1330 formed along the upper portion of the sidewalls of the third trench 1340t.

The third work function adjustment film 1323 may be formed on the third etch stop film 1322. The third work function adjustment film 1323 may be in direct contact with the first etch stop film 1322. The third work function adjustment film 1323 may extend along the sidewalls and the bottom surface of the third trench 1340t. The third work function adjustment film 1323 may be formed along the profile of the third etch stop film 1322.

The third work function adjustment film 1323 may also expose the third gate insulating film 1330 formed along the upper portion of the sidewalls of the third trench 1340t. The third work function adjustment film 1323 may have a third thickness tt3.

The third insertion film 1324 may be formed on the third work function adjustment film 1323. The third insertion film 1324 may be in direct contact with the third work function adjustment film 1323.

The third insertion film 1324 may extend along the sidewalls and the bottom surface of the third trench 1340t. The third insertion film 1324 may be formed along the profile of the third work function adjustment film 1323.

As an example, the third insertion film 1324 may be formed on the third lower TiN film 1321, the third etch stop film 1322, and the third work function adjustment film 1323. The third insertion film 1324 may be in direct contact with the upper surface of the third gate insulating film 1330 exposed by the third lower TiN film 1321, the third etch stop film 1322, and the third work function adjustment film 1323.

The third insertion film 1324 may be formed along the profile of the upper surface of the third gate insulating film 1330, the third lower TiN film 1321, the third etch stop film 1322, and the third work function adjustment film 1323. However, the recess formed by the third work function adjustment film 1323 may be partially filled, and a third trench 1340t may be formed which is not completely filled on the upper surface. However, exemplary embodiments of the present inventive concept are not limited thereto, and the recess formed by the third work function adjustment film 1323 may be substantially completely filled.

The third filling film 1325 may be formed on the third insertion film 1324. The third filling film 1325 may partially fill the remaining third trench 1340t after the third lower TiN film 1321, the third etch stop film 1322, the third work function adjustment film 1323, and the third insertion film 1324 are formed.

The fourth gate electrode structure 1420 may be formed on the fourth gate insulating film 1430. The fourth gate electrode structure 1420 may fill the fourth trench 1440t.

The fourth gate electrode structure 1420 may include a fourth lower TiN film 1421, a fourth etch stop film 1422, a fourth insertion film 1424, and a fourth filling film 1425.

The fourth lower TiN film 1421 may be formed on the fourth gate insulating film 1430. The fourth lower TiN film 1421 may be in direct contact with the fourth gate insulating film 1430.

The fourth lower TiN film 1421 may extend along the sidewalls and the bottom surface of the fourth trench 1440t. The fourth lower TiN film 1421 may be formed along a profile of the upper surface of the fourth gate insulating film 1430.

The fourth lower TiN film 1421 may be formed along the entire bottom surface and only a portion of the sidewalls of the fourth trench 1440t. As an example, a portion of the fourth gate insulating film 1430 formed on the sidewalls of the fourth trench 1440t may be exposed (e.g., need not be covered by the fourth lower TiN film 1421). As an example, the upper surface of the fourth gate insulating film 1430 formed along the bottom surface and the lower portion of the sidewalls of the fourth trench 1440t may be substantially covered with the integral fourth lower TiN film 1421, but a portion of the upper surface of the fourth gate insulating film 1430 formed on the upper portion of the sidewalls of the fourth trench 1440t might not be covered with the fourth lower TiN film 1421.

The fourth etch stop film 1422 may be formed on the fourth lower TiN film 1421. The fourth etch stop film 1422 may extend along the sidewalls and the bottom surface of the fourth gate insulating film 1430. The fourth etch stop film 1422 may be formed along the profile of the fourth lower TiN film 1421. The fourth etch stop film 1422 may expose the upper surface of the fourth gate insulating film 1430 formed along the upper portion of the sidewalls of the fourth trench 1440t.

The fourth insertion film 1424 may be formed on the fourth etch stop film 1422. The fourth insertion film 1424 may be in direct contact with the fourth etching stop film 1422. As an example, the work function adjustment film need not be formed in the fourth trench 1440t.

The fourth insertion film 1424 may extend along the sidewalls and the bottom surface of the fourth trench 1440t. The fourth insertion film 1424 may be formed along the profile of the fourth etch stop film 1422.

As an example, the fourth insertion film 1424 may be formed on the fourth lower TiN film 1421 and the fourth etch stop film 1422. The fourth insertion film 1424 may be in direct contact with the upper surface of the fourth gate insulating film 1430 exposed by the fourth lower TiN film 1421 and the fourth etch stop film 1422.

The fourth insertion film 1424 may be formed along the profile of the upper surface of the fourth gate insulating film 1430, the fourth lower TiN film 1421, and the fourth etch stop film 1422. The recess formed by the fourth etch stop film 1422 may be partially filled, and a fourth trench 1440t may be formed which is not completely filled on the upper surface. However, exemplary embodiments of the present inventive concept are not limited thereto, and the recess formed by the fourth etch stop film 1422 may be substantially completely filled.

The fourth filling film 1425 may be formed on the fourth insertion film 1424. The fourth filling film 1425 may partially fill the remaining fourth trench 1440t after the fourth lower TiN film 1421, the fourth etch stop film 1422, and the fourth insertion film 1424 are formed.

The first to fourth lower TiN films 1121, 1221, 1321, and 1421 may include TiN.

The first to fourth etch stop films 1122, 1222, 1322, and 1422 may each include a same material. As an example, the first to fourth etch stop films 1122, 1222, 1322, and 1422 may each be films including same material.

The first to fourth etch stop films 1122, 1222, 1322, and 1422 may include, for example, TaN. The first to fourth etch stop films 1122, 1222, 1322, and 1422 may be formed at substantially the same level. As an example, the first to fourth etch stop films 1122, 1222, 1322, and 1422 may be formed by a same fabricating process.

For example, the thickness of each of the first to fourth etch stop films 1122, 1222, 1322, and 1422 may be substantially the same, but exemplary embodiments of the present inventive concept are not limited thereto.

The first to third work function adjustment films 1123, 1223, and 1323 may each include a same material. As an example, the first to third work function adjustment films 1123, 1223, and 1323 may each be films including same material.

The first to third work function adjustment films 1123, 1223, and 1323 may include TiN, for example.

The first thickness tt1 of the first work function adjustment film 1123 may be greater than the second thickness tt2 of the second work function adjustment film 1223. The second thickness tt2 of the second work function adjustment film 1223 may be greater than the third thickness tt3 of the third work function adjustment film 1323. As an example, the first work function adjustment film 1123 to the third work function adjustment film 1323 may be gradually thinned.

The first to fourth insertion films 1124, 1224, 1324, and 1424 may each include a same material. As an example, the first to fourth insertion films 1124, 1224, 1324, and 1424 may each be films including a same material.

The first to fourth insertion films 1124, 1224, 1324, and 1424 may include, for example, one of Ti, TiAl, TiAlN, TiAlC, or TiAlCN. The first to fourth insertion films 1124, 1224, 1324, and 1424 may be formed at substantially the same level, and may each be formed by a same fabrication process.

For example, the thickness of each of the first to fourth insertion films 1124, 1224, 1324, and 1424 may be substantially the same, but exemplary embodiments of the present inventive concept are not limited thereto.

In the semiconductor device according to some exemplary embodiments of the present inventive concept, the first to fourth insertion films 1124, 1224, 1324, and 1424 may each include TiAl; however, exemplary embodiments of the present inventive concept are not limited thereto.

The first to fourth filling films 1125, 1225, 1325, and 1425 may each include a same material. The first to fourth filling films 1125, 1225, 1325, and 1425 may include, for example, at least one of W, Al, Co, Cu, Ru, Ni, Pt, Ni—Pt, or TiN.

The upper surface of the first gate electrode structure 1120 may include the upper surfaces of the first filling film 1125 and the first insertion film 1124. The upper surface of the second gate electrode structure 1220 may include the upper surfaces of the second filling film 1225 and the second insertion film 1224. The upper surface of the third gate electrode structure 1320 may include the upper surfaces of the third filling film 1325 and the third insertion film 1324. The upper surface of the fourth gate electrode structure 1420 may include the upper surfaces of the fourth filling film 1425 and the fourth insertion film 1424.

The upper surface of the first gate electrode structure 1120 may be lower than the upper surface of the second gate electrode structure 1220. The upper surface of the second gate electrode structure 1220 may be lower than the upper surface of the third gate electrode structure 1320. The upper surface of the third gate electrode structure 1320 may be lower than the upper surface of the fourth gate electrode structure 1420.

Gradually elevated upper surfaces of the first gate electrode structure 1120 to the fourth gate electrode structure 1420 may be attributed to the etching process among the fabricating processes. The etching process will be described below in more detail.

The first electrode structure 1120 to the fourth gate electrode structure 1420 need not completely fill the first trench 1440t to the fourth trench 1440t. A first capping film 1150 to a fourth capping film 1450 may be formed on the first gate electrode structure 1120 to the fourth gate electrode structure 1420, respectively.

As an example, the first capping film 1150 may be formed on the first gate electrode structure 1120 and the first gate insulating film 1130. The second capping film 1250 may be formed on the second gate electrode structure 1220 and the second gate insulating film 1230. The third capping film 1350 may be formed on the third gate electrode structure 1320 and the third gate insulating film 1330. The fourth capping film 1450 may be formed on the fourth gate electrode structure 1420 and the fourth gate insulating film 1430.

The first trench 1140t may be substantially completely filled with the first capping film 1150. The second trench 1240t may be substantially completely filled with the second capping film 1250. The third trench 1340t may be substantially completely filled with the third capping film 1350. The fourth trench 1440t may be substantially completely filled with the fourth capping film 1450. The first capping film 1150 to the fourth capping film 1450 may include at least one of silicon nitride (SiN), silicon oxynitride (SiON), silicon oxide ($SiO_2$), silicon carbon nitride (SiCN), or silicon oxycarbon nitride (SiOCN).

Referring to FIG. 64, the shape of the fourth filling film 1425 in FIG. 63 will be described in more detail below. The fourth filling film 1425 (see, e.g., FIG. 63) may be similar in shape to the third filling film 1325, and thus duplicative descriptions may be omitted.

The fourth filling film 1425 may include a fourth upper filling film 1425a and a fourth lower filling film 1425b. The width d1 of the fourth upper filling film 1425a may be greater than the width d2 of the fourth lower filling film 1425b. The width d1 of the fourth upper filling film 1425a and the width d2 of the fourth lower filling film 1425b may be different from each other. As an example, the boundary between the fourth upper filling film 1425a and the fourth lower filling film 1425b may have edges with different widths from each other. Thus, the fourth filling film 1425 may have a T shape. The third filling film 1325 may also have a T shape.

The T shape may occur because the thickness of the third work function adjustment film 1323 may be thinner than that of the first work function adjustment film 1123 and the second work function adjustment film 1223 and a work function adjustment film might not be formed in the fourth trench 1440t. As an example, in the case of the first trench 1140t and the second trench 1240t having a relatively narrow recess formed by the first work function adjustment film 1123 and the second work function adjustment film 1223, the bottoms of the first filling film 1125 and the second filling film 1225 may be substantially flat because the recesses may be substantially filled with the first insertion film 1124 and the second insertion film 1224. In the case of the third trench 1340t and the fourth trench 1440t having a relatively wide recess formed by the third work function adjustment film 1323 and the fourth work function adjustment film 1422, the third insertion film 1324 and the fourth insertion film 1424 might not completely fill the recesses, and the T-shaped recesses may be formed in the lower portions of the third filling film 1325 and the fourth filling film 1425. Thus, the filling films may be T-shaped.

The first to fourth source/drains 1160, 1260, 1360, and 1460 may be formed adjacent to the first to fourth gate electrode structures 1120, 1220, 1320, and 1420, respectively.

Although each of the first to fourth source/drains 1160, 1260, 1360, and 1460 may include an epitaxial layer formed in the substrate 1100, exemplary embodiments of the present inventive concept are not limited thereto. Each of the first to fourth source/drain regions 1160, 1260, 1360, and 1460 may include an impurity region formed by implanting an impurity into the substrate 1100.

Each of the first to fourth source/drains 1160, 1260, 1360, and 1460 may be an elevated source/drain including an upper surface that protrudes upward further than the upper surface of the substrate 1100.

The first to fourth transistors 1101, 1201, 1301, and 1401 may respectively include first to fourth lower TiN films 1121, 1221, 1321, and 1421 having substantially the same thickness. The first to fourth transistors 1101, 1201, 1301, and 1401 may also respectively include first to third work function adjustment films 1123, 1223, and 1323 with different thicknesses, or might not include any work function adjustment film.

Thus, the first to fourth transistors 1101, 1201, 1301, and 1401 may implement different threshold voltages. Since the first and second regions I and II of the first to fourth regions I, II, III, and IV may be regions where the PMOS is formed, the first and second transistors 1101 and 1201 may be p-type transistors, and since the third and fourth regions III and IV of the first to fourth regions I, II, III, and IV are regions where the NMOS is formed, the third and fourth transistors 1301 and 1401 may be n-type transistors.

As an example, the first transistor 1101 may be a p-type low voltage transistor. The second transistor 1201 may be a p-type regular voltage transistor. The third transistor 1301 may be an n-type regular voltage transistor. The fourth transistor 1401 may be an n-type low voltage transistor.

The thicknesses of the first capping film 1150 and the fourth capping film 1450 will be described in more detail with reference to FIGS. 63 and 65. The thickness C1 of the first capping film 1150 may be greater than the thickness C2 of the second capping film 1250. The thickness C2 of the second capping film 1250 may be greater than the thickness C3 of the third capping film 1350. The thickness C3 of the third capping film 1350 may be greater than the thickness C4 of the fourth capping film 1450.

The thicknesses C1 to C4 of the first capping film 1150 to the fourth capping film 1450 may vary depending on the heights of the upper surfaces of the first gate electrode structure 1120 to the fourth gate electrode structure 1420. As an example, the heights of the upper surfaces of the first capping film 1150 to the fourth capping film 1450 may be substantially equalized by a planarization process. Thus, the heights of the lower surfaces of the first capping film 1150 to the fourth capping film 1450 may determine the thicknesses thereof. Since the lower surfaces of the first capping films 1150 to the fourth capping film 1450 may respectively be in direct contact with the upper surfaces of the first gate electrode structure 1120 to the fourth gate electrode structure 1420, heights of the lower surfaces of the first capping film 1150 to the fourth capping film 1450 may be respectively determined according to heights of the upper surfaces of the first gate electrode structure 1120 to the fourth gate electrode structure 1420.

The heights of the upper surfaces of the first gate electrode structure 1120 to the fourth gate electrode structure 1420 may be determined according to critical dimensions CD of the first gate electrode structure 1120 to the fourth gate electrode structure 1420, respectively. As an example, as the critical dimension changes, the heights of the upper surfaces of the first gate electrode structure 1120 to the fourth gate electrode structure 1420 may be determined.

Referring to FIG. 65, heights of the upper surfaces of the first gate electrode structure 1120 to the fourth gate electrode structure 1420 according to the critical dimensions CD of the first gate electrode structure 1120 to the fourth gate electrode structure 1420 may form of quadratic curve being roughly convex upward.

The quadratic curve may include an elevated region K1 and an unelevated region K2. The elevated region K1 may be a region where the height of the gate electrode structure increases as the critical dimension increases, and the unelevated region K2 may be a region where the height of the gate electrode structure decreases as the critical dimension increases.

The first region I to the fourth region IV (see, e.g., FIG. 63) may all be included in the elevated region K1. As an example, as the first width W1 to the fourth width W4 gradually increase, the heights of the upper surfaces of the first gate electrode structure 1120 to the fourth gate electrode structure 1420 may gradually increase. That is, the thicknesses (C1 to C4) of the first capping film 1150 to the fourth capping film 1450 may be gradually reduced.

When there is a region having a width belonging to the unelevated region K2 (see, e.g., FIG. 3), the height of the gate electrode structure may be further lowered, and the thickness of the corresponding capping film may be increased.

The difference in the heights of the gate electrode structure and the difference in the thicknesses of the capping film may be formed by a process for fabricating a semiconductor device. As an example, to fabricate one device that has a plurality of threshold voltage regions, and to form the structure and the margin region for the gate electrode structure, the respective regions may be formed to have various functions by performing the deposition process and the etching process at substantially the same time. The deposition process and the etching process may be performed at substantially the same time because the cost and time loss may be relatively high when each region is formed independently.

Given the characteristic of this process, when the width of the gate electrode structure is relatively large (e.g., when the critical dimension is relatively large), the etching process may be performed relatively less than in the other regions in the same etching process. Thus, the heights of the upper surfaces of the gate electrode structures may be different from each other in the respective regions. Also, the thickness of the capping film may vary depending on the height difference of the upper surface of such gate electrode structure.

As an example, the semiconductor device according to some exemplary embodiments of the present inventive concept may provide, by one process, an entire device in which four regions or more regions may have different threshold voltages. This may minimize cost and fabricating time wastage.

A semiconductor device according to some exemplary embodiments of the present inventive concept will be described in more detail with reference to FIG. 66. Components or elements described with reference to FIG. 66 having the same figure labels as those described above may be substantially the same as those described above, and thus duplicative descriptions may be omitted.

Figure 66:
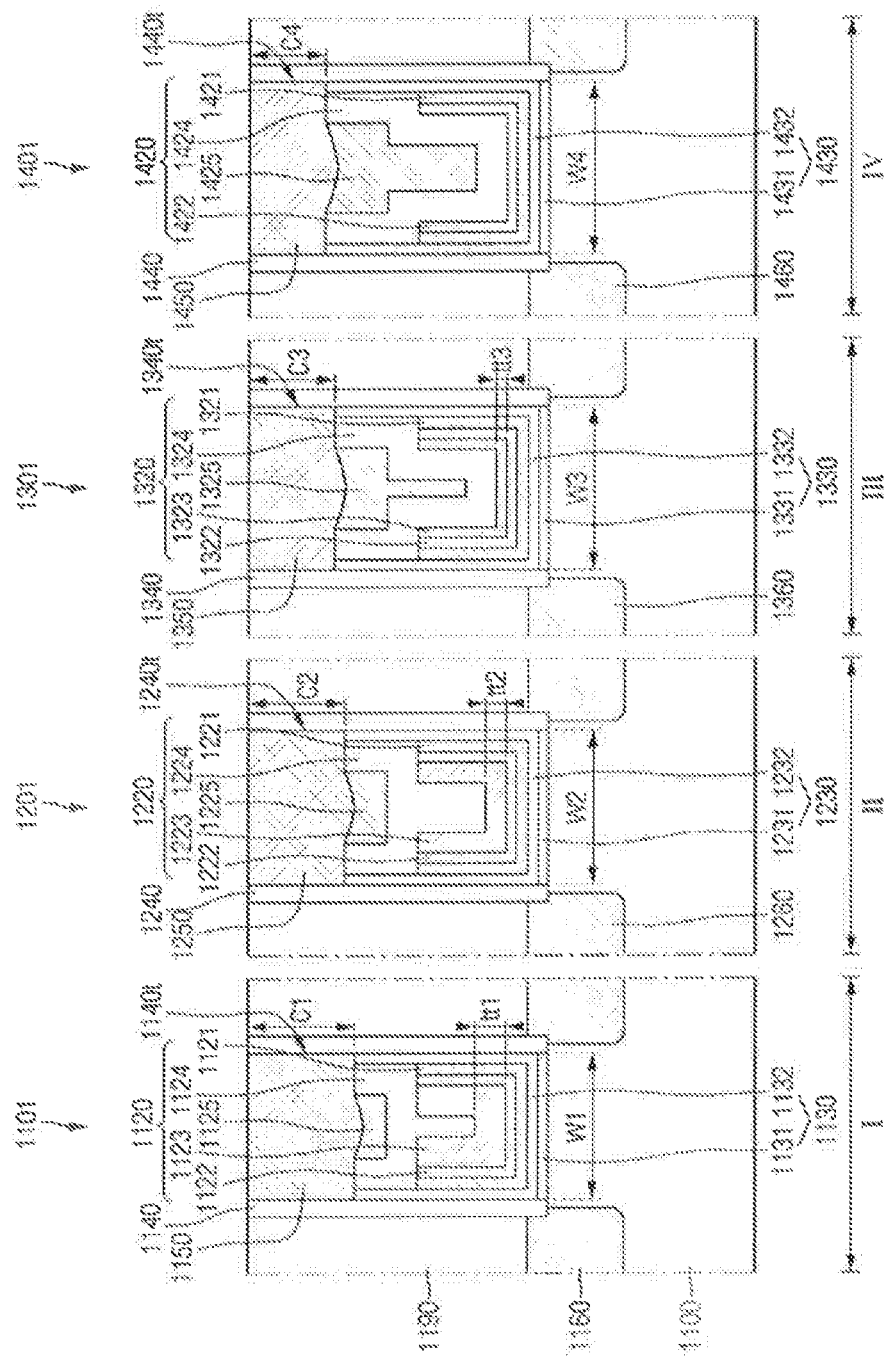
FIG. 66 is a cross-sectional view illustrating a semiconductor device according to an exemplary embodiment of the present inventive concept.

FIG. 66 is a cross-sectional view illustrating a semiconductor device according to an exemplary embodiment of the present inventive concept.

Referring to FIG. 66, the upper surfaces of the first filling film 1125 to the upper surface of the fourth filling film 1425 may be convex downward. The lower surfaces of the first capping film 1150 to the fourth capping film 1450 may be formed to be convex downward along the profile of the upper surface of the first filling film 1125 to the upper surface of the fourth filling film 1425.

As an example, the upper surface of the first filling film 1125 may have a shape extending in a gradually increased height from a downwardly convex portion toward a portion in direct contact with the first insertion film 1124. The upper surface of the second filling film 1225 may have a shape extending in a gradually increased height from a downwardly convex portion toward a portion in direct contact with the second insertion film 1224. The upper surface of the third filling film 1325 may have a shape extending in a gradually increased height from a downwardly convex portion toward a portion in direct contact with the third insertion film 1324. The upper surface of the fourth filling film 1425 may also have a shape extending in a gradually increased height from a downwardly convex portion toward a portion in direct contact with the fourth insertion film 1424.

This may be attributed to the fact that, in the process of etching the first filling film 1125 to the fourth filling film 1425, the etching rate may increase as the distance from the interface contacting the first insertion film 1124 to the fourth insertion film 1424 increases.

A semiconductor device according to some exemplary embodiments of the present inventive concept will be described in more detail below with reference to FIG. 67. Components or elements described with reference to FIG. 67 having the same figure labels as those described above may be substantially the same as those described above, and thus duplicative descriptions may be omitted.

Figure 67:
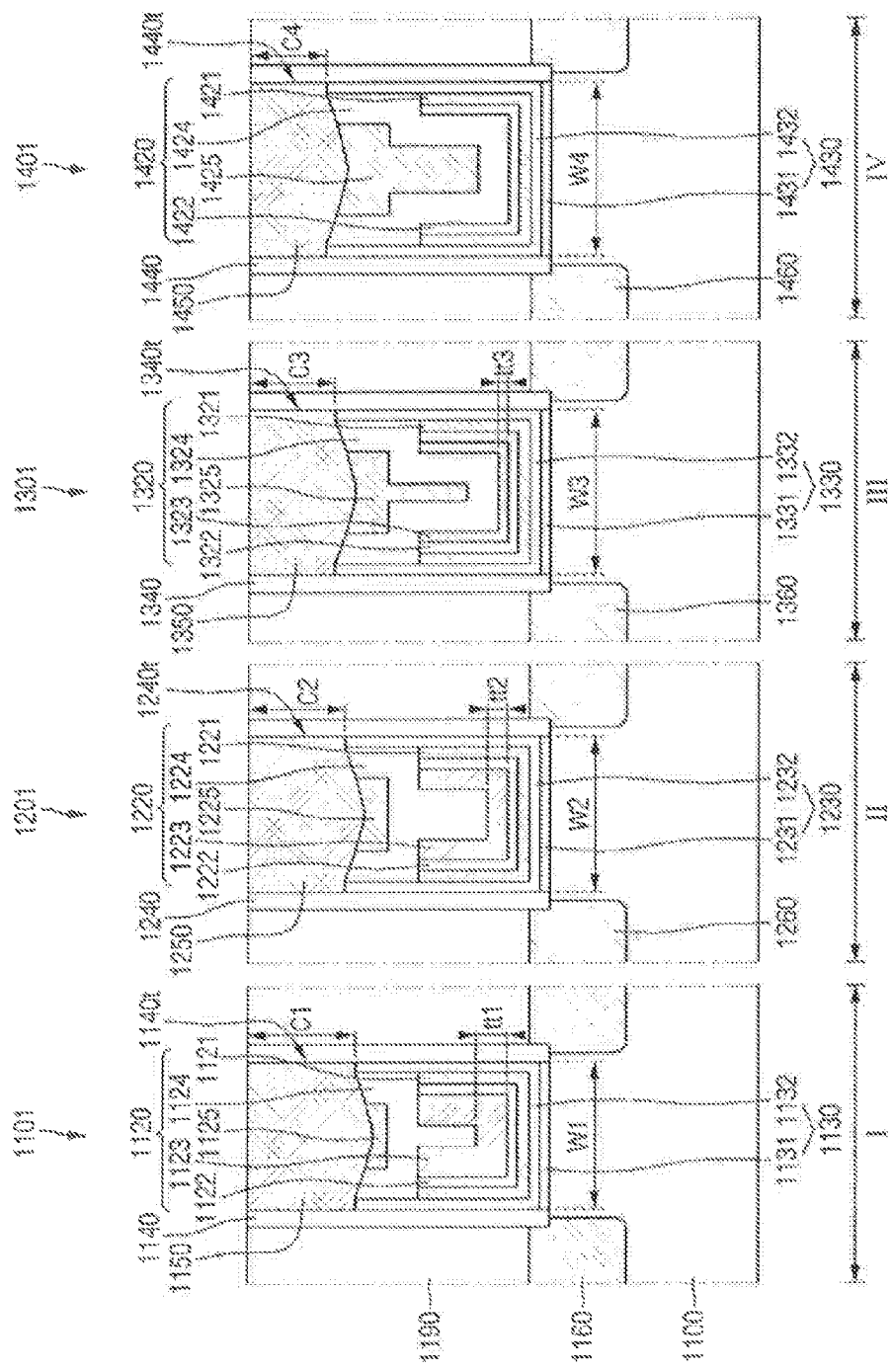
FIG. 67 is a cross-sectional view illustrating a semiconductor device according to an exemplary embodiment of the present inventive concept.

FIG. 67 is a cross-sectional view illustrating a semiconductor device according to an exemplary embodiment of the present inventive concept.

Referring to FIG. 67, in a semiconductor device according to some exemplary embodiments of the present inventive concept, the upper surfaces of the first filling film 1125 to the fourth filling film 1425 and the first insertion film 1124 to the fourth insertion film 1424 may be convex downward.

As an example, in the etching process of the gate electrode structure, since the first insertion film 1124 to the fourth insertion film 1424 as well as the first filling film 1125 to the fourth filling film 1425 are etched at substantially a same time, the upper surfaces of the first insertion film 1124 to the fourth insertion film 1424 as well as the upper surfaces of the first filling film 1125 to the fourth filling film 1425 may be convex downward.

As an example, the upper surfaces of the first filling film 1125 to the fourth filling film 1425 and the first insertion film 1124 to the fourth insertion film 1424 may be convex downward, and the downward convex shape may be continuous. As an example, the upper surface may become higher as they approach closer toward the interface of the first insertion film 1124 to the fourth insertion film 1424, with respect to the downwardly convex portions of the first filling film 1125 to the fourth filling film 1425. Further, the upper surfaces of the first insertion film 1124 to the fourth insertion film 1424 may become higher as they approach closer from the portions contacting the first filling film 1125 to the fourth filling film 1425 toward the portion contacting the first high-k insulating film 1132 to the fourth high-k dielectric film 1432. As an example, the upper surfaces of the first insertion film 1124 to the fourth insertion film 1424 may be gradually increased toward both sides with respect to the first filling film 1125 to the fourth filling film 1425.

A semiconductor device according to some exemplary embodiments of the present inventive concept will be described in more detail below with reference to FIG. 68. Components or elements described with reference to FIG. 68 having the same figure labels as those described above may be substantially the same as those described above, and thus duplicative descriptions may be omitted.

Figure 68:
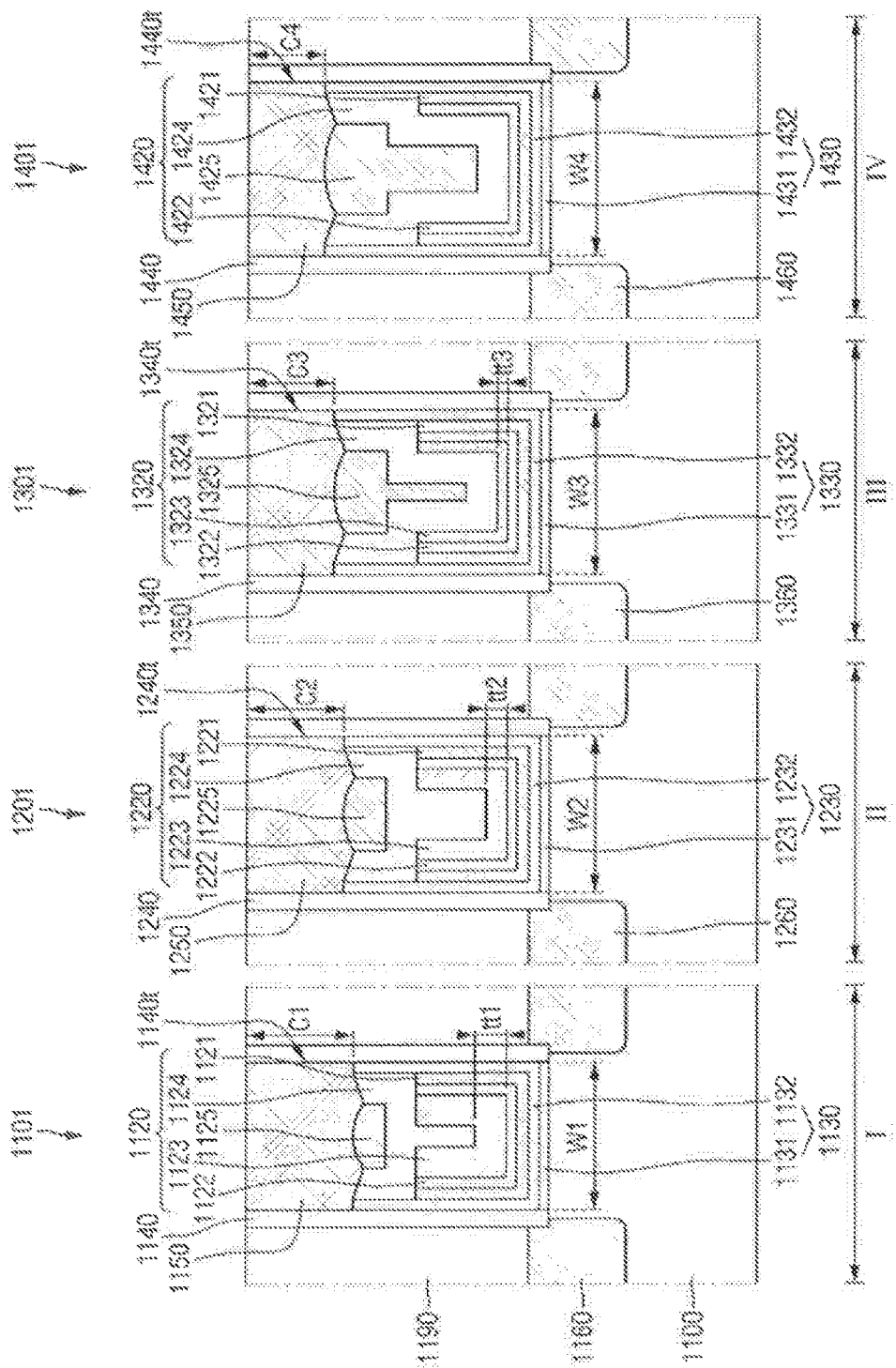
FIG. 68 is a cross-sectional view illustrating a semiconductor device according to an exemplary embodiment of the present inventive concept.

FIG. 68 is a cross-sectional view illustrating a semiconductor device according to an exemplary embodiment of the present inventive concept.

Referring to FIG. 68, in a semiconductor device according to some exemplary embodiments of the present inventive concept, the upper surfaces of the first filling film 1125 to the fourth filling film 1425 may be convex upward.

The upper surfaces of the first insertion film 1124 to the fourth insertion film 1424 may be substantially the same as those described above with reference, for example, to FIG. 5. As an example, the upper surfaces of the first insertion film 1124 to the fourth insertion film 1424 may become lower as they approach closer from the first high-k dielectric film 1132 to the fourth high-k dielectric film 1432 toward the first filling film 1125 to the fourth filling film 1425.

The upper surface of the first filling film 1125 to the upper surface of the fourth filling film 1425 may be lowered toward both sides with respect to the convex portion as the center. As an example, the upper surface of the first filling film 1125 to the upper surface of the fourth filling film 1425 may be lowered as they approach closer toward the portion contacting the first insertion film 1124 to the fourth insertion film 1424.

This may vary depending on the type of etchant used in the etching process. As an example, a shape (see, e.g., the shape illustrated in FIG. 68) may be formed when the etchant has such a property that the etching rate for the first filling film 1125 to the fourth filling film 1425 increases at a closer distance to the interface of the first insertion film 1124 to the fourth insertion film 1424.

A semiconductor device according to some exemplary embodiments of the present inventive concept will be described in more detail below with reference to FIG. 69. Components or elements described with reference to FIG. 69 having the same figure labels as those described above may be substantially the same as those described above, and thus duplicative descriptions may be omitted.

Figure 69:
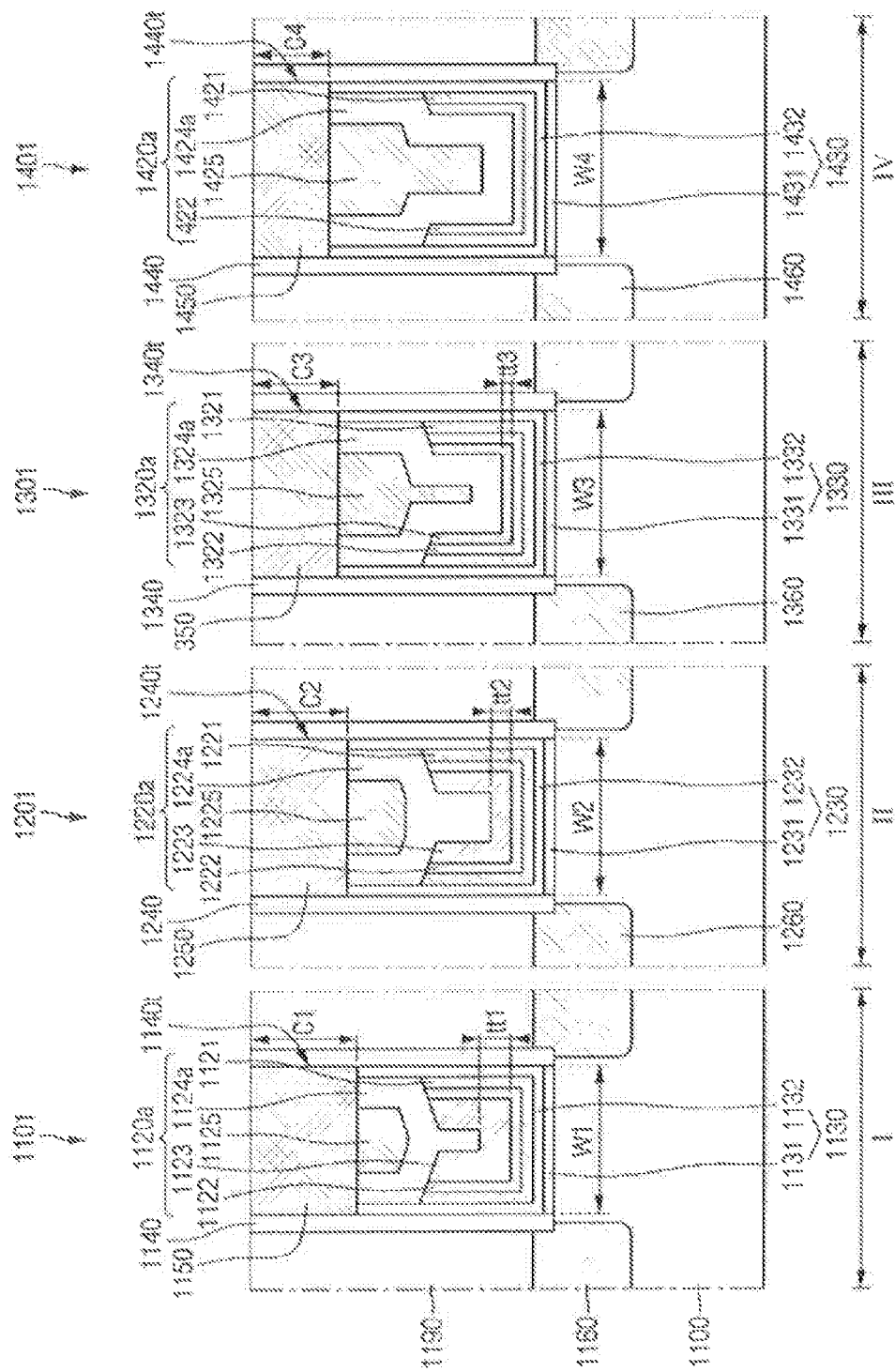
FIG. 69 is a cross-sectional view illustrating a semiconductor device according to an exemplary embodiment of the present inventive concept.

FIG. 69 is a cross-sectional view illustrating a semiconductor device according to an exemplary embodiment of the present inventive concept.

Referring to FIG. 69, the first gate electrode structure 1120*a* to the fourth gate electrode structure 1420*a* of the semiconductor device according to some exemplary embodiments of the present inventive concept may include a first insertion film 1124*a* to a fourth insertion film 1424*a*, respectively.

The upper surfaces of the first lower TiN film 1121 to the fourth lower TiN film 1421, the first etch stop film 1122 to the fourth etch stop film 1422, and the first work function adjustment film 1123 to the third work function adjustment film 1323 of the first gate electrode structure 1120*a* to the fourth gate electrode structure 1420*a* of the semiconductor device according to some exemplary embodiments of the present inventive concept may each form oblique angles with respect to a lower surface of the substrate 1100. As an example, the upper surfaces of the first lower TiN film 1121 to the fourth lower TiN film 1421, the first etch stop film 1122 to the fourth etch stop film 1422, and the first work function adjustment film 1123 to the third work function adjustment film 1323 may be lowered as they are distanced further from the sidewalls of the first trench 1140t to the fourth trench 1440t.

The first gate electrode structure 1124a to the fourth gate electrode structure 1424a may be formed along a profile of the upper surfaces of the first lower TiN film 1121 to the fourth lower TiN film 1421, the first etch stop film 1122 to the fourth etch stop film 1422, and the first work function adjustment film 1123 to the third work function adjustment film 1323. Thus, the lower surface and a portion of the upper surface of the first insertion film 1124a to the fourth insertion film 1424a may each form oblique angles with respect to a lower surface of the substrate 1100.

The oblique angles may be attributable to the difference in the etching rate in the process of etching the first lower TiN film 1121 to the fourth lower TiN film 1421, the first etch stop film 1122 to the fourth etch stop film 1422, and the first work function adjustment film 1123 to the third work function adjustment film 1323.

A semiconductor device according to some exemplary embodiments of the present inventive concept will be described in more detail below with reference to FIG. 70. Components or elements described with reference to FIG. 70 having the same figure labels as those described above may be substantially the same as those described above, and thus duplicative descriptions may be omitted.

Figure 70:
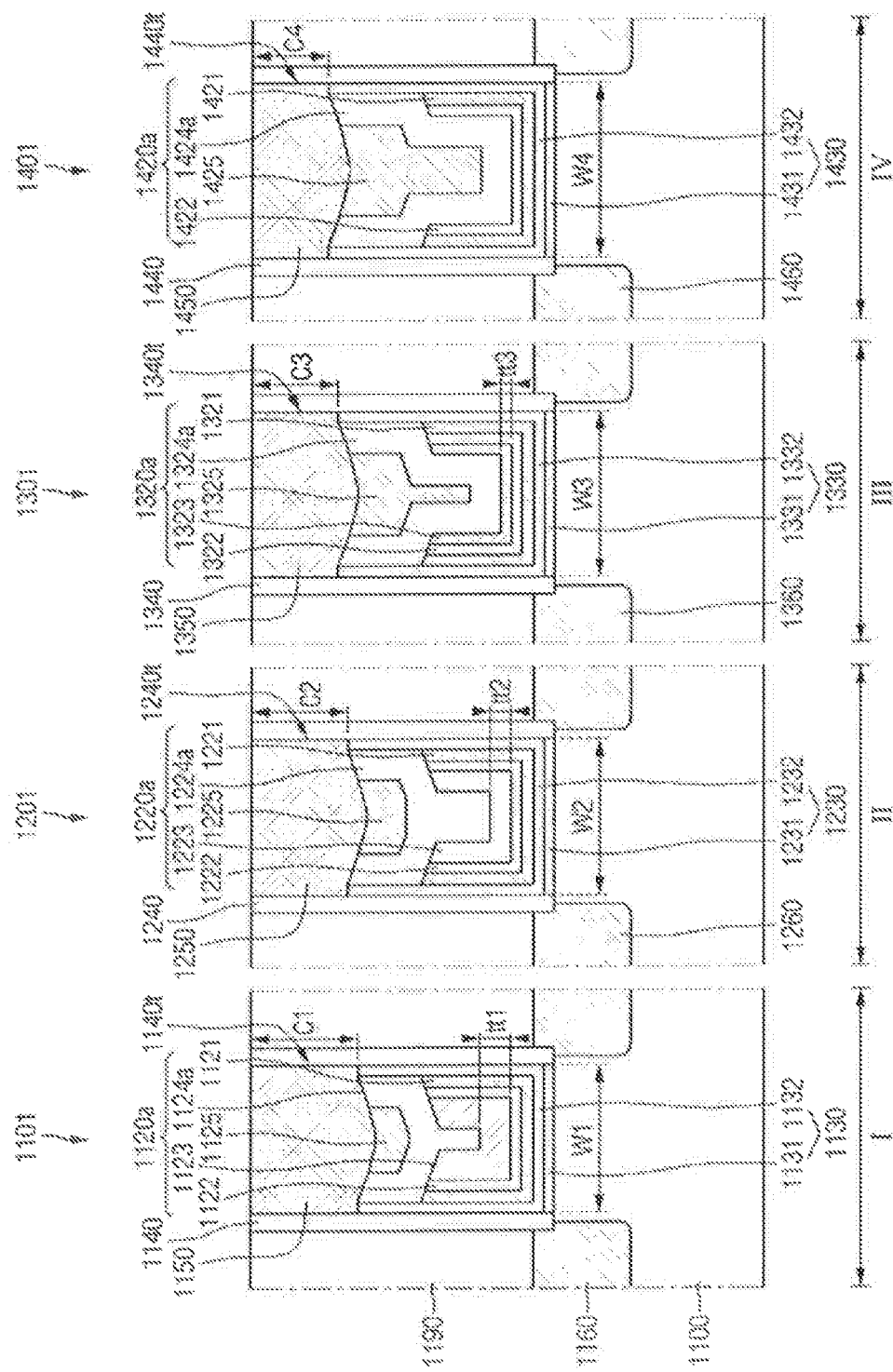
FIG. 70 is a perspective view illustrating a semiconductor device according to an exemplary embodiment of the present inventive concept.

FIG. 70 is a perspective view illustrating a semiconductor device according to an exemplary embodiment of the present inventive concept.

Referring to FIG. 70, the first filling film 1125 to the fourth filling film 1425 and the first insertion film 1124a to the fourth insertion film 1424a of the first gate electrode structure 1120a to the fourth gate electrode structures 1420a of the semiconductor device according to some exemplary embodiments of the present inventive concept may include both the shape characteristic described with reference to FIG. 5 and the shape characteristic described with reference to FIG. 7.

As an example, the first insertion film 1124a to the fourth insertion film 1424a may be formed on the oblique upper surfaces of the first lower TiN film 1121 to the fourth lower TiN film 1421, the first etch stop film 1122 to the fourth etch stop film 1422, and the first work function adjustment film 1123 to the third work function adjustment film 1323. The upper surfaces of the first filling film 1125 to the fourth filling film 1425 and the first insertion film 1124 to the fourth insertion film 1424 may be convex downward.

A semiconductor device according to some exemplary embodiments of the present inventive concept will be described in more detail below with reference to FIG. 71. Components or elements described with reference to FIG. 71 having the same figure labels as those described above may be substantially the same as those described above, and thus duplicative descriptions may be omitted.

Figure 71:
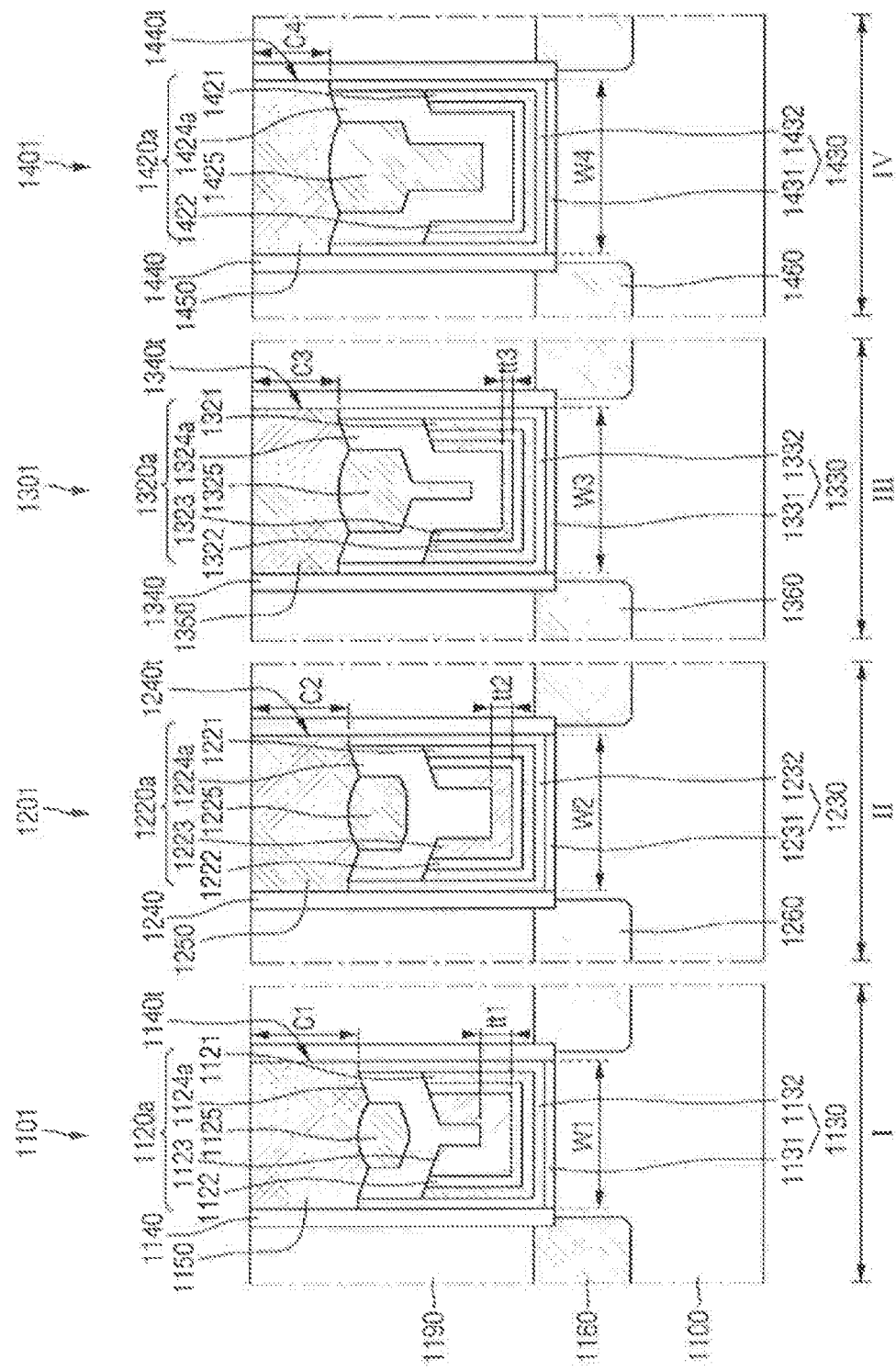
FIG. 71 is a perspective view illustrating a semiconductor device according to an exemplary embodiment of the present inventive concept.

FIG. 71 is a perspective view illustrating a semiconductor device according to an exemplary embodiment of the present inventive concept.

Referring to FIG. 71, the first filling film 1125 to the fourth filling film 1425 and the first insertion film 1124a to the fourth insertion film 1424a of the first gate electrode structure 1120a to the fourth gate electrode structures 1420a of the semiconductor device according to some exemplary embodiments of the present inventive concept may include both the shape characteristic described with reference to FIG. 6 and the shape characteristic described with reference to FIG. 7.

As an example, the first insertion film 1124a to the fourth insertion film 1424a may be formed on the oblique upper surfaces of the first lower IN film 1121 to the fourth lower TiN film 1421, the first etch stop film 1122 to the fourth etch stop film 1422, and the first work function adjustment film 1223 to the third work function adjustment film 1323. The first filling film 1125 to the fourth filling film 1425 may be convex upward, and the upper surfaces of the first insertion film 1124 to the fourth insertion film 1424 may be convex downward.

A semiconductor device according to some exemplary embodiments of the present inventive concept will be described in more detail below with reference to FIG. 72. Components or elements described with reference to FIG. 72 having the same figure labels as those described above may be substantially the same as those described above, and thus duplicative descriptions may be omitted.

Figure 72:
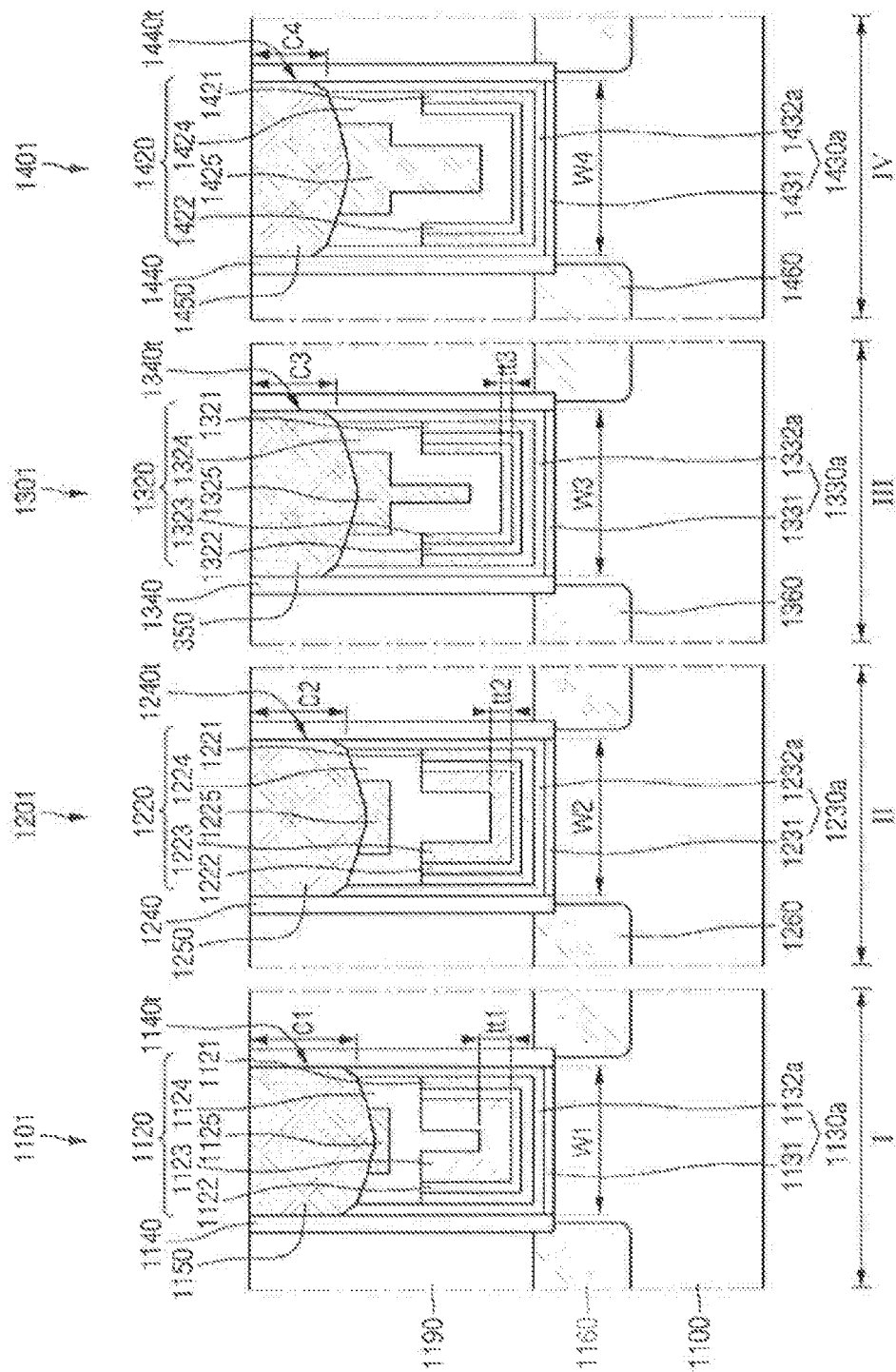
FIG. 72 is a perspective view illustrating a semiconductor device according to an exemplary embodiment of the present inventive concept.

FIG. 72 is a perspective view illustrating a semiconductor device according to an exemplary embodiment of the present inventive concept.

Referring to FIG. 72, in a semiconductor device according to some exemplary embodiments of the present inventive concept, the upper surfaces of the first filling film 1125 to the fourth filling film 1425, the first insertion film 1124 to the fourth insertion film 1424, and the first gate insulating film 1130a to the fourth gate insulating film 1430a may be convex downward.

As an example, the first high-k insulating film 1132a to the fourth high-k insulating film 1432a among the first gate insulating film 1130a to the fourth gate insulating film 1430a may protrude within the first trench 1140t to the fourth trench 1440t. As an example, the uppermost portions of the upper surfaces of the first high-k insulating film 1132a to the fourth high-k insulating film 1432a may be higher than the uppermost portions of the upper surfaces of the first filling film 1125 to the fourth filling film 1425 and the first insertion film 1124 to the fourth insertion film 1424.

The first high-k insulating film 1132a to the fourth high-k insulating film 1432a may be lowered as they approach closer toward the interface of the first insertion film 1124 to the fourth insertion film 1424, respectively. As an example, an inclined upper surface may be formed by an etching process. This may be attributed to the difference in etching rate.

A semiconductor device according to some exemplary embodiments of the present inventive concept will be described in more detail below with reference to FIG. 73. Components or elements described with reference to FIG. 73 having the same figure labels as those described above may be substantially the same as those described above, and thus duplicative descriptions may be omitted.

Figure 73:
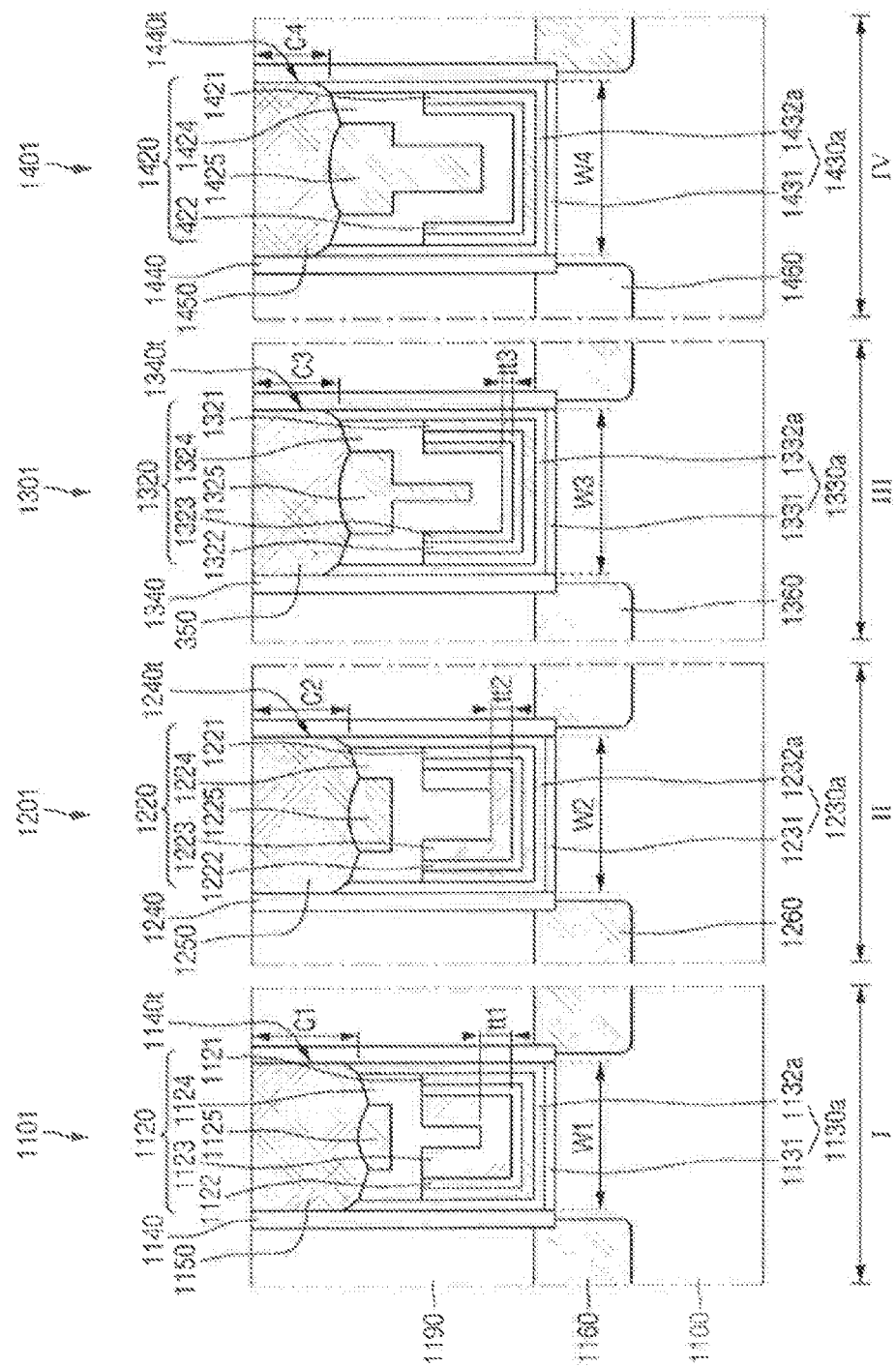
FIG. 73 is a perspective view illustrating a semiconductor device according to an exemplary embodiment of the present inventive concept.

FIG. 73 is a perspective view illustrating a semiconductor device according to an exemplary embodiment of the present inventive concept.

Referring to FIG. 73, in a semiconductor device according to some exemplary embodiments of the present inventive concept, the first filling film 1125 to the fourth filling film 1425 may be convex upward, and the upper surfaces of the first insertion film 1124 to the fourth insertion film 1424 and the first gate insulating film 1130a to the fourth gate insulating film 1430a may be convex downward.

The convex shapes may be attributable to the characteristics of materials and the characteristics of the etchant of the first filling film 1125 to the fourth filling film 1425, the first insertion film 1124 to the fourth insertion film 1424, and the first gate insulating film 1130a to the fourth gate insulating film 1430a. As an example, as a result of the etchant, the first filling film 1125 to the fourth filling film 1425 may be convex upward, and the remaining first insertion film 1124 to the fourth insertion film 1424 and the first gate insulating film 1130a to the fourth gate insulating film 1430a may be convex downward.

A semiconductor device according to some exemplary embodiments of the present inventive concept will be described in more detail below with reference to FIGS. 74 to 79. Components or elements described with reference to FIGS. 74 to 79 having the same figure labels as those described above may be substantially the same as those described above, and thus duplicative descriptions may be omitted. As an example, the exemplary embodiments of the present inventive concept described in more detail below with reference to FIGS. 74 to 79 may be substantially to the same as the exemplary embodiments of the present inventive concept described with reference to FIGS. 63 to 73 except for the fin-type pattern.

Figure 74:
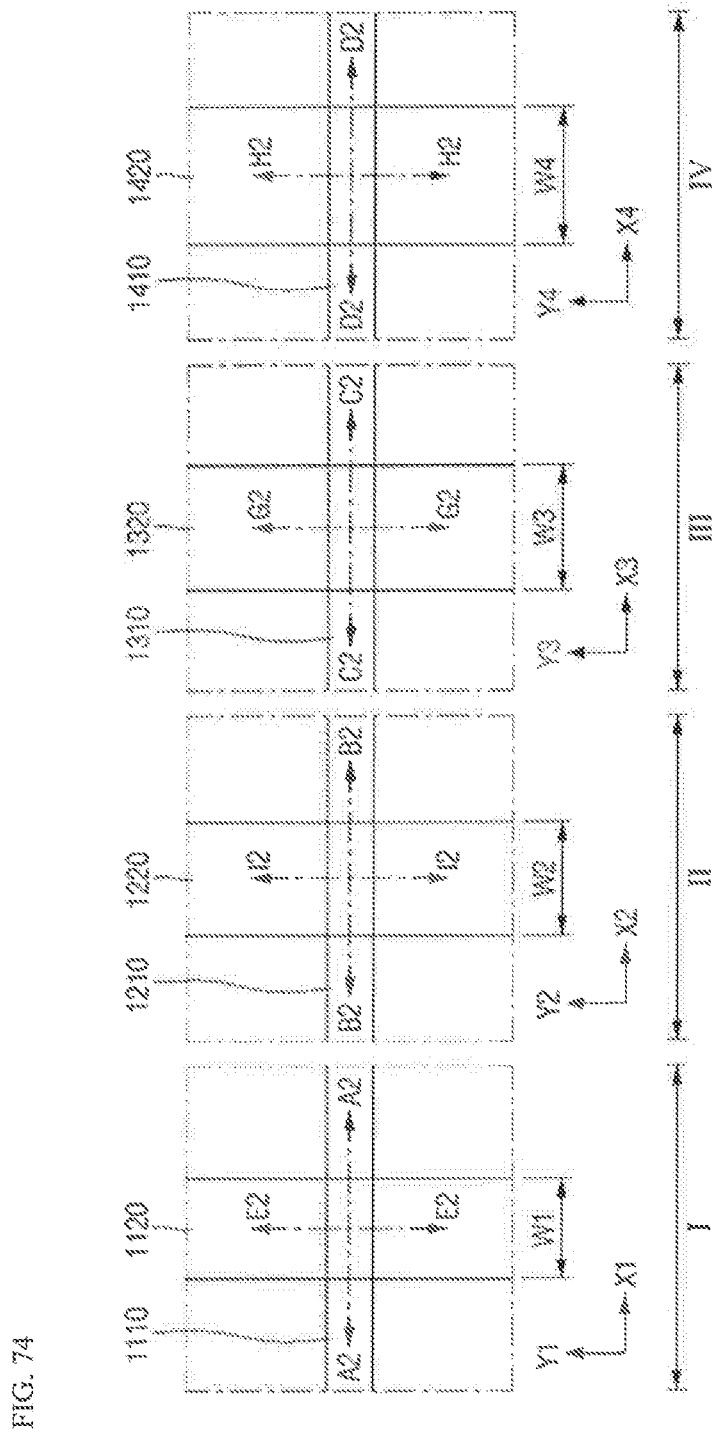
FIG. 74 is a layout diagram illustrating a semiconductor device according to an exemplary embodiment of the present inventive concept.
Figure 75:
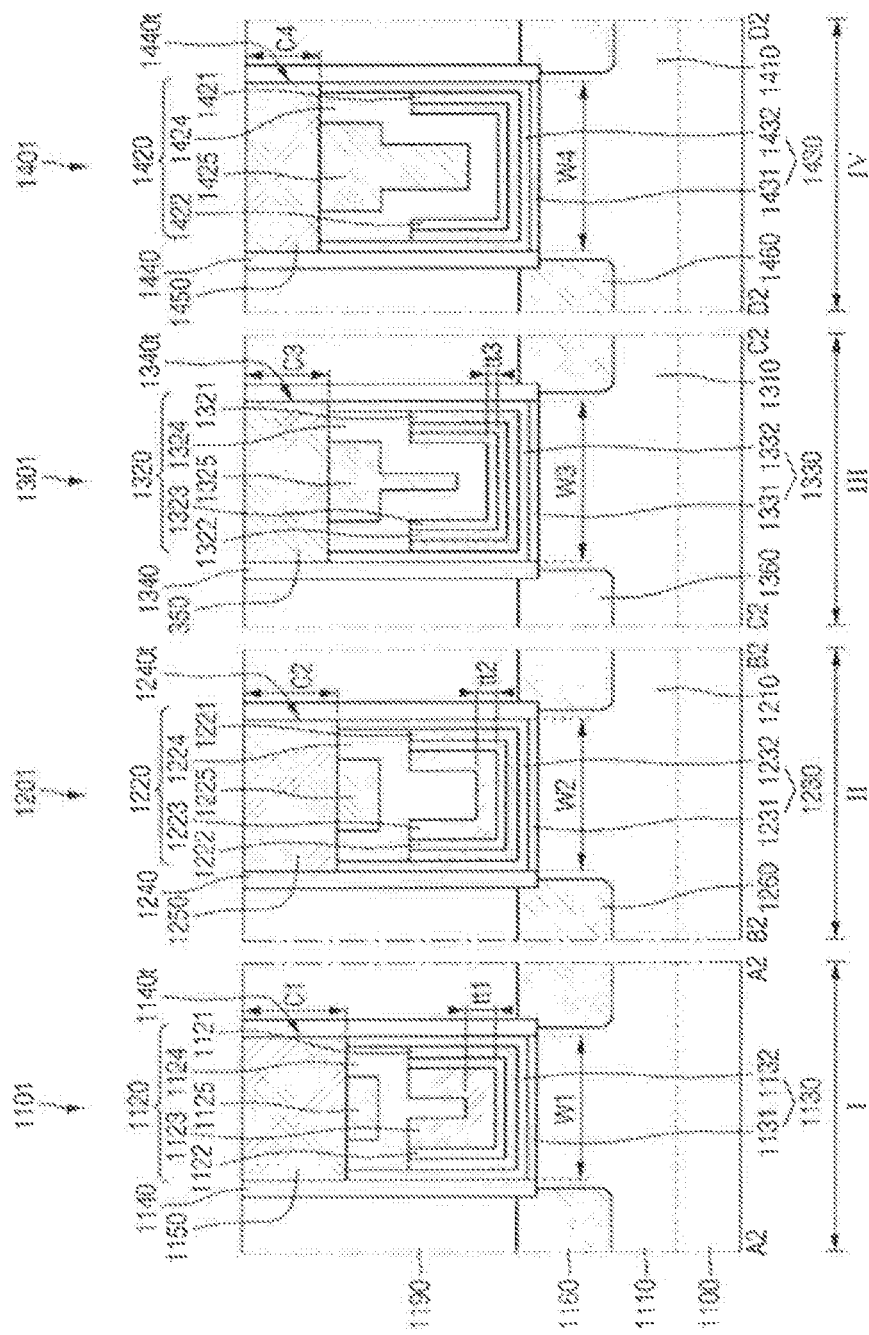
FIG. 75 are cross-sectional views taken on lines A2-A2, B2-B2, C2-C2 and D2-D2 of FIG. 74.
Figure 76:
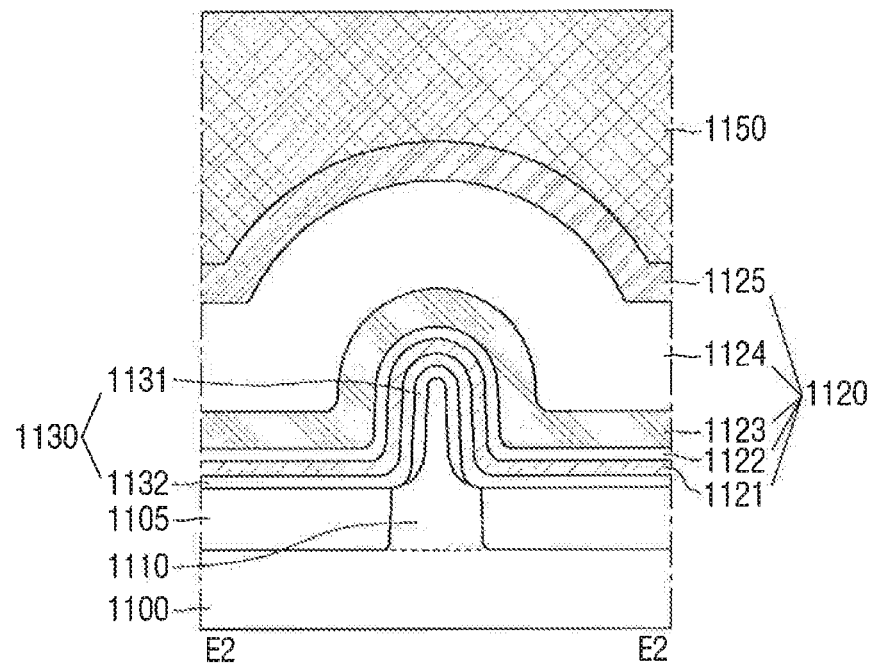
FIG. 76 is a cross-sectional view taken on line E2-E2 of FIG. 74.
Figure 77:
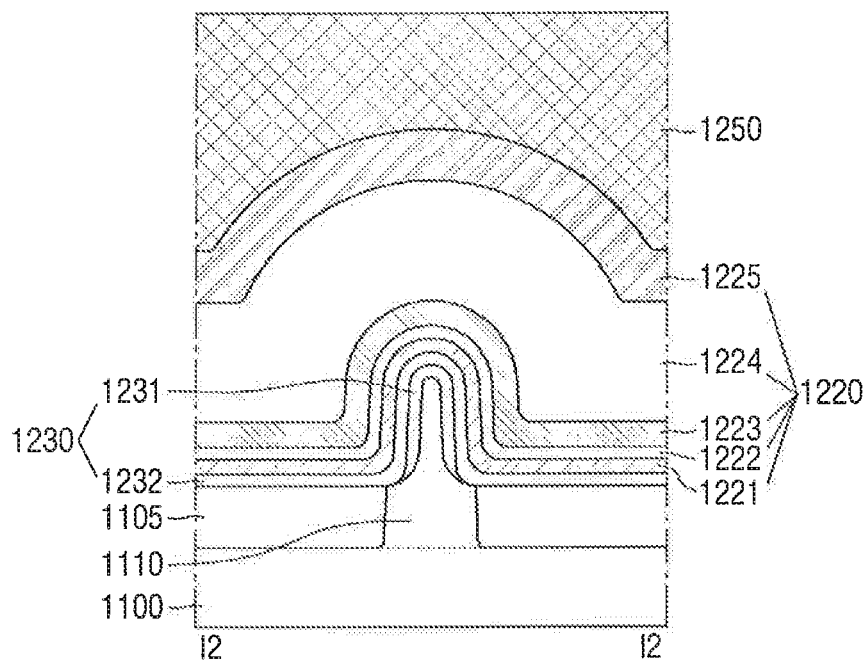
FIG. 77 is a cross-sectional view taken on line F2-F2 of FIG. 74.
Figure 78:
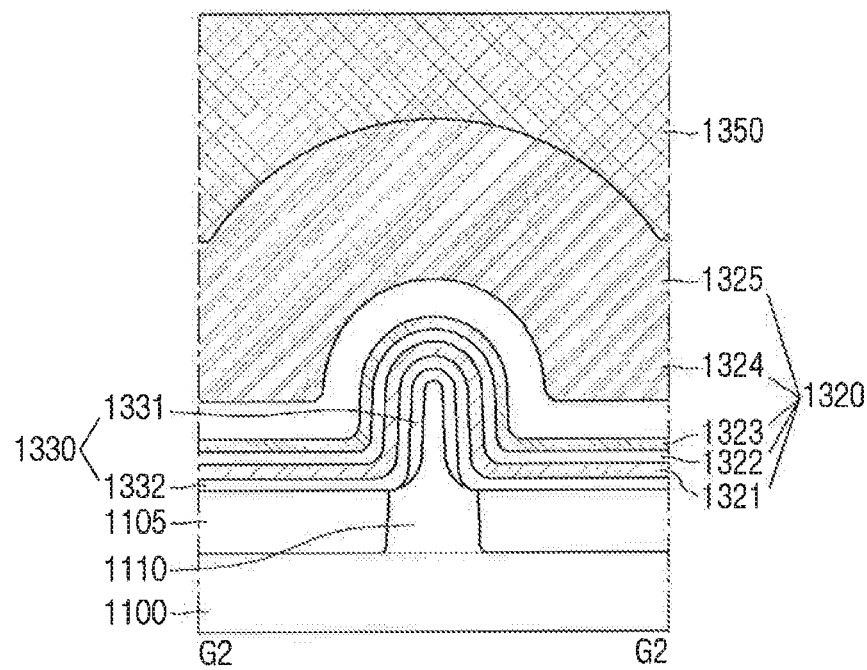
FIG. 78 is a cross-sectional view taken on line G2-G2 of FIG. 74.
Figure 79:
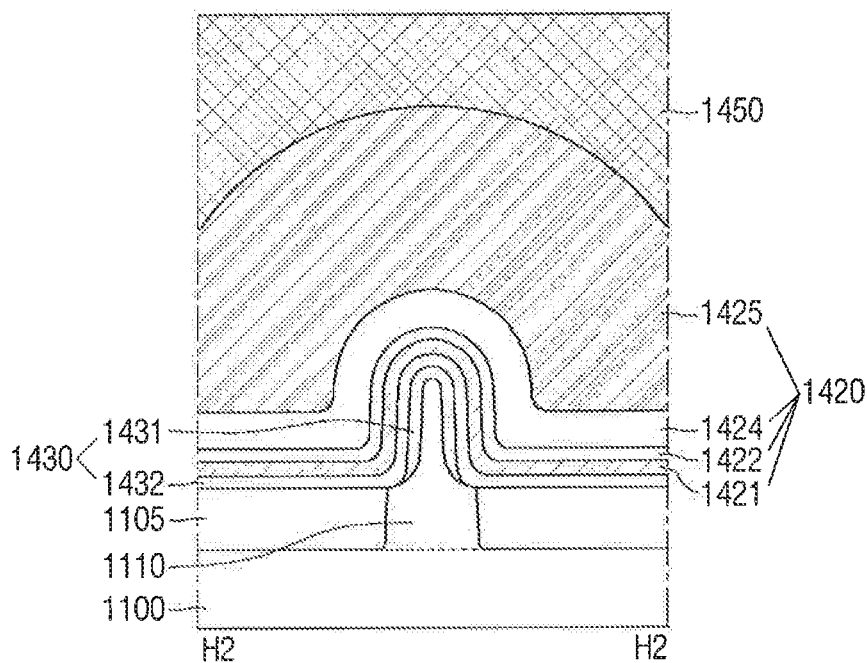
FIG. 79 is a cross-sectional view taken on line H2-H2 of FIG. 74.

FIG. 74 is a layout diagram illustrating a semiconductor device according to an exemplary embodiment of the present inventive concept. FIG. 75 is cross-sectional views taken on lines A2-A2, B2-B2, C2-C2, and D2-D2 in FIG. 74. FIG. 76 is a cross-sectional view taken on line E2-E2 of FIG. 74, and FIG. 77 is a cross-sectional view taken on line 12-12 of FIG. 74. FIG. 78 is a cross-sectional view taken on line G2-G2 of FIG. 74, and FIG. 79 is a cross-sectional view taken on line H2-H2 of FIG. 74.

Referring to FIGS. 74 to 79, in a semiconductor device according to some exemplary embodiments of the present inventive concept, each of the first and second transistors 1101 and 1201 may be p-type fin-type transistors, and the third and fourth transistors 1301 and 1401 may be n-type fin-type transistors.

The first to fourth transistors 1101, 1201, 1301, and 1401 may include first to fourth fin-type patterns 1110, 1210, 1310, and 1410, respectively.

The first fin type pattern 1110 may be formed in the first region I, the second fin type pattern 1210 may be formed in the second region II, the third fin type pattern 1310 may be formed in the third region III, and the fourth fin type pattern 1410 may be formed in the fourth region IV.

Each of the first to fourth fin-type patterns 1110, 1210, 1310, and 1410 may protrude from the substrate 1100.

The first fin-type pattern 1110 may extend in a first direction X1. The second fin-type pattern 1210 may extend in a second direction X2. The third fin-type pattern 1310 may extend in a third direction X3. The fourth fin-type pattern 1410 may extend in a fourth direction X4.

The first to fourth fin-type patterns 1110, 1210, 1310, and 1410 may be a part of the substrate 1100, and may include an epitaxial layer grown from the substrate 1100.

Each of the first to fourth fin-type patterns 1110, 1210, 1310, and 1410 may include an element semiconductor material such as silicon or germanium, for example. Further, each of the first to fourth fin-type patterns 1110, 1210, 1310, and 1410 may include a compound semiconductor such as, for example, Group IV-IV compound semiconductor or Group III-V compound semiconductor.

Considering the Group IV-IV compound semiconductor as an example, each of the first to fourth fin-type patterns 1110, 1210, 1310, and 1410 may be a binary compound or a ternary compound including at least two or more of carbon (C), silicon (Si), germanium (Ge) or tin (Sn), or these compounds doped with Group IV element.

Considering the Group III-V compound semiconductor as an example, each of the first to fourth fin-type patterns 1110, 1210, 1310, and 1410 may be a binary compound, a ternary compound or a quaternary compound which is formed by a combination of a Group III element which may be at least one of aluminum (Al), gallium (Ga), or indium (In), with a Group V element which may be one of phosphorus (P), arsenic (As) or antimony (Sb).

In the semiconductor device according to some exemplary embodiments of the present inventive concept, the first to fourth fin-type patterns 1110, 1210, 1310, and 1410 may each be silicon fin-type patterns; however, exemplary embodiments of the present inventive concept are not limited thereto.

As an example, since the field insulating film 1105 may substantially cover a portion of a side surface of the first fin-type pattern 1110, the first fin-type pattern 1110 may protrude further than the field insulating film 1105 formed on the substrate 1100.

The field insulating film 1105 may include, for example, oxide film, nitride film, oxynitride film, or a film combining the above.

A field liner may be included between the field insulator 1105 and the first fin-type pattern 1110 to the fourth fin-type pattern 1410. The field liner may be formed between the field insulating film 1105 and the first fin-type pattern 1110 to the fourth fin-type pattern 1410 and between the field insulating film 1105 and the substrate 1100.

The field liner may include at least one of, for example, polysilicon, amorphous silicon, silicon oxynitride, silicon nitride, or silicon oxide. The field liner may include a double film. As an example, the field liner may include a first field liner contacting the substrate 1100 and first fin-type pattern 1110 to the fourth fin-type pattern 1410, and a second field liner formed on the first field liner. The first field liner may include, for example, polysilicon or amorphous silicon. For example, the second field liner may include silicon oxide.

The first gate spacer 1140 may be formed on the first fin-type pattern 1110 which protrudes above the field insulating film 1105. The first gate spacer 1140 may extend in a fifth direction Y1, and may intersect the first fin-type pattern 1110.

Since the first trench 1140t may be defined by the first gate spacer 1140, the first trench 1140t may extend in the fifth direction Y1.

Similarly, a second gate spacer 1240 may be formed on the second fin-type pattern 1210, and may extend in a sixth direction Y2. A third gate spacer 1340 may be formed on the third fin-type pattern 1310, and may extend in a seventh direction Y3. A fourth gate spacer 1440 may be formed on the fourth fin-type pattern 1410, and may extend in an eighth direction Y4.

The first gate insulating film 1130 may be formed on the field insulating film 1105 and the first fin-type pattern 1110. The first gate insulating film 1130 may be formed along the upper surface of the field insulating film 1105 and a profile of the first fin-type pattern 1110.

The first interfacial layer 1131 may be formed on the first fin-type pattern 1110. The first interfacial layer 1131 may be formed along the profile of the first fin-type pattern 1110 protruding upward higher than the upper surface of the field insulating film 1105.

The first interfacial layer 1131 might not be formed on the upper surface of the field insulating film 1105; however, exemplary embodiments of the present inventive concept are not limited thereto. According to a formation method of the first interfacial layer 1131, the first interfacial layer 1131 may also be formed along the upper surface of the field insulating film 1105.

The first high-k insulating film 1132 may be formed on the first interfacial layer 1131, and formed along the profile of the first fin-type pattern 1110 and the upper surface of the field insulating film 1105.

The second to fourth gate insulating films 1230, 1330, and 1430 may be substantially the same as the first gate insulating film 1130, and thus duplicative descriptions may be omitted.

The first gate electrode structure 1120 may be formed on the first gate insulating film 1130 and may intersect the first fin-type pattern 1110. Since the first gate electrode structure 1120 may be formed in the first trench 1140*t*, the first gate electrode structure 1120 may extend in the fifth direction Y1.

The first lower TiN film 1121, the first etch stop film 1122, the first work function adjustment film 1123, and the first insertion film 1124 may be formed along the profile of the first gate insulating film 1130.

The second gate electrode structure 1220 may be formed on the second gate insulating film 1230, and may intersect the second fin-type pattern 1210. Since the second gate electrode structure 1220 may be formed in the second trench 1240*t*, the second gate electrode structure 1220 may extend in the sixth direction Y2.

The third gate electrode structure 1320 may be formed on the third gate insulating film 1330, and may intersect the third fin-type pattern 1310. Since the third gate electrode structure 1320 may be formed in the third trench 1340*t*, the third gate electrode structure 1320 may extend in the seventh direction Y3.

The fourth gate electrode structure 1420 may be formed on the fourth gate insulating film 1430, and may intersect the fourth fin-type pattern 1410. Since the fourth gate electrode structure 1420 may be formed in the fourth trench 1440*t*, the fourth gate electrode structure 1420 may extend in the eighth direction Y4.

The lower TiN film, the etch stop film, the work function adjustment film, and the insertion film included in the second to fourth gate electrode structures 1220, 1320, and 1420 may be substantially to the same as the first lower TiN film 1121, the first etch film 1122, the first work function adjustment film 1123, and the first insertion film 1124, and thus duplicative descriptions may be omitted.

The first source/drain 1150 may be formed in the first fin-type pattern 1110, the second source/drain 1250 may be formed in the second fin-type pattern 1210, the third source/drain 1350 may be formed in the third fin-type pattern 1310, and a fourth source/drain 1450 may be formed in the fourth fin-type pattern 1410.

A semiconductor device according to some exemplary embodiments of the present inventive concept will be described in more detail below with reference to FIG. 80. Components or elements described with reference to FIG. 80 having the same figure labels as those described above may be substantially the same as those described above, and thus duplicative descriptions may be omitted. As an example, the exemplary embodiments of the present inventive concept described with reference to FIG. 80 may be substantially the same, except that the fifth region V is added, to the exemplary embodiments of the present inventive concept described with reference to FIG. 63. Although the first region I of FIG. 63 is not shown in FIG. 80, this is not shown for clarity of description, and the first region I might not be omitted in the exemplary embodiments of the present inventive concept described with reference to FIG. 80. Thus the first region I described with reference to FIG. 63 may be included in the exemplary embodiments of the present inventive concept described with reference to FIG. 80.

Figure 80:
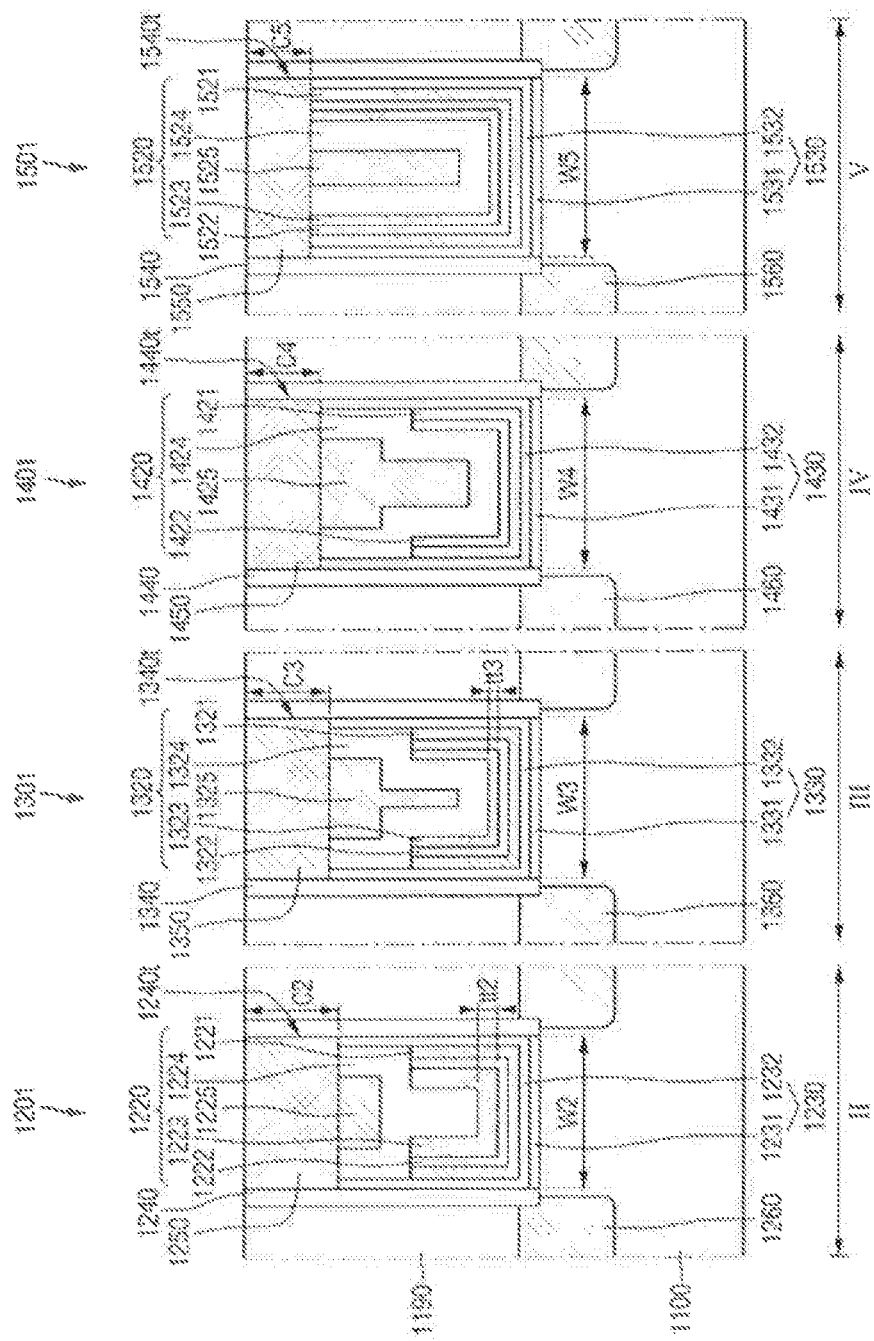
FIG. 80 is a cross-sectional view illustrating a semiconductor device according to an exemplary embodiment of the present inventive concept.

FIG. 80 is a cross-sectional view illustrating a semiconductor device according to an exemplary embodiment of the present inventive concept.

Referring to FIG. 80, the substrate 1100 may further include a fifth region V. The fifth region V may be a region separated from the first to fourth region I, II, III, and IV, or may be a region connected to another region.

In the fifth region V, the fifth transistor 1501 may be a p-type transistor or an n-type transistor. The fifth transistor 1501 may include a fifth gate insulating film 1530, a fifth gate electrode structure 1520, a fifth gate spacer 1540, and a fifth source/drain 1560.

The fifth gate spacer 1540 may be formed on the substrate 1100 in the fifth region I. The fifth gate spacer 1540 may define a fifth trench 1540*t*. For example, sidewalls of the fifth trench 1540*t* may be defined by the fifth gate spacer 1540 and a bottom surface thereof may be defined by an upper surface of the substrate 1500.

While the fifth gate spacers 1540 may each be a single film, exemplary embodiments of the present inventive concept are not limited thereto, and each fifth gate spacer 1540 may include a plurality of films. When the fifth gate spacers 1540 include a plurality of films, at least one film among the films included in each of the fifth gate spacers 1540 may include a low-k dielectric material such as silicon oxycarbonitride (SiOCN).

Further, when the fifth gate spacer 1540 is a plurality of films, at least one film among the films included in the fifth gate spacer 1540 may have an L-shape.

The fifth trench 1540*t* may have a fifth width W5. The fifth width W5 may be greater than the fourth width W4. As an example, the fifth width W5 may be greater than the first width W1 to fourth width W4.

The fifth gate insulating film 1530 may be formed on the substrate 1100 of the fifth region V. It may extend along the sidewalls and the bottom surface of the fifth trench 1540*t*. The fifth gate insulating film 1530 may include a fifth interfacial layer 1531 and a fifth high-k insulating film 1532. The fifth interfacial layer 1531 may be formed on the substrate 1100. The fifth interfacial layer 1531 may be formed on the bottom surface of the fifth trench 1540*t*.

The fifth high-k insulating film 1532 may be formed on the fifth interfacial layer 1531. The fifth high-k insulating film 1532 may be formed along the bottom surface and sidewalls of the fifth trench 1540*t*.

The fifth interfacial layer 1531 need not be formed on the sidewalls of the fifth trench 1540*t*, but exemplary embodiments of the present inventive concept are not limited thereto. According to a formation method of the fifth interfacial layer 1531, the fifth interfacial layer 1531 may also be formed on the sidewalls of the fifth trench 1540*t*.

The fifth interfacial layer 1531 may, for example, include silicon oxide, but exemplary embodiments of the present inventive concept are not limited thereto. For example, the fifth high-k insulating film 1532 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The fifth gate electrode structure 1520 may be formed on the fifth gate insulating film 1530. The fifth gate electrode structure 1520 may partially fill the fifth trench 1540*t*.

The fifth gate electrode structure 1520 may include a fifth lower TiN film 1521, a fifth etch stop film 1522, a fifth work function adjustment film 1523, a fifth insertion film 1524, and a fifth filling film 1525.

The fifth lower TiN film 1521, the fifth etch stop film 1522, the fifth work function adjustment film 1523, the fifth insertion film 1524, and the fifth filling film 1525 may be sequentially stacked, but unlike the first gate electrode structure 1120 to the fourth gate electrode structure 1420, there might not be any chamfering structure present therein. That is, the fifth lower TiN film 1521, the fifth etch stop film 1522, the fifth work function adjustment film 1523, the fifth insertion film 1524, and the fifth filling film 1525 may be sequentially stacked without exposing the side surfaces of the fifth gate insulating film 1530.

The fifth capping film 1550 may be formed on a fifth lower TiN film 1521, a fifth etch stop film 1522, a fifth work function adjustment film 1523, a fifth insertion film 1524, and a fifth filling film 1525.

The thickness C5 of the fifth capping film 1550 may be greater than the thickness of the fourth capping film 1450. The example described above corresponds to a case where the critical dimension of the fifth gate electrode structure 1520 in the fifth region V belongs to the elevated region K1 (see, e.g., FIG. 65).

In some exemplary embodiments of the present inventive concept, the thickness C5 of the fifth capping film 1550 may be smaller than the thickness of the fourth capping film 1450. The example described above corresponds to a case where the critical dimension of the fifth gate electrode structure 1520 in the fifth region V belongs to the unelevated region K2 (see, e.g., FIG. 3).

The fifth trench 1540*t* may have the widest relative fifth width W5 such that the fifth lower TiN film 1521, the fifth etch stop film 1522, the fifth work function adjustment film 1523, the fifth insertion film 1524, and the fifth filling film 1525 may be stacked without chamfering. The fifth transistor 1501 may be, but is not limited to, an I/O region.

Figure 81:
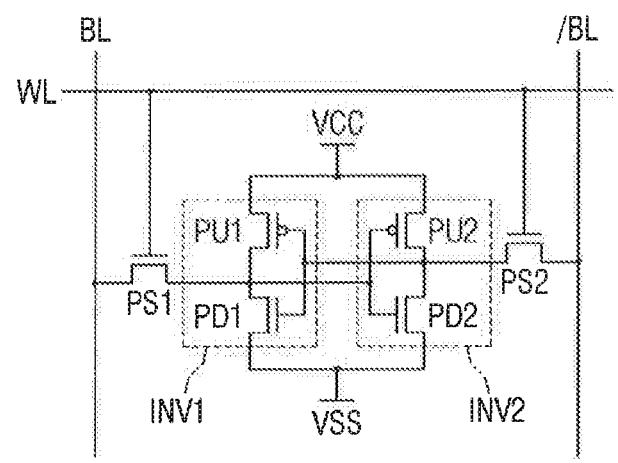
FIG. 81 is a circuit diagram illustrating a semiconductor device according to an exemplary embodiment of the present inventive concept.
Figure 82:
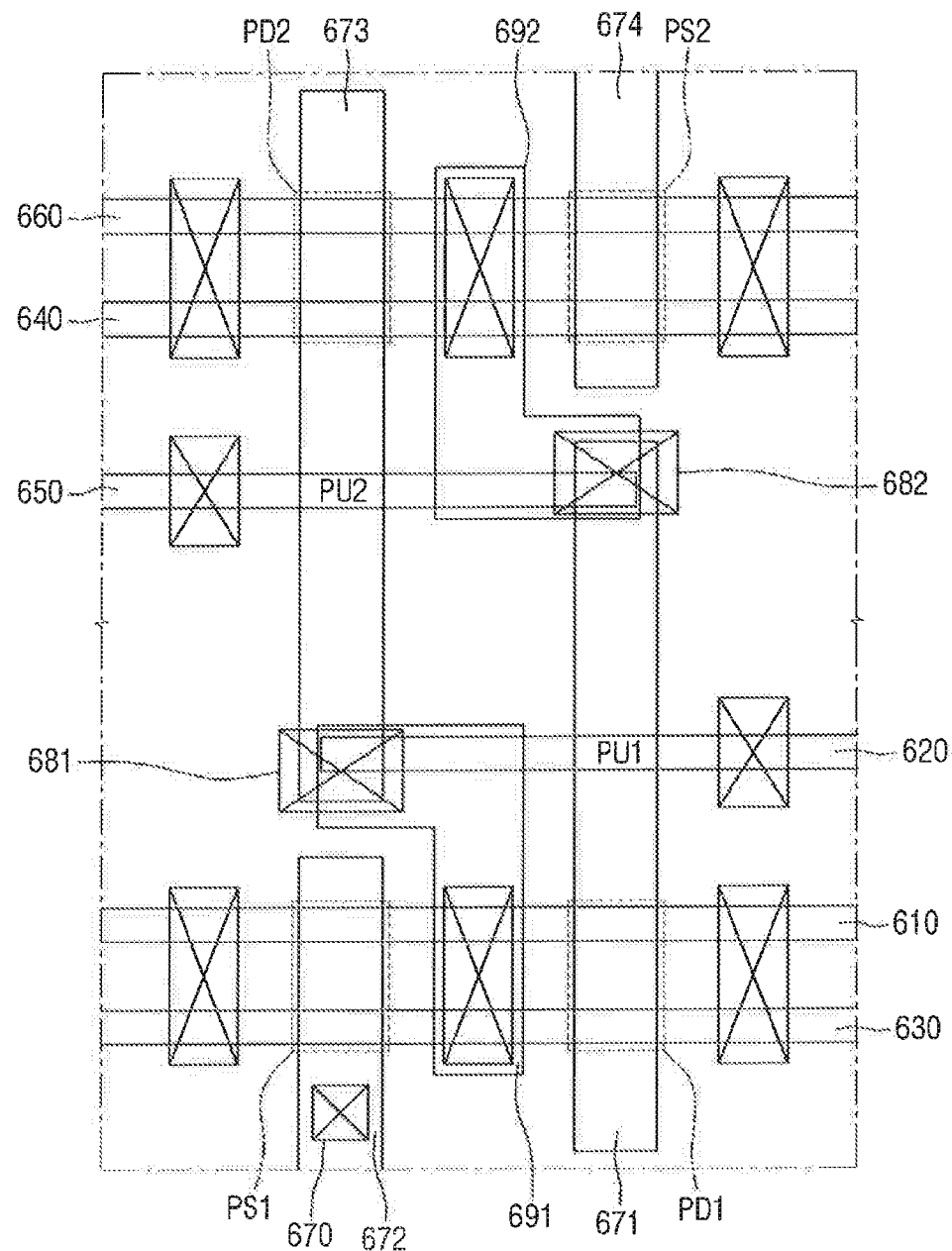
FIG. 82 is a layout diagram of the semiconductor device of FIG. 81.

FIG. 81 is a circuit diagram illustrating a semiconductor device according to an exemplary embodiment of the present inventive concept. FIG. 82 is a layout diagram of the semiconductor device of FIG. 81.

Referring to FIG. 81, the semiconductor device according to an exemplary embodiment of the present inventive concept may include a pair of inverters INV1 and INV2 connected to each other in parallel between a power supply node Vcc and a ground node Vss, and a first pass transistor PS1 and a second pass transistor PS2 respectively connected to output nodes of the inverters INV1 and INV2. The first pass transistor PS1 and the second pass transistor PS2 may be connected to a bit line BL and a complementary bit line/BL, respectively. The gates of the first pass transistor PS1 and the second pass transistor PS2 may be connected to a word line WL.

The first inverter INV1 may include a first pull-up transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 may be PFET transistors, and the first pull-down transistor PD1 and the second pull-down transistor PD2 may be NFET transistors.

As an example, for the first inverter INV1 and the second inverter INV2 to construct one latch circuit, the input node of the first inverter INV1 may be connected to the output node of the second inverter INV2, and the input node of the second inverter INV2 may be connected to the output node of the first inverter INV1.

Referring to FIGS. 81 and 82, a first active region 610, a second active region 620, a third active region 630, a fourth active region 640, a fifth active region 650, and a sixth active region 660, which are separated from one another, may be arranged along a first direction (e.g., a horizontal direction illustrated in FIG. 20). The second active region 620 and the fifth active region 650 may extend by a shorter length than the first active region 610, the third active region 630, the fourth active region 640, and the sixth active region 660.

A first gate line 671, a second gate line 672, a third gate line 673, and a fourth gate line 674 may be arranged along a second direction (e.g., a vertical direction illustrated in FIG. 20), and may intersect the first active region 610 to the sixth active region 660.

As an example, the first gate line 671 may intersect the first to third active regions 610, 520, and 530, and may be partially overlapped with an end of the fifth active region 650. The third gate line 673 may intersect the fourth to sixth active regions 640, 550, and 560, and may be partially overlapped with an end of the second active region 620. The second gate line 672 may intersect the first active region 610 and the third active region 630, and the fourth gate line 674 may intersect the fourth active region 640 and the sixth active region 660.

As an example, the first pull-up transistor PU1 may be defined near the intersecting region of the first gate line 671 and the second active region 620, the first pull-down transistor PD1 may be defined near the intersecting region of the first gate line 671 and the first active region 610 and the third active region 630, and the first pass transistor PS1 may be defined near the intersecting region of the second gate line 672 and the first active region 610 and the third active region 630.

The second pull-up transistor PU2 may be defined near the intersecting region of the third gate line 673 and the fifth active region 650, the second pull-down transistor PD2 may be defined near the intersecting region of the third gate line 673 and the fourth active region 640 and the sixth active region 660, and the second pass transistor PS2 may be defined near the intersecting region of the fourth gate line 674 and the fourth active region 640 and the sixth active region 660.

The source/drain may be formed on both sides of the intersecting regions of the first to fourth gate lines 671 to 574 and the first to sixth active regions 610, 620, 630, 640, 650, and 660, and a plurality of contacts 670 may be formed.

The first shared contact 681 may connect the second active region 620, the third gate line 673, and a first wiring to each other. The second shared contact 682 may connect the fifth active region 650, the first gate line 671, and a second wiring to each other.

Referring to FIG. 82, the pull-down transistors PD1, PD2 and the pass transistors PS1, PS2 which are n-type transistors may be defined near a plurality of the active regions; however, exemplary embodiments of the present inventive concept are not limited thereto.

Referring to FIG. 82, one of the first active region 610 and the third active region 630 may be removed and one of the fourth active region 640 and the sixth active region 660 may be removed.

A semiconductor device according to some exemplary embodiments of the present inventive concept will be described in more detail below with reference to FIG. 83. Components or elements described with reference to FIG. 83 having the same figure labels as those described above may be substantially the same as those described above, and thus duplicative descriptions may be omitted.

Figure 83:
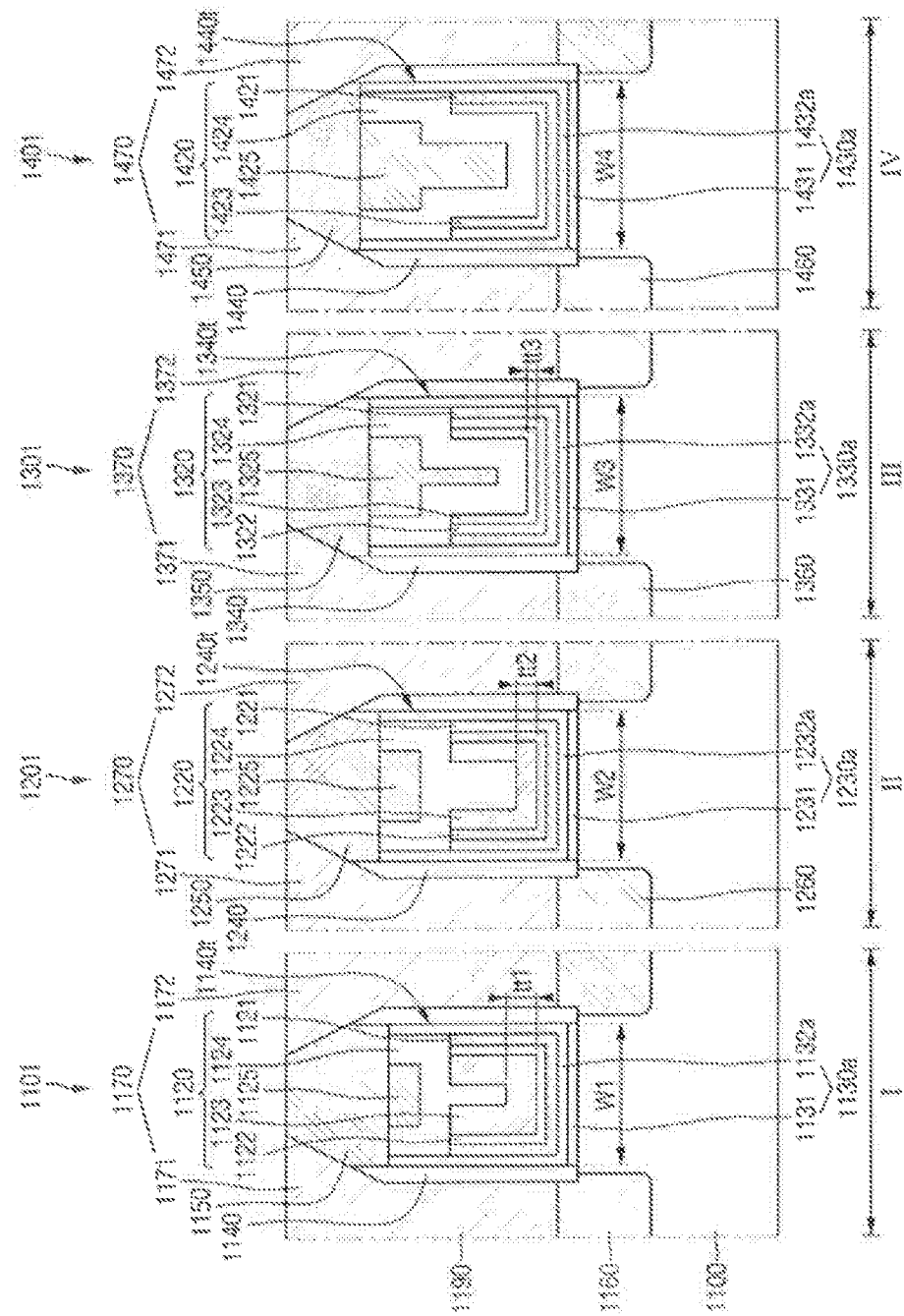
FIG. 83 is a cross-sectional view illustrating a semiconductor device according to an exemplary embodiment of the present inventive concept.

FIG. 83 is a cross-sectional view illustrating a semiconductor device according to an exemplary embodiment of the present inventive concept.

Referring to FIG. 83, a semiconductor device according to some exemplary embodiments of the present inventive concept may include a first self-aligned contact 1170 to a fourth self-aligned contact 1470 in a first region I to a fourth region IV.

The first self-aligned contact 1170 to fourth self-aligned contact 1470 may be formed in the interlayer insulating film 1190. At least some of the first self-aligned contact 1170 to the fourth self-aligned contact 1470 may be vertically overlapped with the first source/drain 1160 to fourth source/drain 1460, respectively.

The first self-aligned contact 1170 may include a first self-aligned contact 1170 with a first side surface formed on one side of the first trench 1140t, and a first self-aligned contact 1170 with a second side surface formed on the other side of the first trench 1140t.

The second self-aligned contact 1270 may include a second self-aligned contact 1270 with the second side surface formed on one side of the second trench 1240t, and a second self-aligned contact 1270 with the second side surface formed on the other side of the second trench 1240t.

The third self-aligned contact 1370 may include a third self-aligned contact 1370 with the first side surface formed on one side of the third trench 1340t, and a third self-aligned contact 1370 with the second side surface formed on the other side of the third trench 1340t.

The fourth self-aligned contact 1470 may include a fourth self-aligned contact 1470 with the first side surface formed on one side of the fourth trench 1440t, and a fourth self-aligned contact 1470 with the second side surface formed on the other side of the fourth trench 1440t.

For example, the first self-aligned contact 1170 to the fourth self-aligned contact 1470 may each include at least one of aluminum (Al), tungsten (W), copper (Cu), or cobalt (Co); however, exemplary embodiments of the present inventive concept are not limited thereto.

The first self-aligned contact 1170 to the fourth self-aligned contact 1470 may be in direct contact with a first gate spacer 1140 to a fourth gate spacer 1440 and first capping film 1150 to fourth capping film 1450.

A semiconductor device according to some exemplary embodiments of the present inventive concept will be described in more detail below with reference to FIG. 84. Components or elements described with reference to FIG. 84 having the same figure labels as those described above may be substantially the same as those described above, and thus duplicative descriptions may be omitted.

Figure 84:
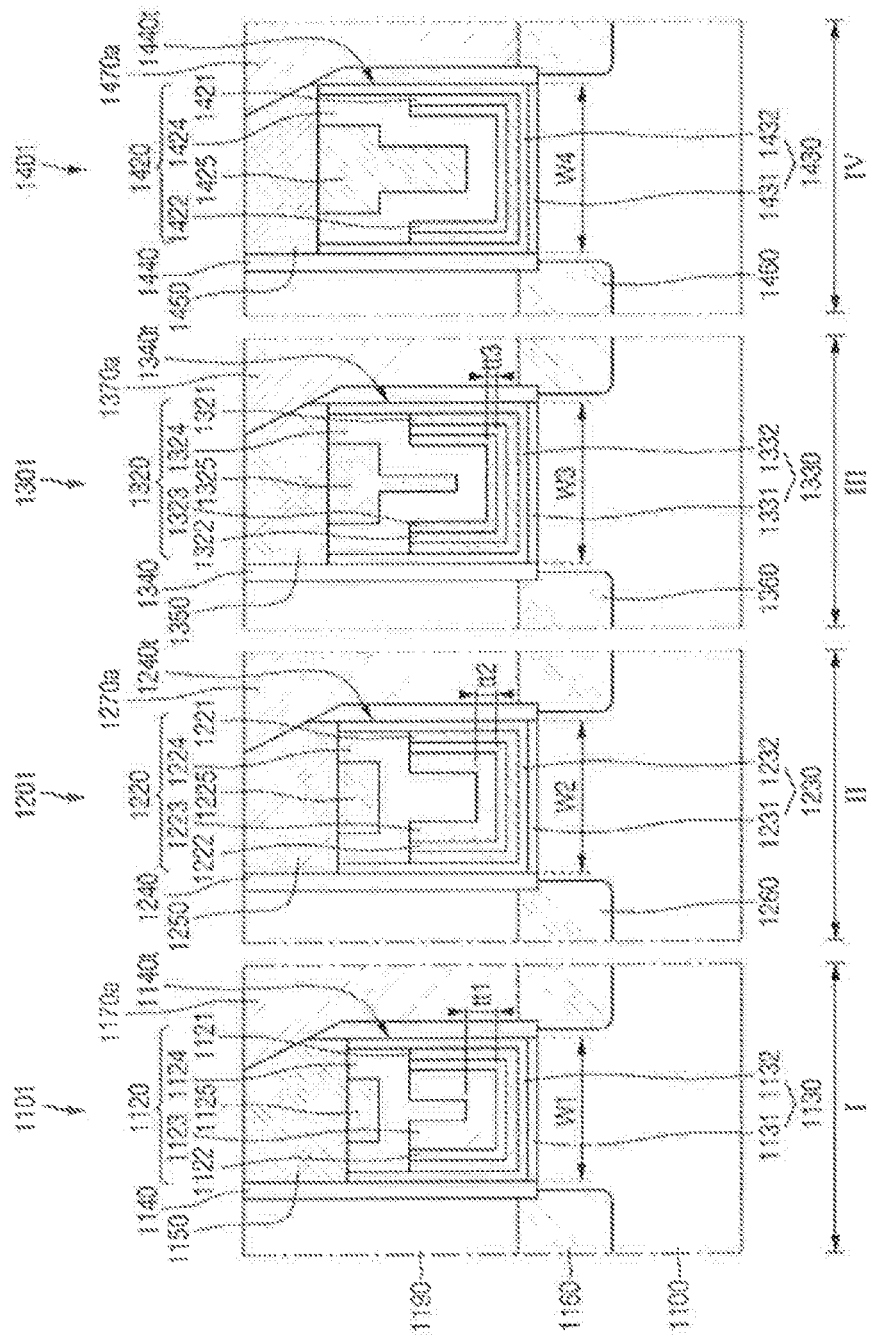
FIG. 84 is a cross-sectional view illustrating a semiconductor device according to an exemplary embodiment of the present inventive concept.

FIG. 84 is a cross-sectional view illustrating a semiconductor device according to an exemplary embodiment of the present inventive concept.

Referring to FIG. 84, a semiconductor device according to some exemplary embodiments of the present inventive concept may have the first self-aligned contact 1170a to the fourth self-aligned contact 1470a only on one side surface of the first trench 1140t to the fourth trench 1440t.

As an example, a first self-aligned contact 1170a may be formed on one side surface of the first trench 1140t, and a contact might not be formed on the other side surface. A second self-aligned contact 1270a may be formed on one side surface of the second trench 1240t, and a contact might not be formed on the other side surface. A third self-aligned contact 1370a may be formed on one side surface of the third trench 1340t, and a contact might not be formed on the other side surface. A fourth self-aligned contact 1470a may be formed on one side surface of the fourth trench 1440t, and a contact might not be formed on the other side surface.

The first self-aligned contact 1170 to the fourth self-aligned contact 1470 might be formed only on the same side surface of the first trench 1140t to the fourth trench 1440t; however, exemplary embodiments of the present inventive concept are not limited thereto.

The first gate spacer 1140 and the first capping film 1150 may have an upper surface inclined only on the side surface where the first self-aligned contact 1170a is formed. The second gate spacer 1240 and the second capping film 1250 may have an upper surface inclined only on the side surface where the second self-aligned contact 1270a is formed. The third gate spacer 1340 and the third capping film 1350 may have an upper surface inclined only on the side surface where the third self-aligned contact 1370a is formed. The fourth gate spacer 1440 and the fourth capping film 1450 may have an upper surface inclined only on the side surface where the fourth self-aligned contact 1470a is formed.

Figure 85:
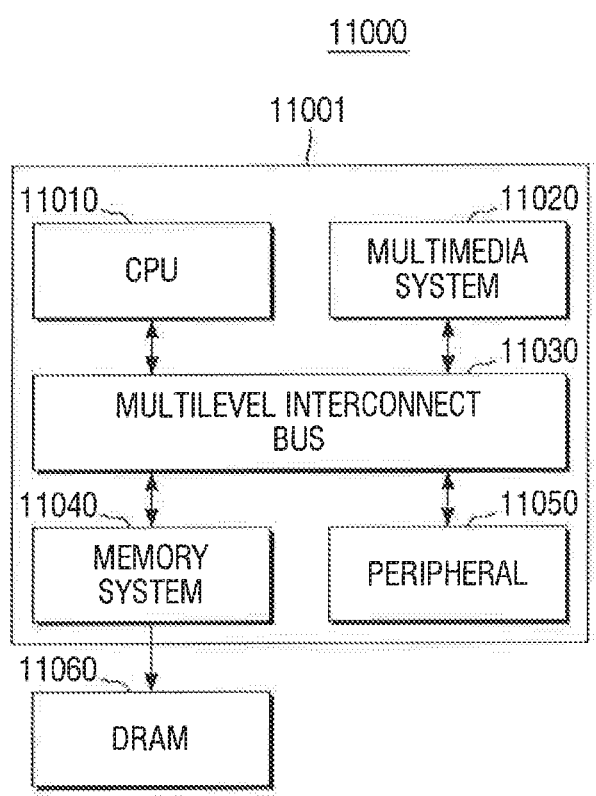
FIG. 85 is a block diagram of a system on chip (SoC) including a semiconductor device according to an exemplary embodiment of the present inventive concept.

FIG. 85 is a block diagram of a system on chip (SoC) including a semiconductor device according to an exemplary embodiment of the present inventive concept.

Referring to FIG. 85, the SoC system 11000 includes an application processor 11001 and a dynamic random-access memory (DRAM) 11060.

The application processor 11001 may include a CPU 11010, a multimedia system 11020, a bus 11030, a memory system 11040, and a peripheral circuit 11050.

The CPU 11010 may perform operations for driving the SoC system 11000. In some exemplary embodiments of the present inventive concept, the CPU 11010 may be configured by a multi-core environment that includes a plurality of cores.

The multimedia system 11020 may be used to perform various multimedia functions in the SoC system 11000. Such a multimedia system 11020 may include a 3D engine module, a video codec, a display system, a camera system, or a post-processor.

The bus 11030 may be used by the CPU 11010, the multimedia system 11020, the memory system 11040, and the peripheral circuit 11050 to perform data communication with each other. In some exemplary embodiments of the present inventive concept, such a bus 11030 may have a multi-layered structure. Examples of the bus 11030 may include a multi-layer advanced high-performance bus (AHB) and a multi-layer advanced extensible interface (AXI), but exemplary embodiments of the present inventive concept are not limited thereto.

The memory system 11040 may provide environments for the application processor 11001 to connect to an external memory (e.g., DRAM 11060) and perform high-speed operation. In some exemplary embodiments of the present inventive concept, the memory system 11040 may include a separate controller (e.g., DRAM controller) for controlling the external memory (e.g., DRAM 11060).

The peripheral circuit 11050 may provide the environment for the SoC system 11000 to have a seamless connection to the external apparatus (e.g., main board). Thus, the peripheral circuit 11050 may include a variety of interfaces to allow compatible operation with the external device connected to the SoC system 11000.

The DRAM 11060 may serve as an operation memory for the application processor 11001 to operate. In some exemplary embodiments of the present inventive concepts, the DRAM 11060 may be disposed outside the application processor 11001. As an example, the DRAM 11060 may be packaged in a package on package (PoP) format with the application processor 11001.

At least one of the above-mentioned components of the SoC system 11000 may include at least one of the semiconductor devices according to one or more of the exemplary embodiments of the present inventive concept described herein.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A semiconductor device, comprising:
a substrate comprising a first region and a second region;
first and second dielectric films positioned above the substrate in the first region and the second region, respectively; and
first and second gate stacks disposed on the first and second dielectric films, respectively;
wherein the first gate stack comprises a first TiAlC film in direct contact with the first dielectric film, and a first barrier film and a first metal film sequentially stacked on the first TiAlC film, and
wherein the second gate stack comprises a first LaO film in direct contact with the second dielectric film, and a second TiAlC film, a second barrier film, and a second metal film sequentially stacked on the first LaO film.

2. The semiconductor device of claim 1, wherein the second TiAlC film is in direct contact with the second lanthanum oxide film.

3. The semiconductor device of claim 2, wherein the first and second gate stacks do not comprise tantalum nitride (TaN).

4. The semiconductor device of claim 2, wherein the substrate further comprises a third region and a fourth region, the device further comprising:
third and fourth dielectric films formed on the substrate in the third region and the fourth region, respectively; and
third and fourth gate stacks formed on the third and fourth dielectric films, respectively;
wherein the third gate stack comprises a first TiN film, a third TiAlC film, a third harrier film, and a third metal film sequentially stacked on the third dielectric film, and
wherein the fourth gate stack comprises a second LaO film, a second TiN film, a fourth TiAlC film, a fourth barrier film, and a fourth metal film sequentially stacked on the fourth dielectric film.

5. The semiconductor device of claim 4, wherein the first to fourth gate stacks form first to fourth transistors, respectively, and the threshold voltages of the first to fourth transistors are different from each other.

6. The semiconductor device of claim 4, wherein the third dielectric film comprises a first porosity region and a second porosity region having a porosity different from the first porosity region.

7. The semiconductor device of claim 6, wherein the second porosity region has a porosity higher than the first porosity region, the second porosity region is adjacent to the third gate stack, and the first porosity region is spaced apart from the third gate stack.

8. The semiconductor device of claim 7, wherein a thickness of the second porosity region is thinner than a thickness of the first porosity region.

9. The semiconductor device of claim 1, wherein each of the first and second dielectric films extends upward along bottom surfaces and sidewalls of the first and second gate stacks.

10. A Semiconductor device, comprising:
a substrate comprising first to fourth regions;
first to fourth dielectric films positioned above the substrate in the first to fourth regions, respectively; and
first to fourth gate stacks disposed on the first to fourth dielectric films, respectively;
wherein the first gate stack comprises a first TiAlC film, a first barrier film, and a first metal layer sequentially stacked on the first dielectric film,
wherein the second gate stack comprises a first LaO film, a second TiAlC film, a second harrier film, and a second metal layer sequentially stacked on the second dielectric film,
wherein the third gate stack comprises a first TiN film, a third TiAlC film, a third barrier film, and a third metal layer sequentially stacked on the third dielectric film,
wherein the fourth gate stack comprises a second LaO film, a second TiN film, a fourth TiAlC film, a fourth barrier film, and a fourth metal layer sequentially stacked on the fourth dielectric film, and
the second TiAlC film is in direct contact with the first LaO film.

11. The semiconductor device of claim 10, wherein the third dielectric film comprises a first porosity region and a second porosity region having a porosity higher than the first porosity region.

12. The semiconductor device of claim 11, wherein the second porosity region is adjacent to the third gate stack, and the first porosity region is spaced apart from the third gate stack.

13. The semiconductor device of claim 12, wherein a thickness of the second porosity region is thinner than a thickness of the first porosity region.

14. The semiconductor device of claim 10, wherein the first TiN film and the second TiN film have different thicknesses from one another in a direction parallel to a plane of the substrate.

15. The semiconductor device of claim 10, wherein each of the first to fourth dielectric films extends upward along the lower surfaces and the sidewalls of the first to fourth gate stacks.

* * * * *